United States Patent [19]

Agrawal et al.

[11] Patent Number: 5,015,884
[45] Date of Patent: May 14, 1991

[54] MULTIPLE ARRAY HIGH PERFORMANCE PROGRAMMABLE LOGIC DEVICE FAMILY

[75] Inventors: Om P. Agrawal, San Jose; George H. Landers, Mountain View; Nicholas A. Schmitz, Cupertino, all of Calif.; Jerry D. Moench; Kerry A. Ilgenstein, both of Austin, Tex.

[73] Assignee: Advanced Micro Devices, Inc., Sunnyvale, Calif.

[21] Appl. No.: 490,808

[22] Filed: Mar. 7, 1990

Related U.S. Application Data

[63] Continuation-in-part of Ser. No. 243,574, Sep. 12, 1988, Pat. No. 4,963,768, which is a continuation-in-part of Ser. No. 178,707, Apr. 7, 1988, Pat. No. 4,931,671, which is a continuation of Ser. No. 717,640, Mar. 29, 1985, Pat. No. 4,742,252.

[51] Int. Cl.⁵ .................. H03K 19/177; H03K 19/092
[52] U.S. Cl. ...................................... 307/465; 364/716; 340/825.83
[58] Field of Search ............... 307/465, 467, 475, 463, 307/468; 364/716; 340/825.85–825.88, 825.90; 365/94, 96, 222

[56] References Cited

U.S. PATENT DOCUMENTS

| | | | |
|---|---|---|---|
| 4,758,747 | 7/1988 | Young et al. | 307/465 |
| 4,876,640 | 10/1989 | Shankar et al. | 307/465 |
| 4,903,223 | 2/1990 | Norman et al. | 307/465 |

*Primary Examiner*—Timothy P. Callahan
*Attorney, Agent, or Firm*—Skjerven, Morrill, MacPherson, Franklin & Friel

[57] ABSTRACT

A high density segmented programmable array logic device utilizes a programmable switch interconnection matrix to couple an array of symmetric programmable logic blocks. Each programmable logic block includes programmable logic macrocells, programmable input/output macrocells, a logic allocator and a programmable product term array. Further, the switch matrix provides centralized global routing with a fixed path independent delay. The programmable switch interconnection matrix decouples the logic macrocells from the product term array. The logic allocator decouples the product term array from the logic macrocells, and the I/O marcrocells decouple the logic macrocells from the package I/O pins. Thus, the architecture of this invention is easily scalable to higher density devices without compromising speed. The logic allocator steers product terms from the product term array to selected logic macrocells so that no product terms are permanently allocated to a specific logic macrocell.

22 Claims, 80 Drawing Sheets

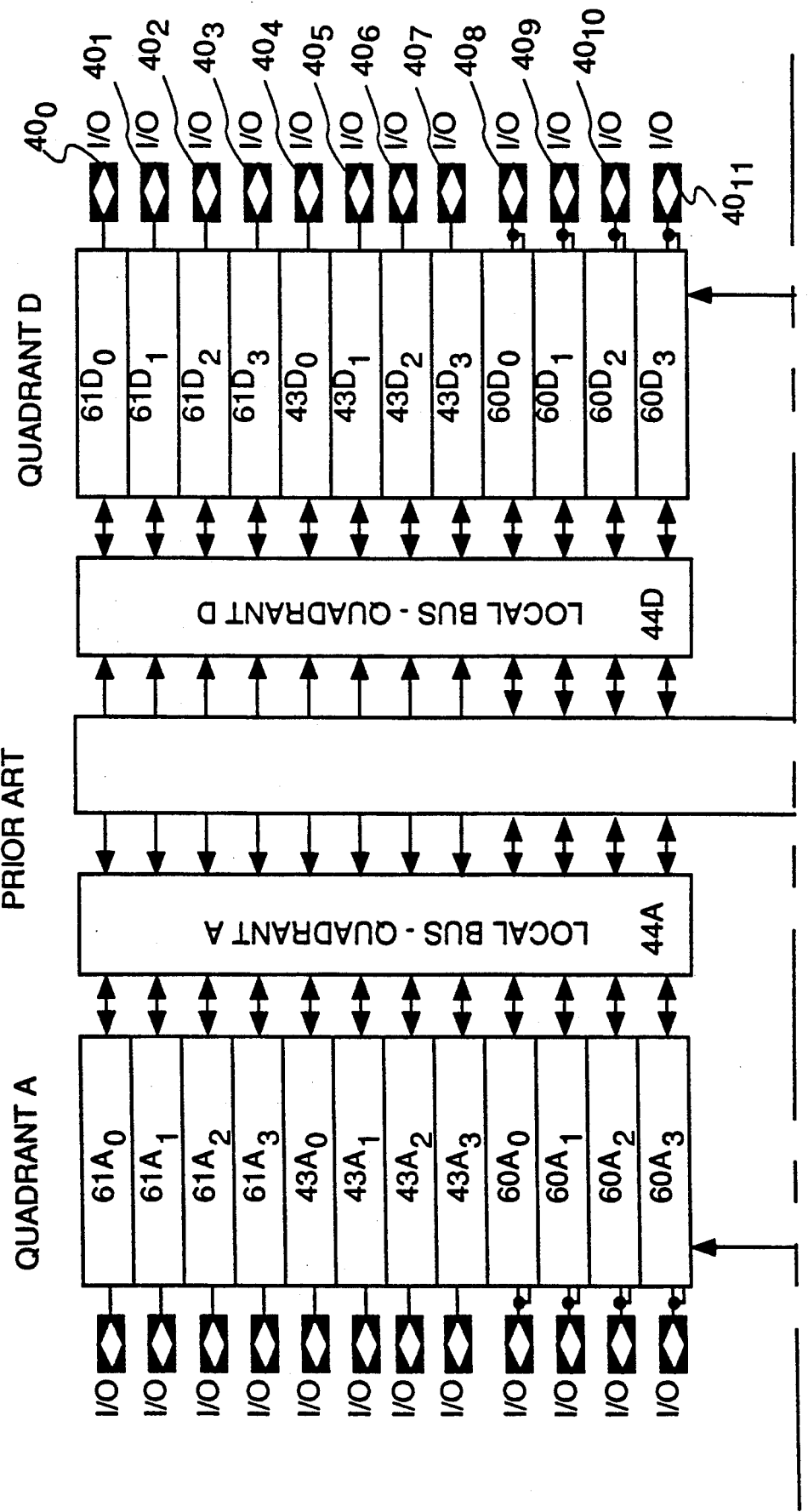

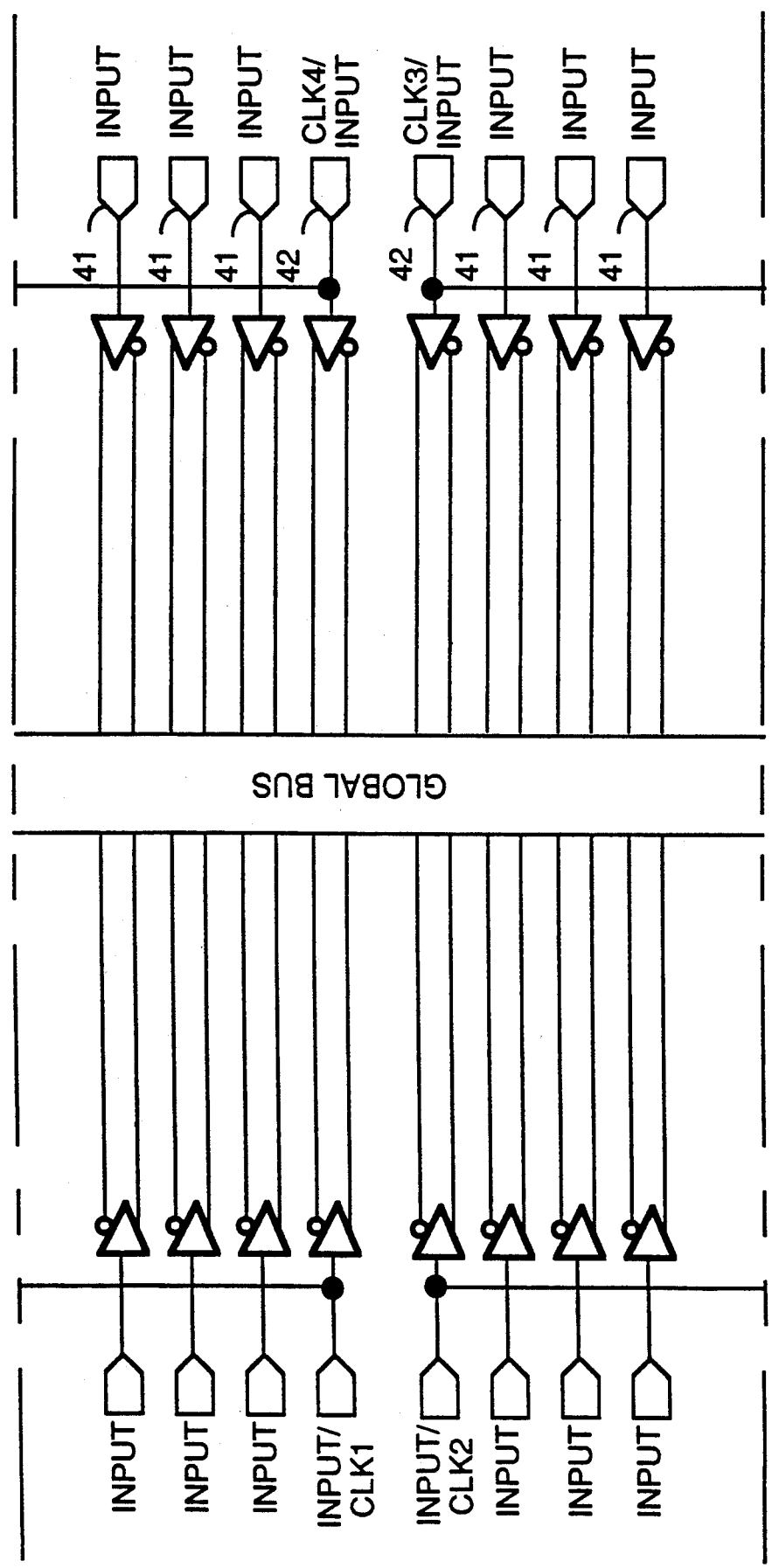
FIGURE 2A"
PRIOR ART

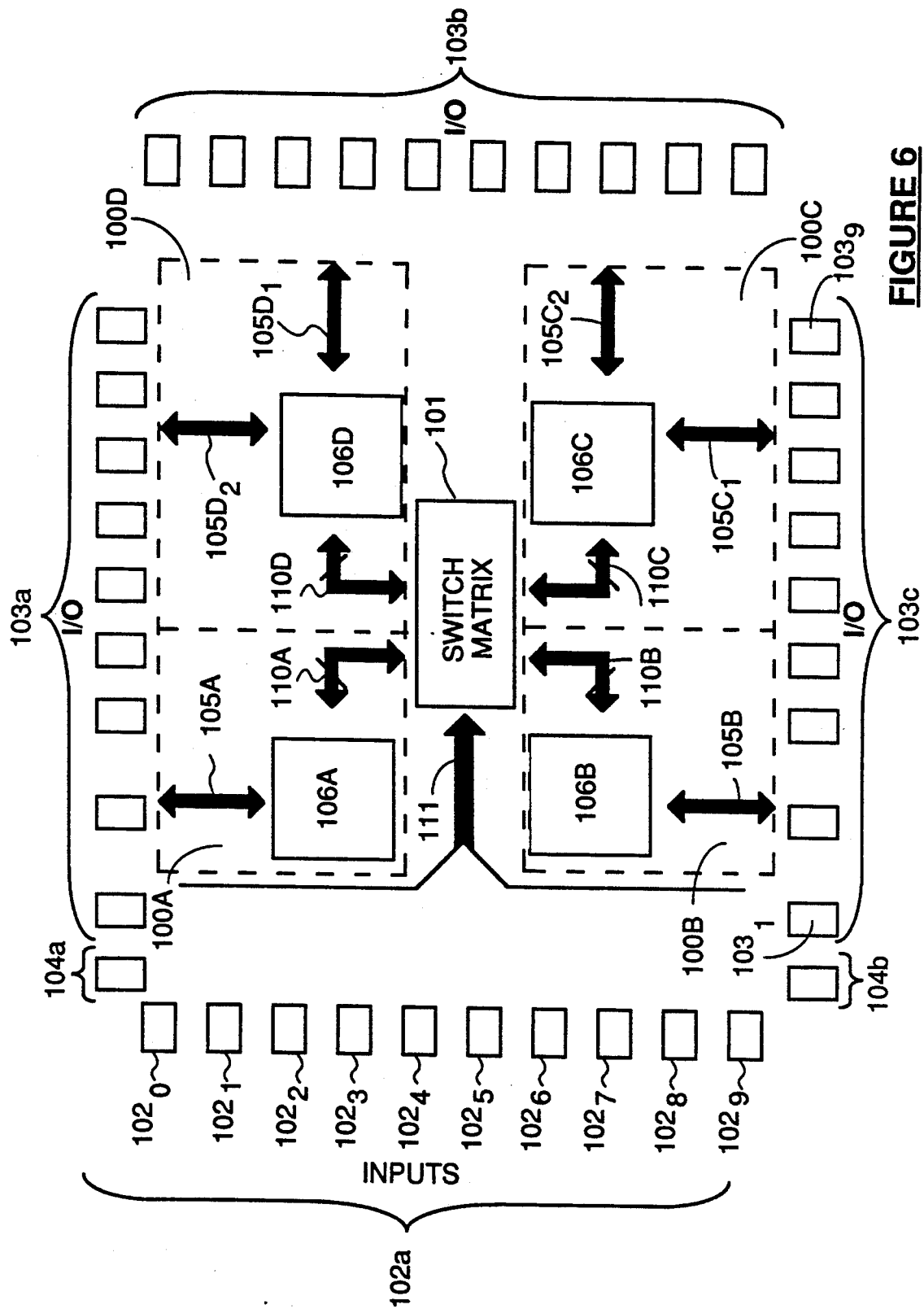

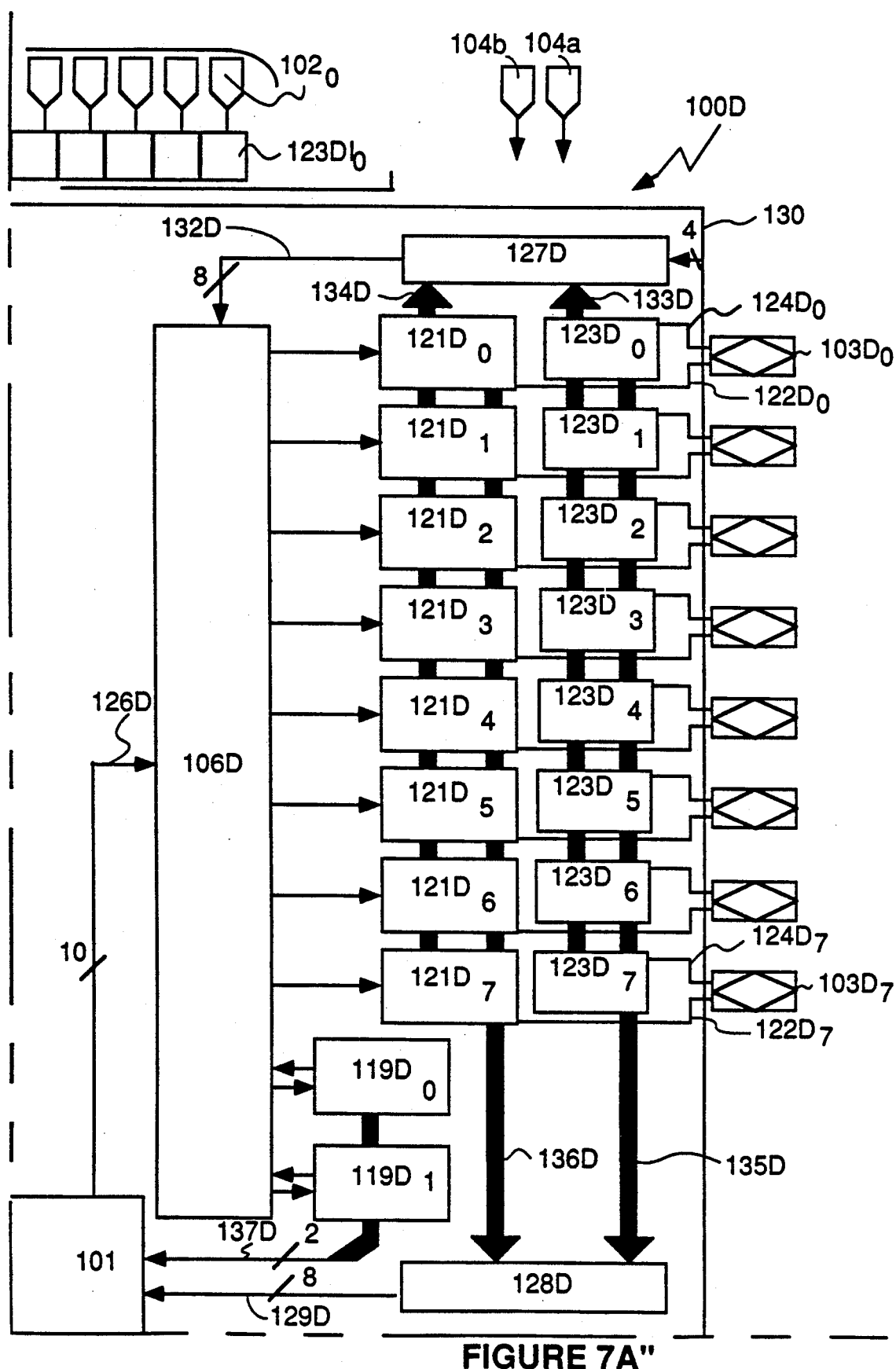
FIGURE 7A"

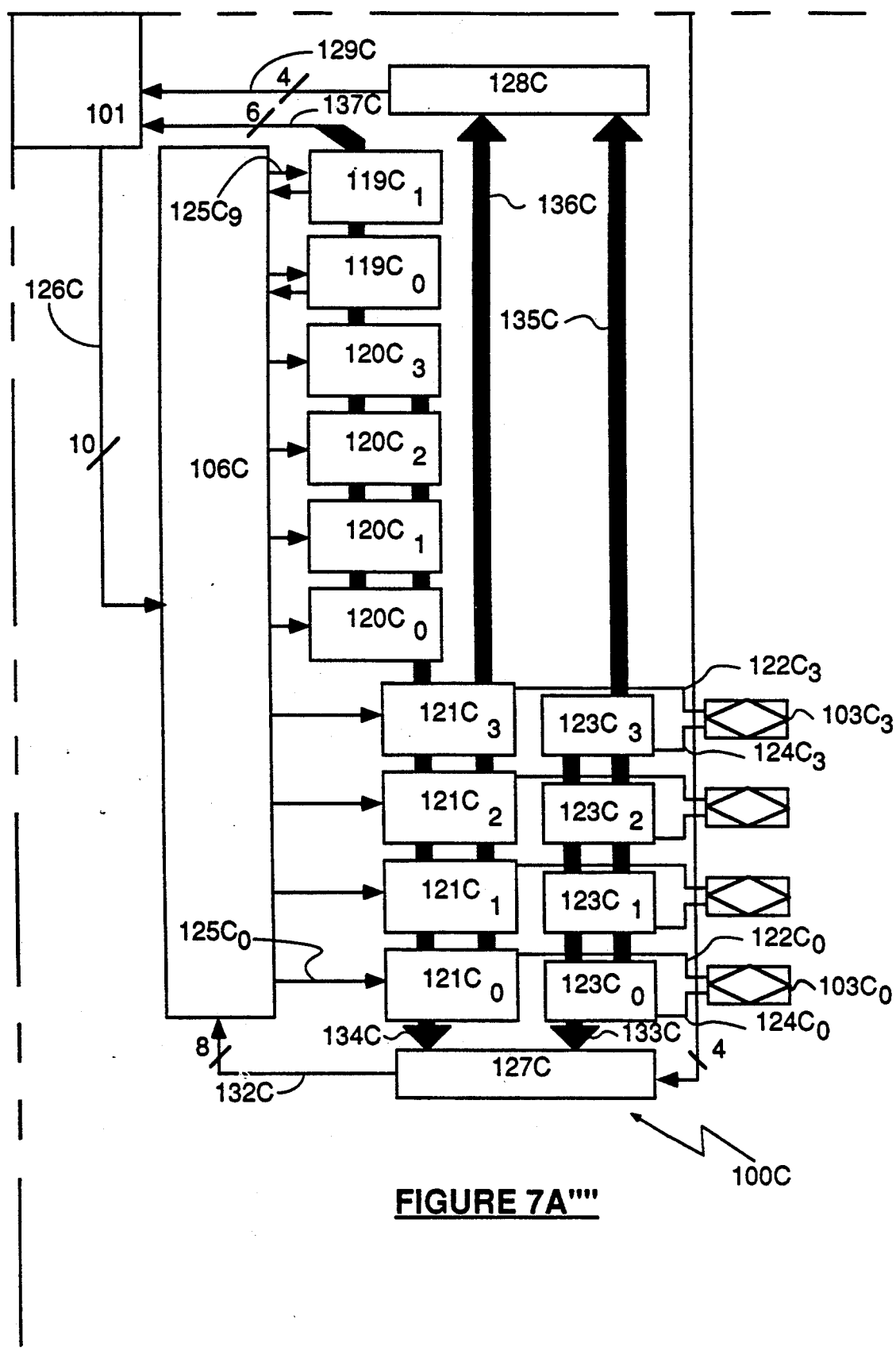
FIGURE 7A''''

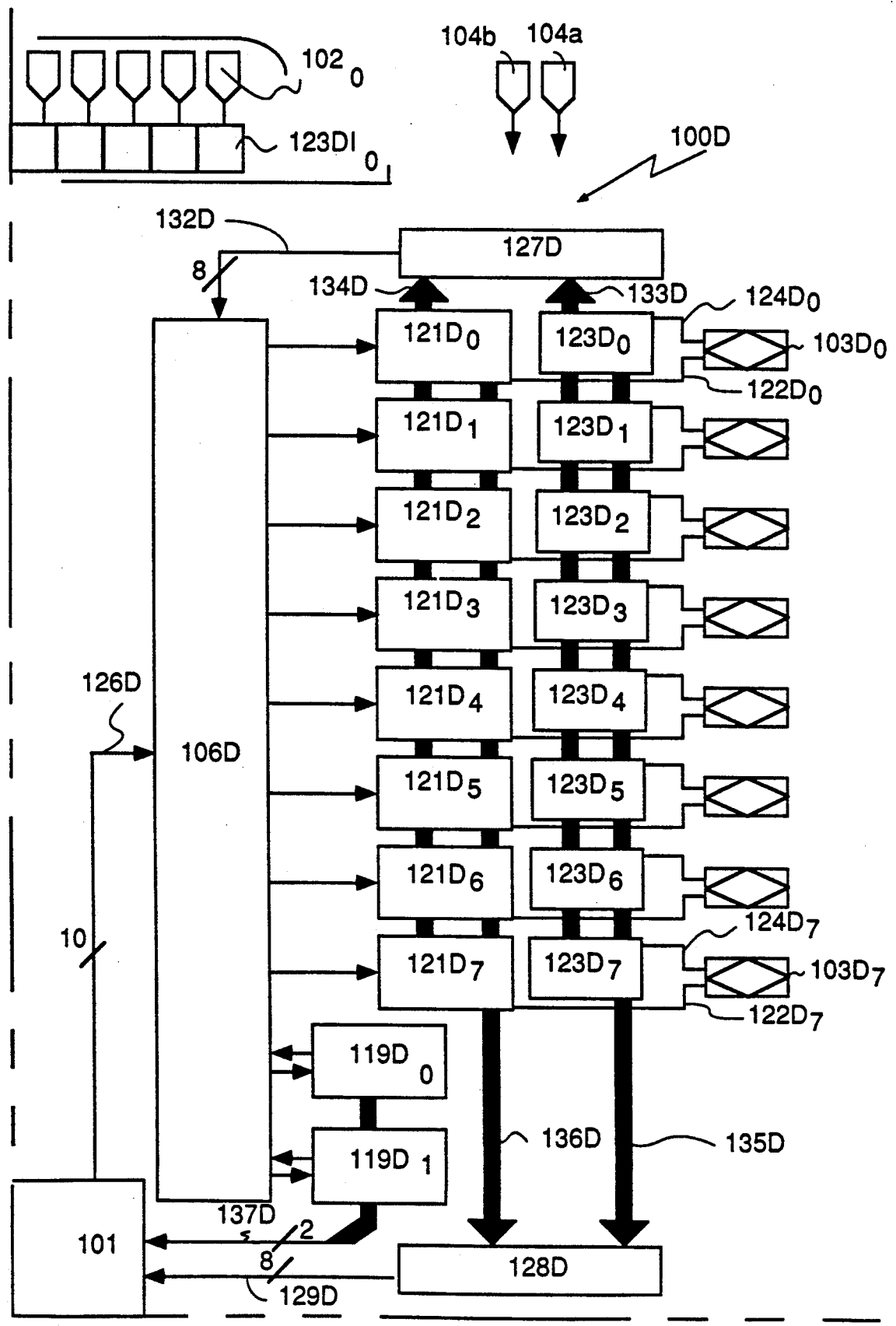
FIGURE 7B"

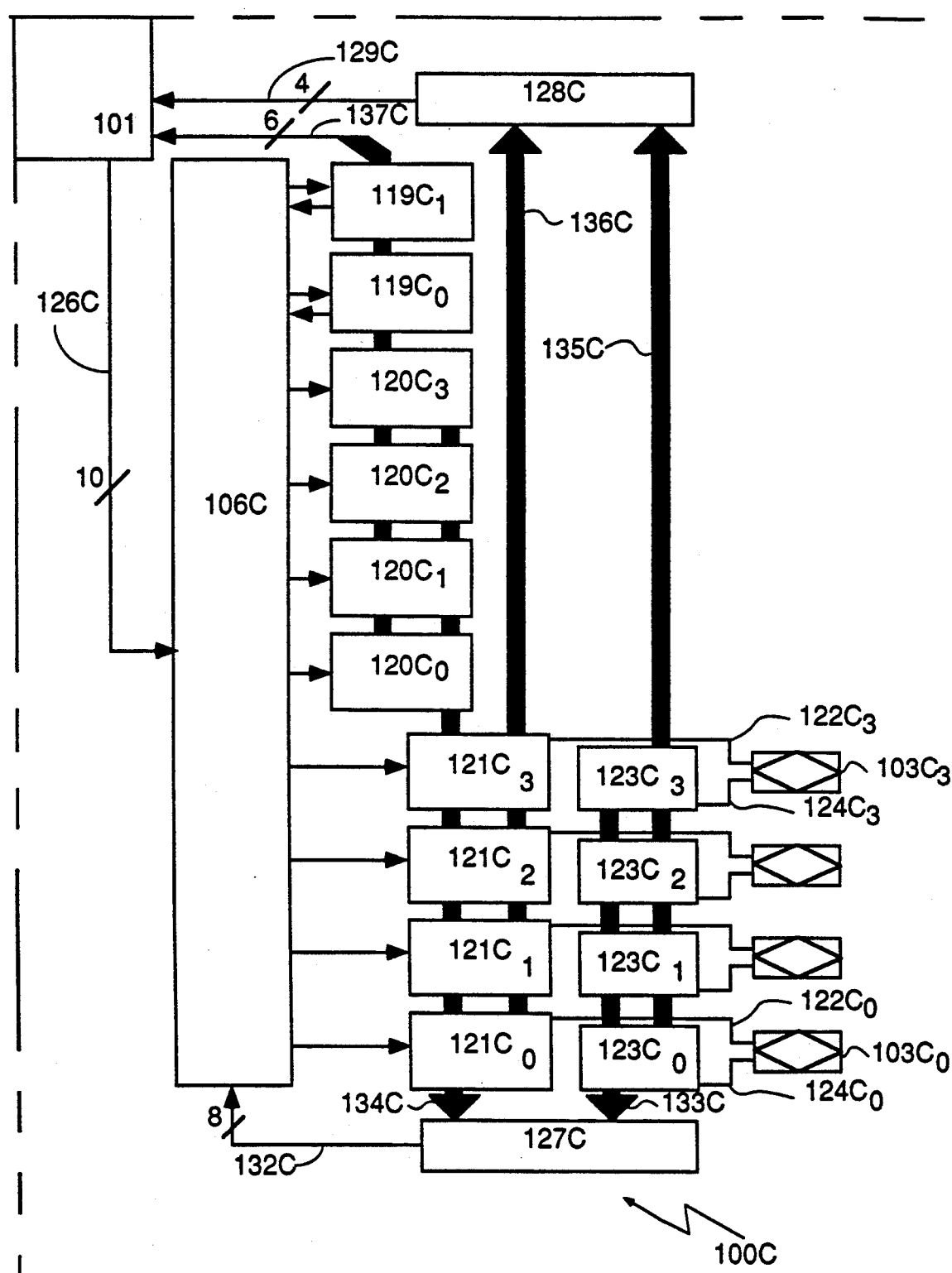
FIGURE 7B""

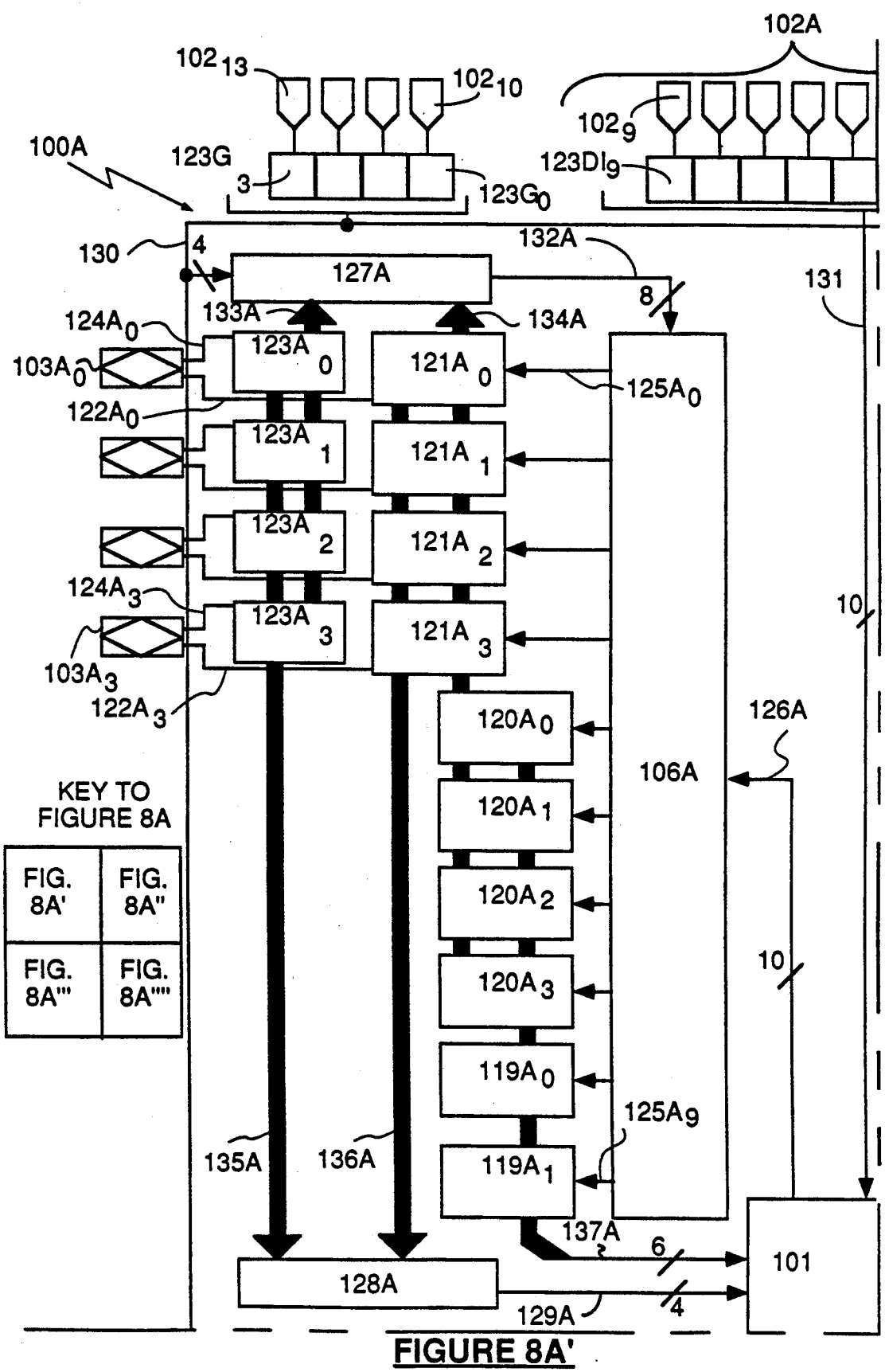

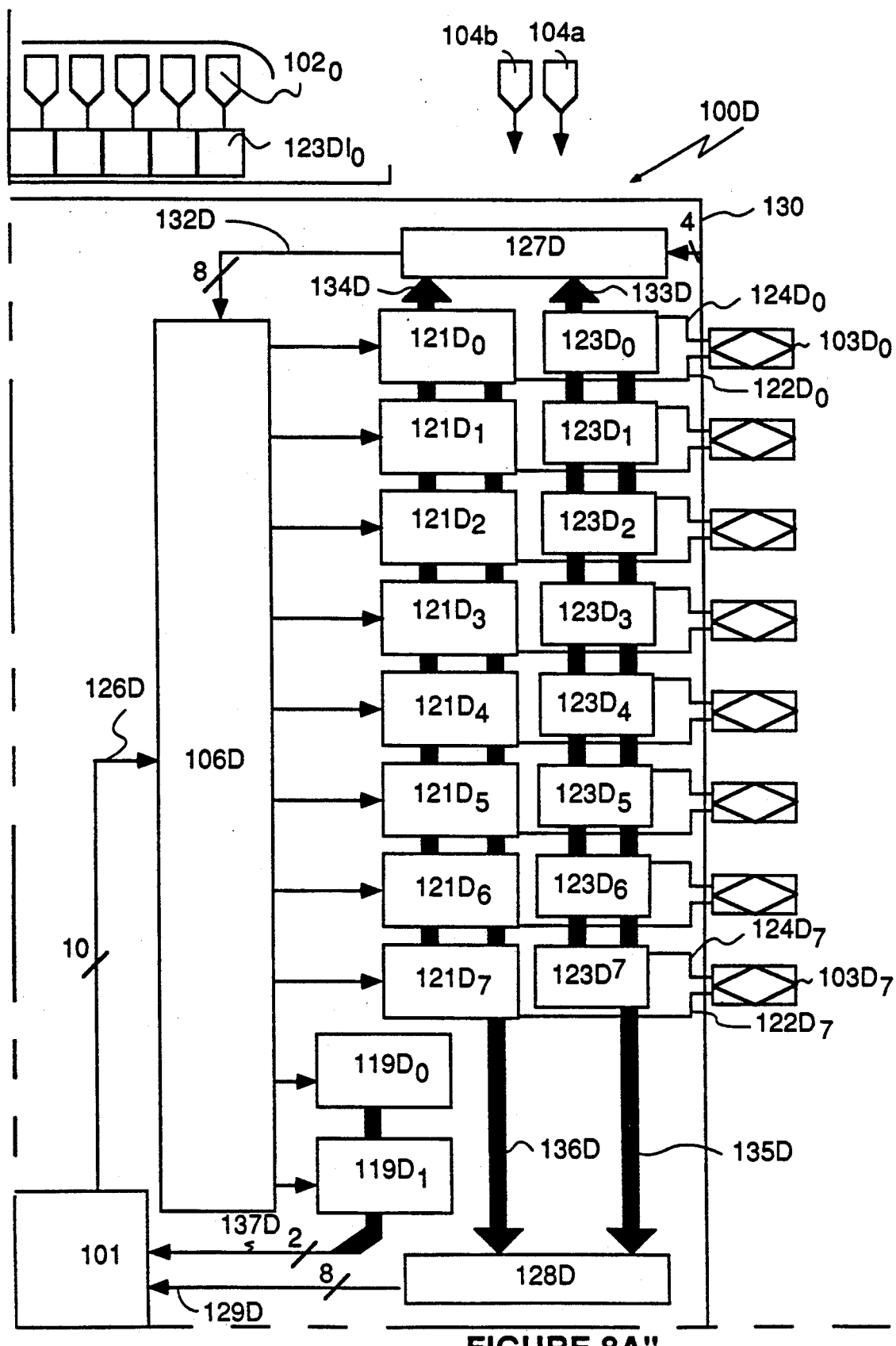
FIGURE 8A"

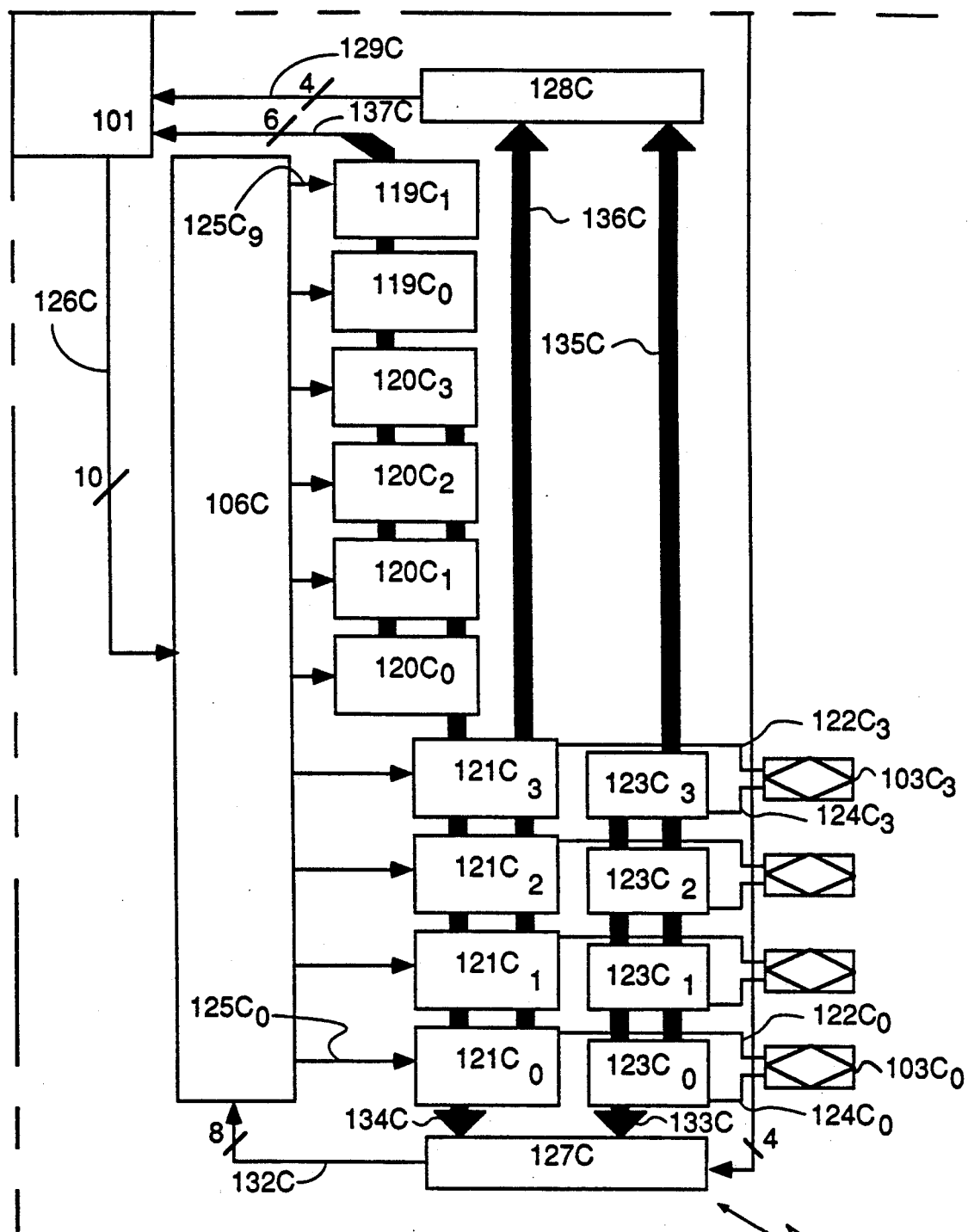
FIGURE 8A''''

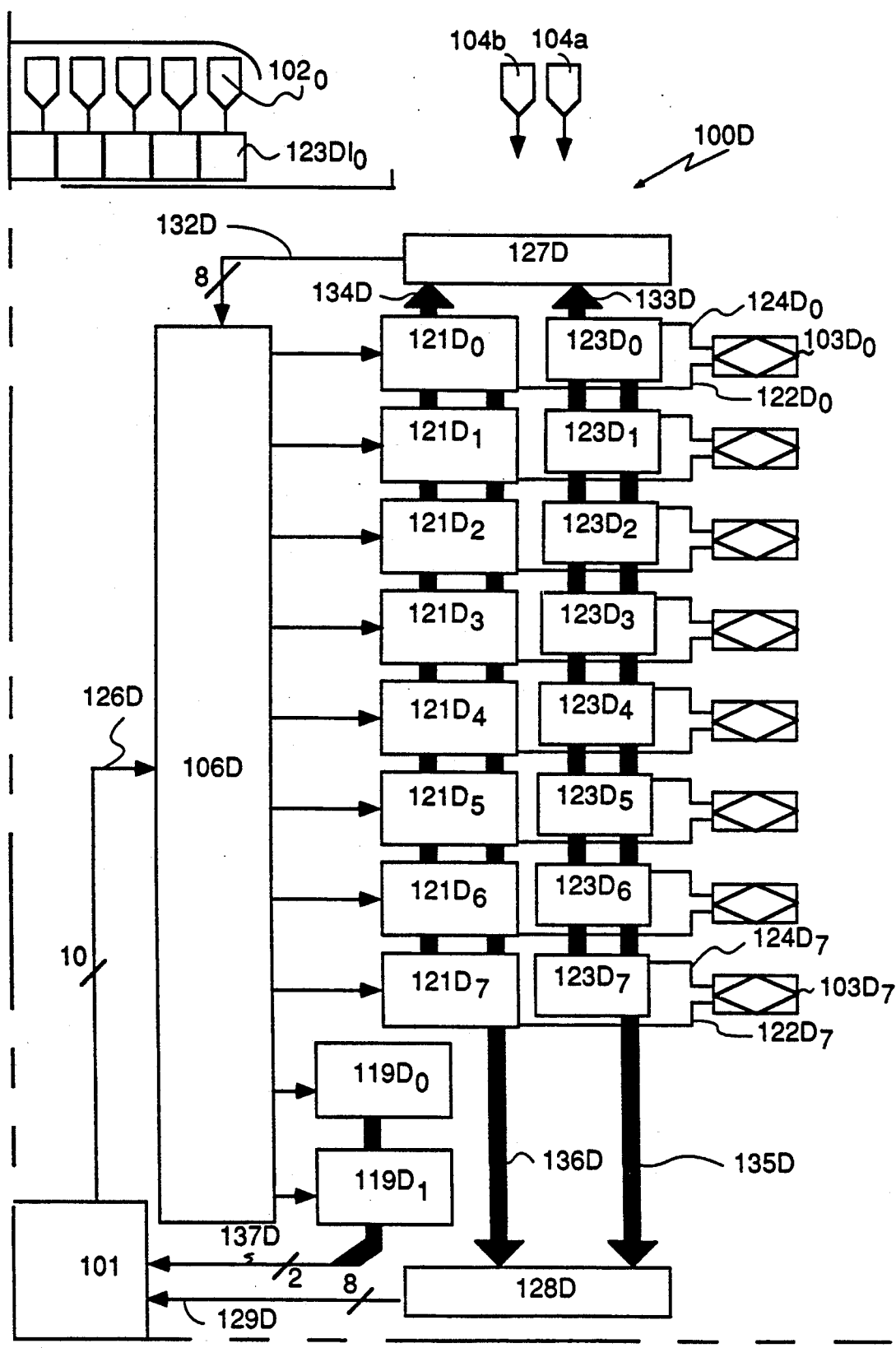
FIGURE 8B"

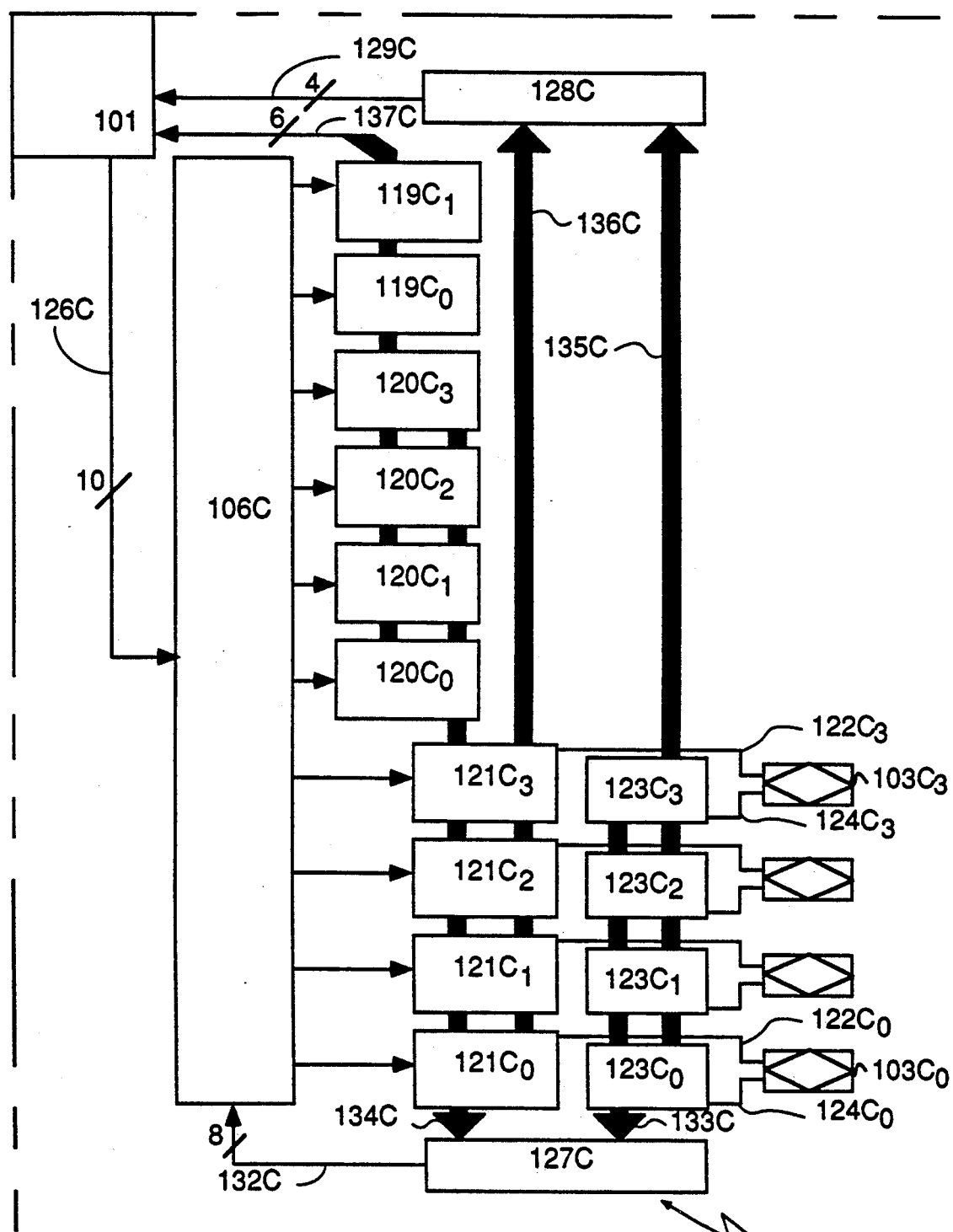
FIGURE 8B''''

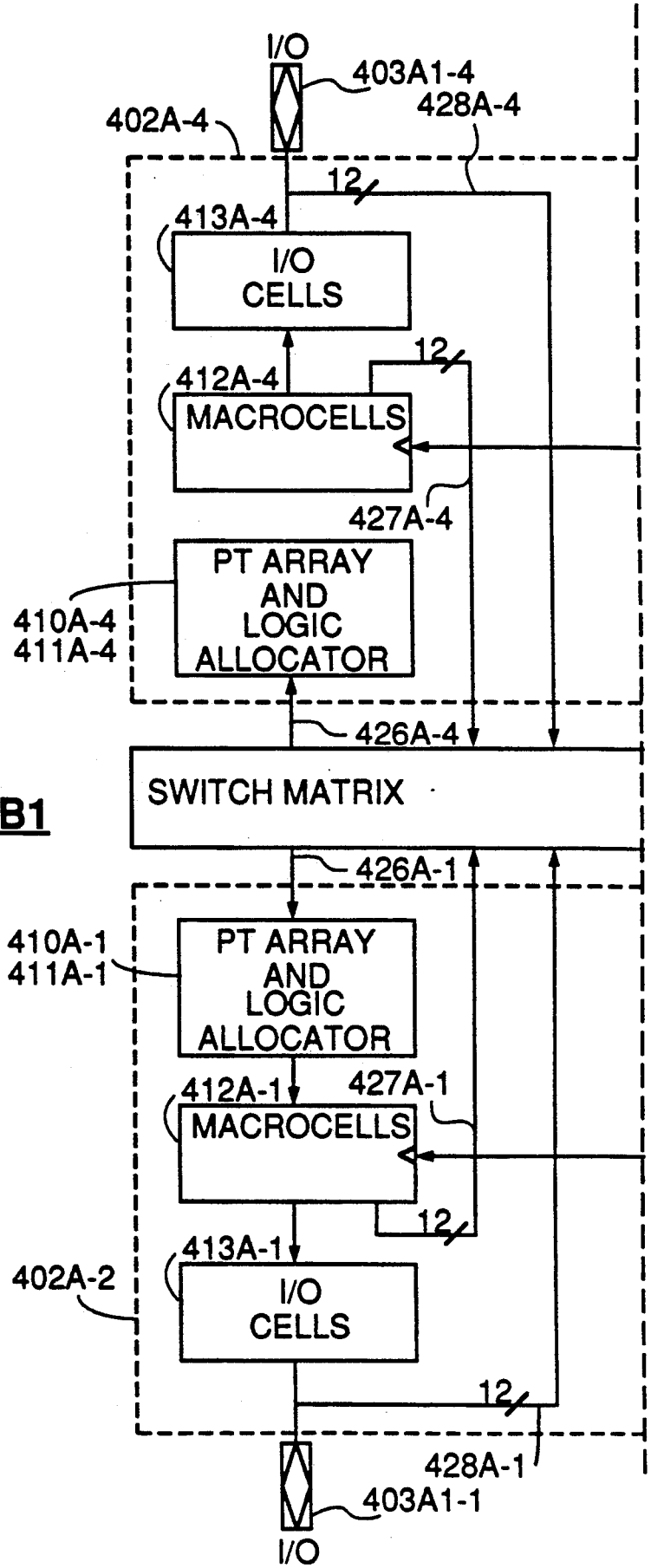
FIGURE 12B1

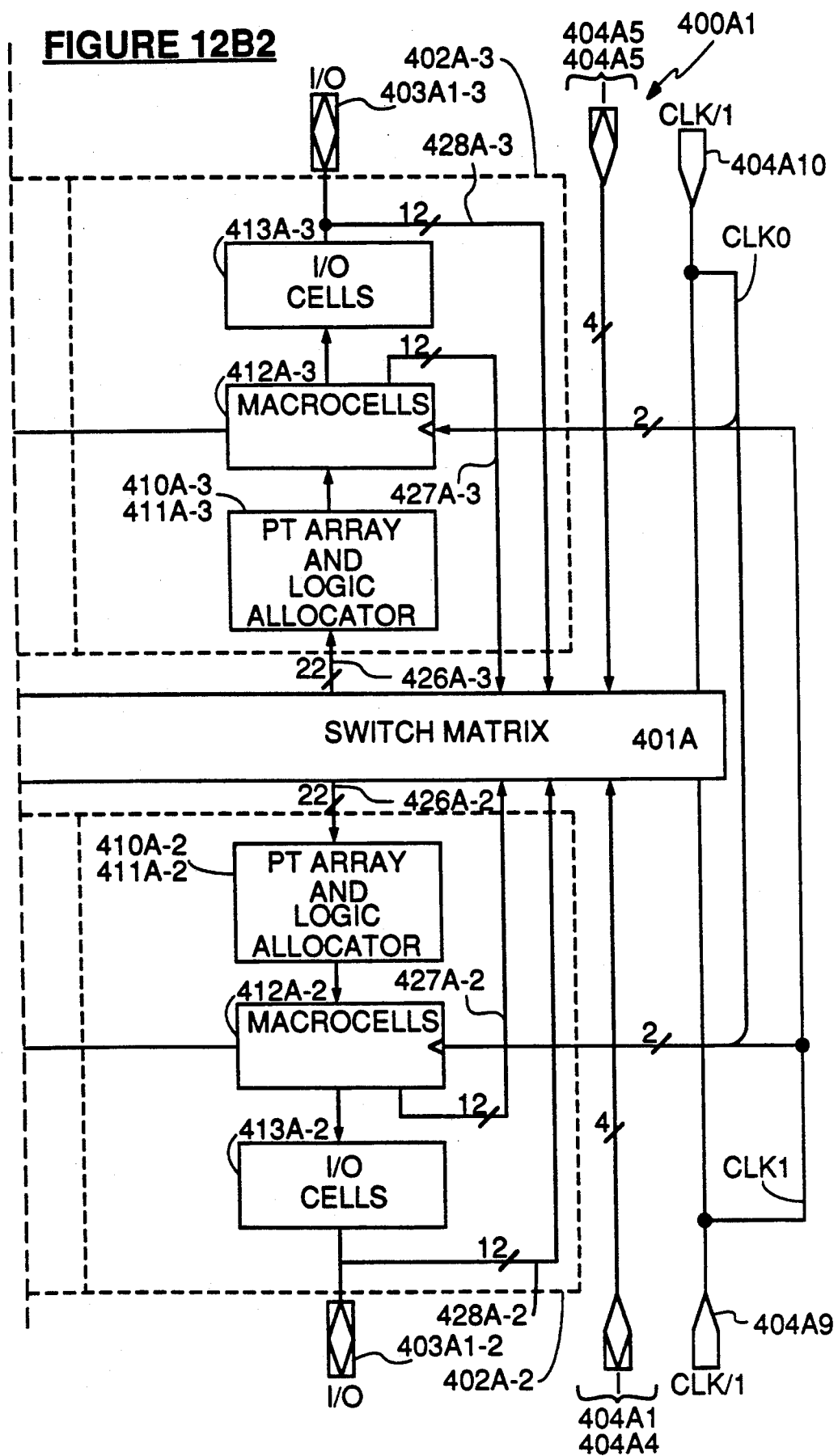

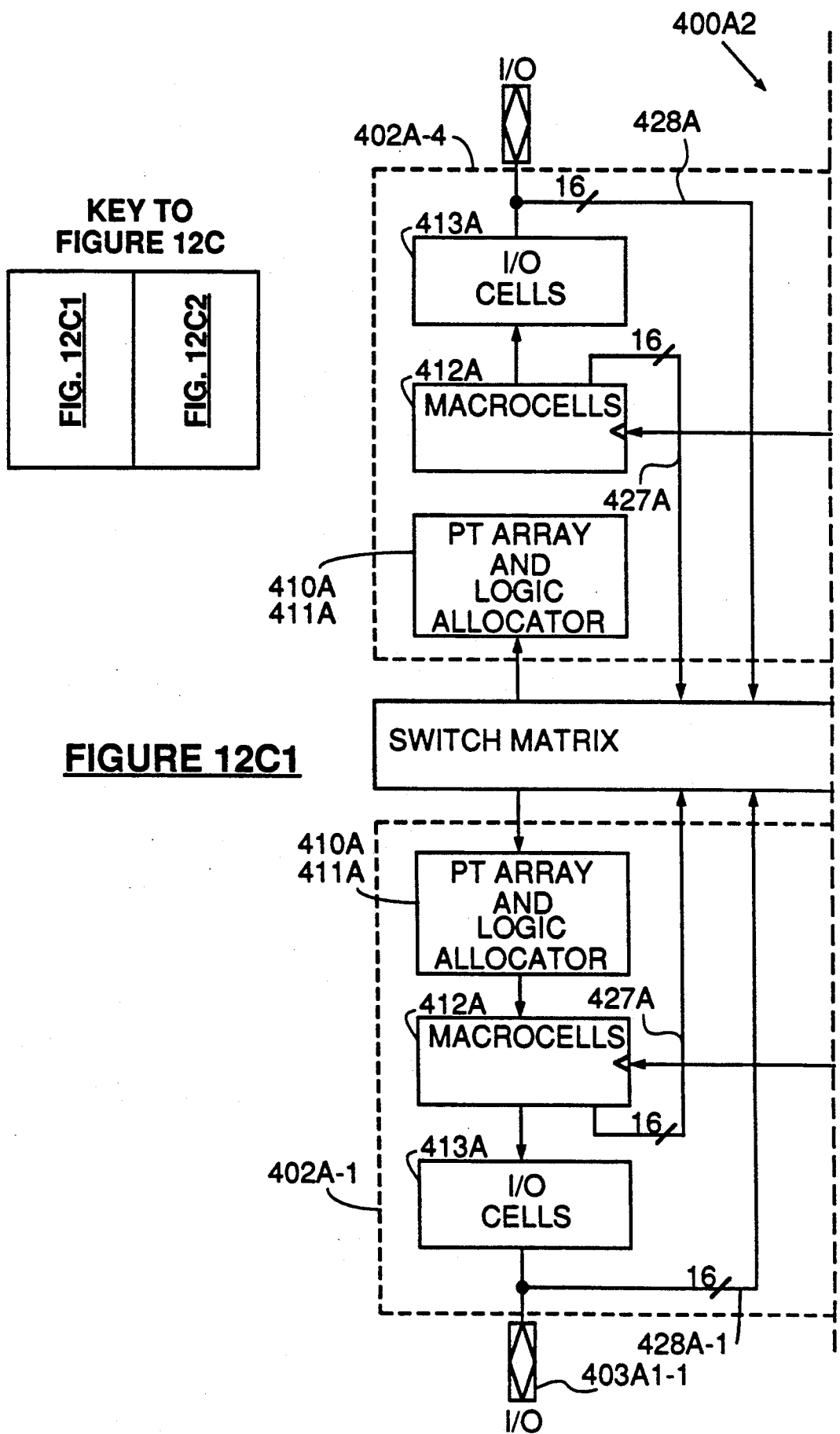
FIGURE 12C1

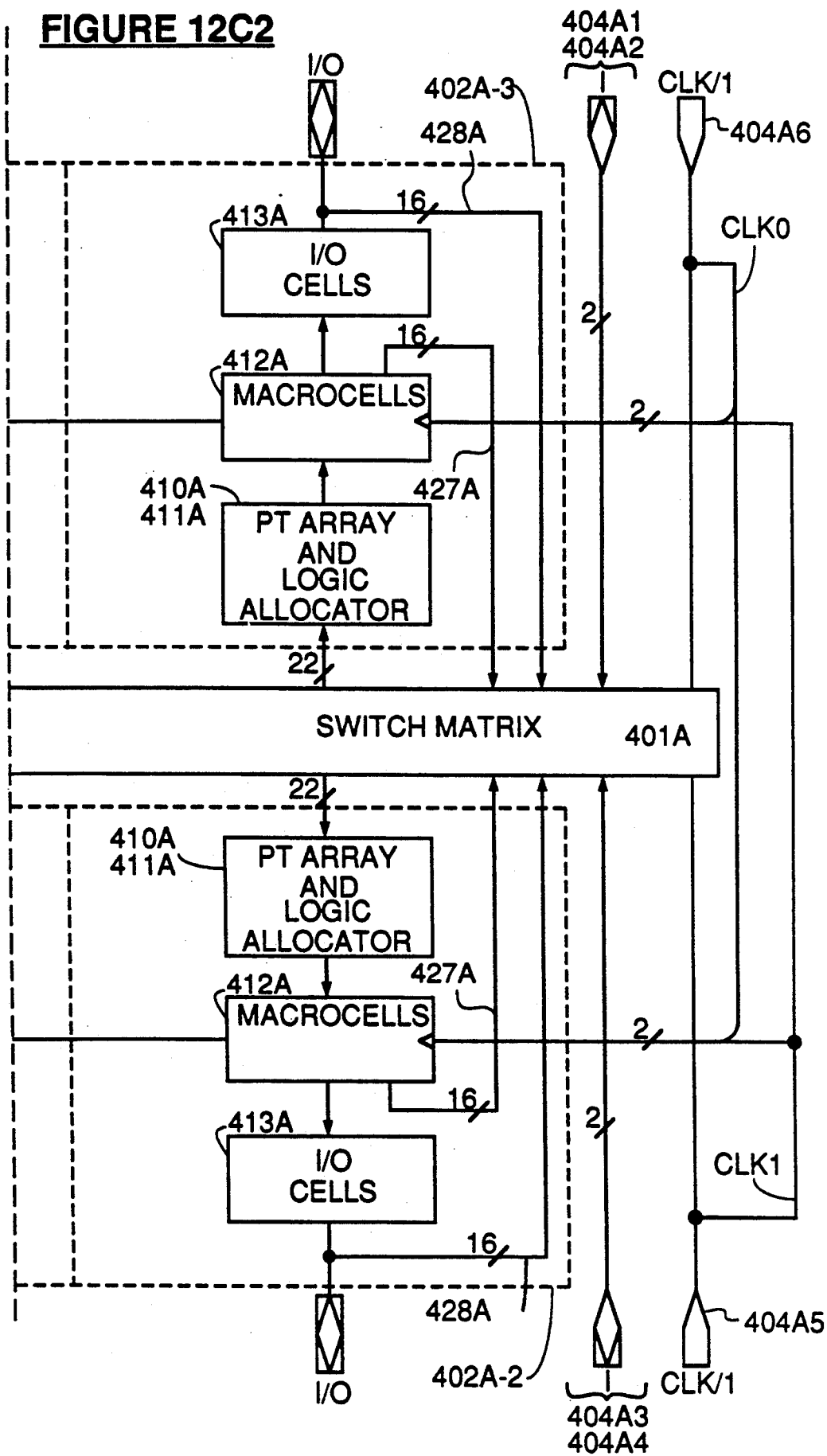
FIGURE 12C2

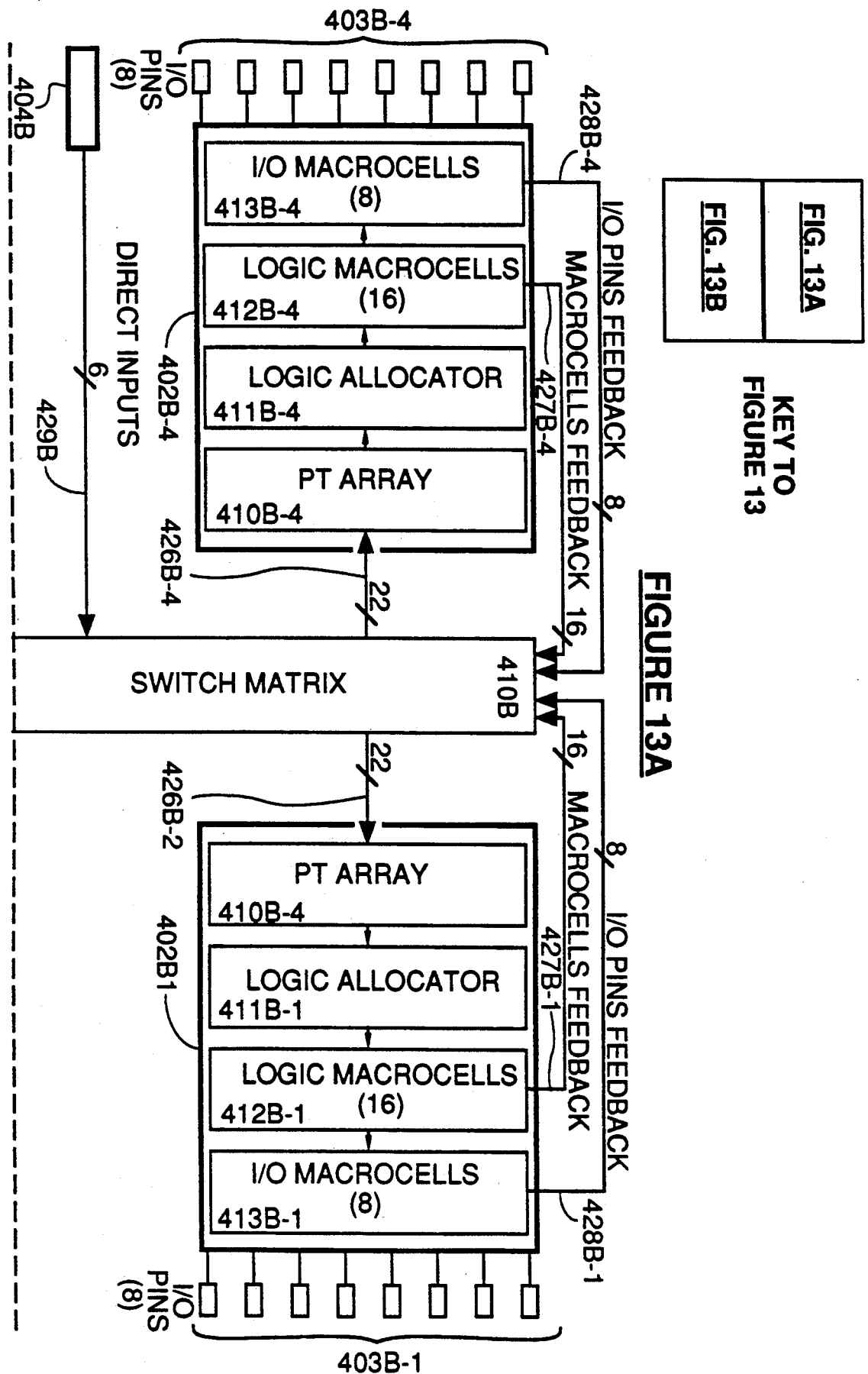

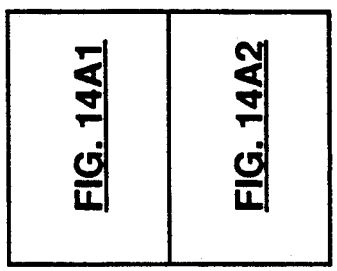
KEY TO FIGURE 14A
| FIG. 14A1 | FIG. 14A2 |
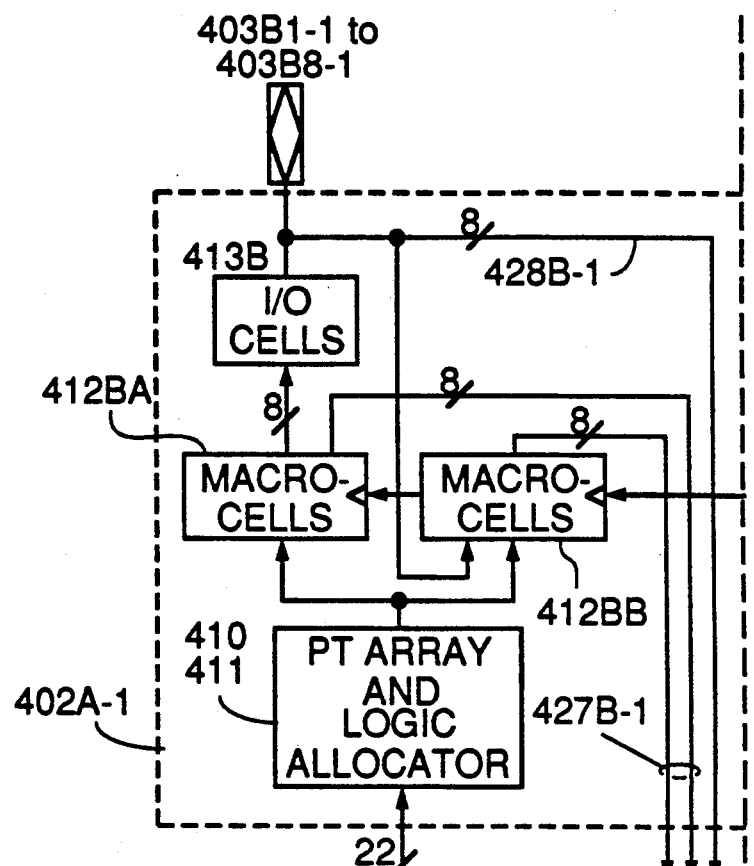
FIGURE 14A1
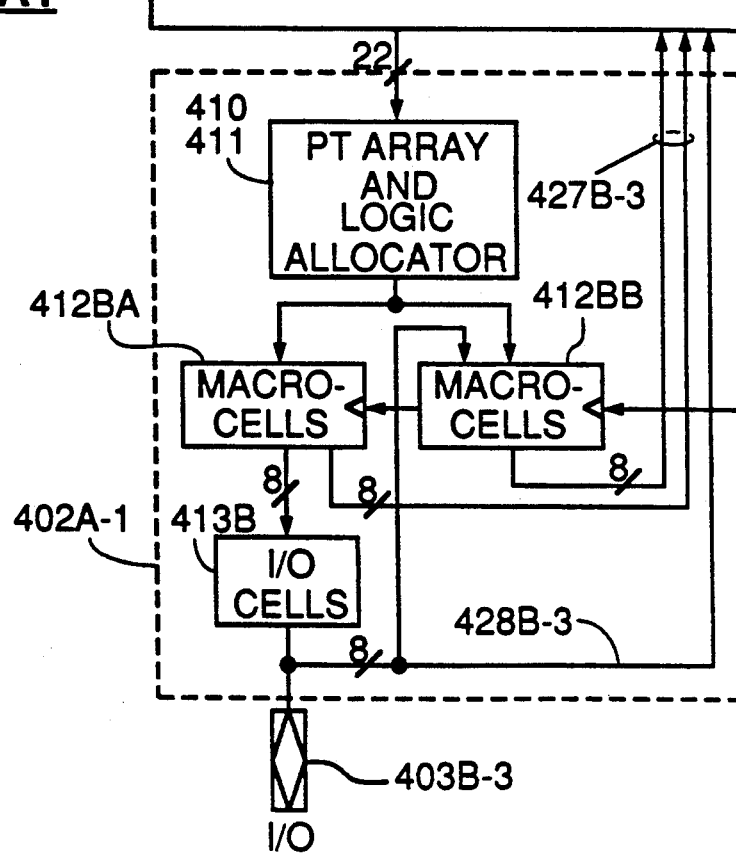

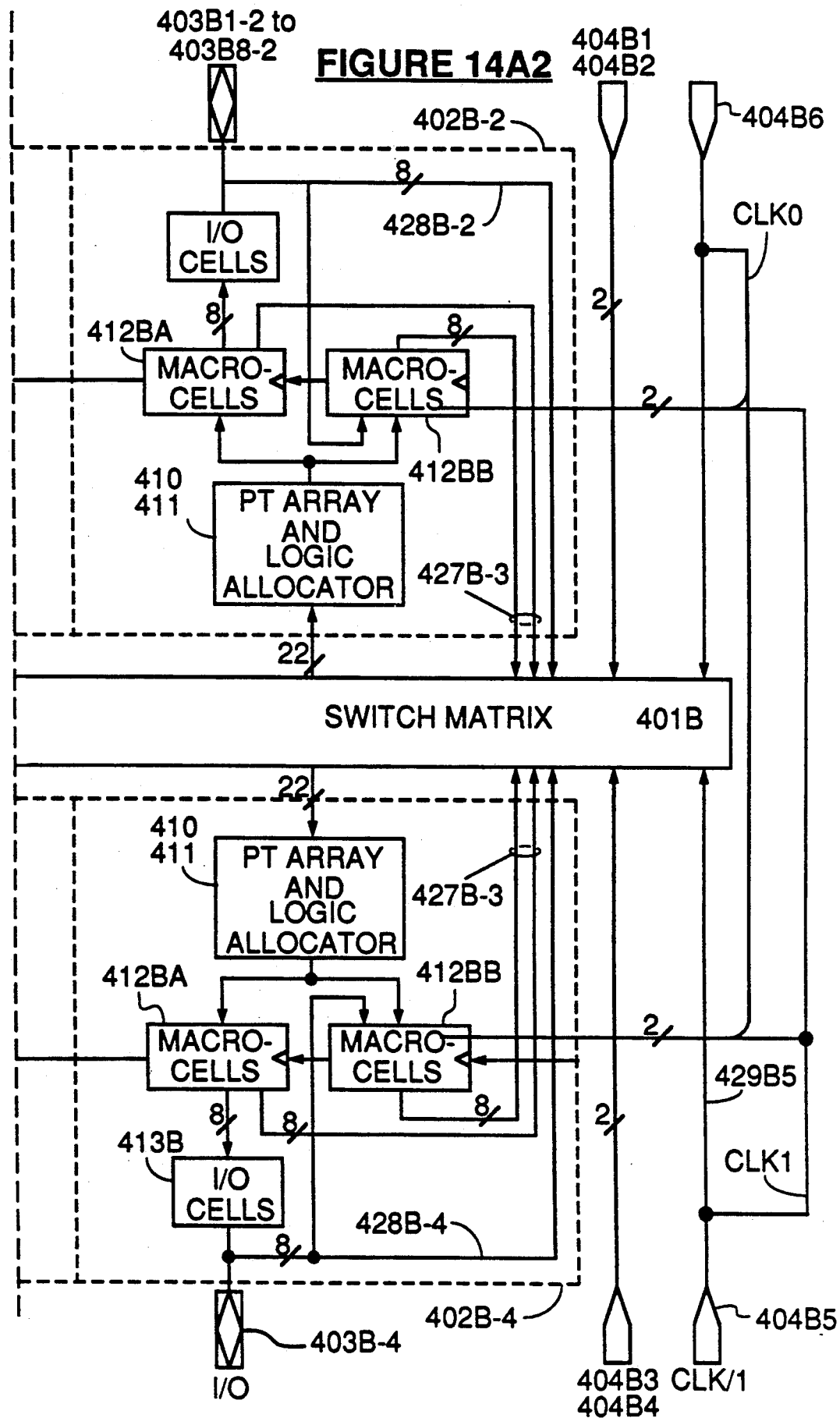
FIGURE 14A2

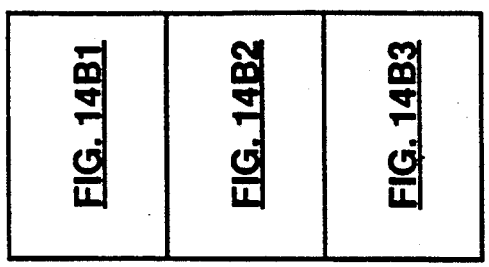
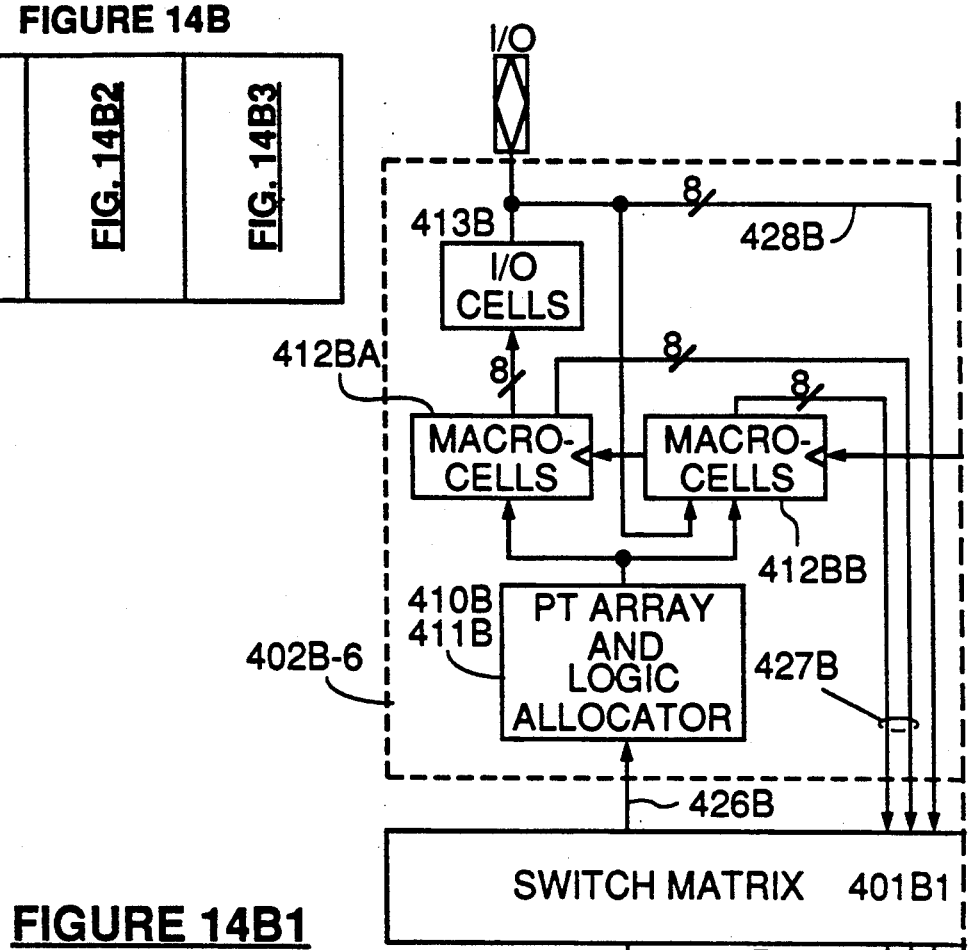
FIGURE 14B1
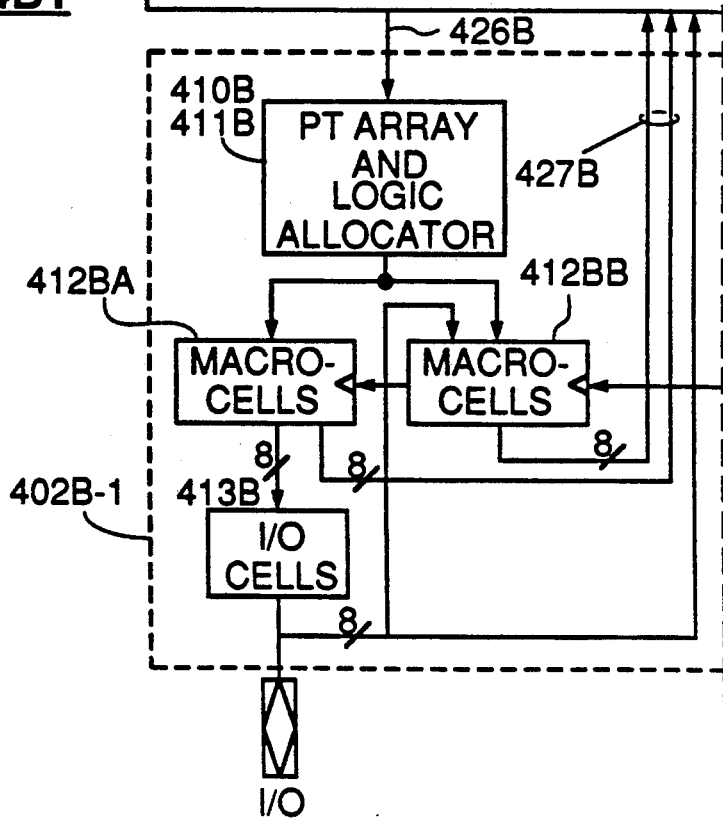

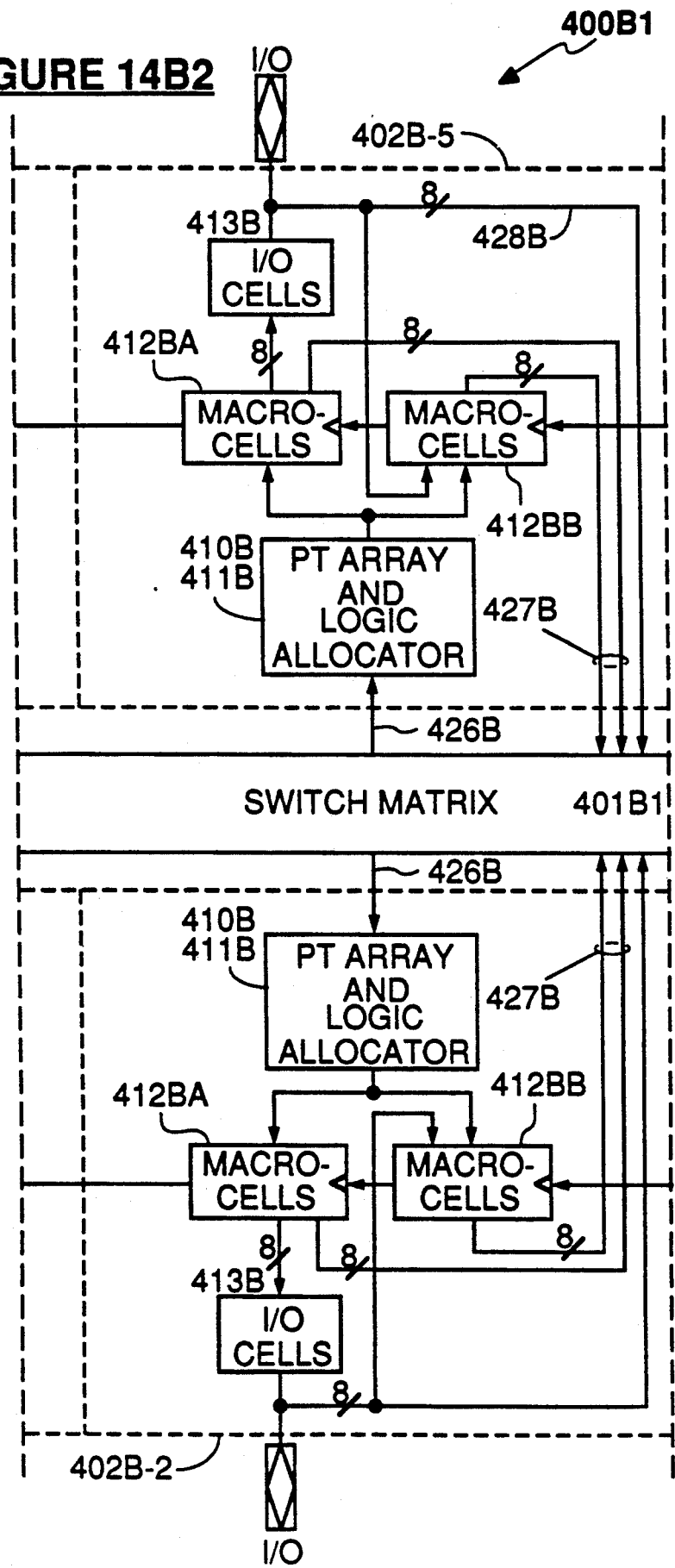
FIGURE 14B2

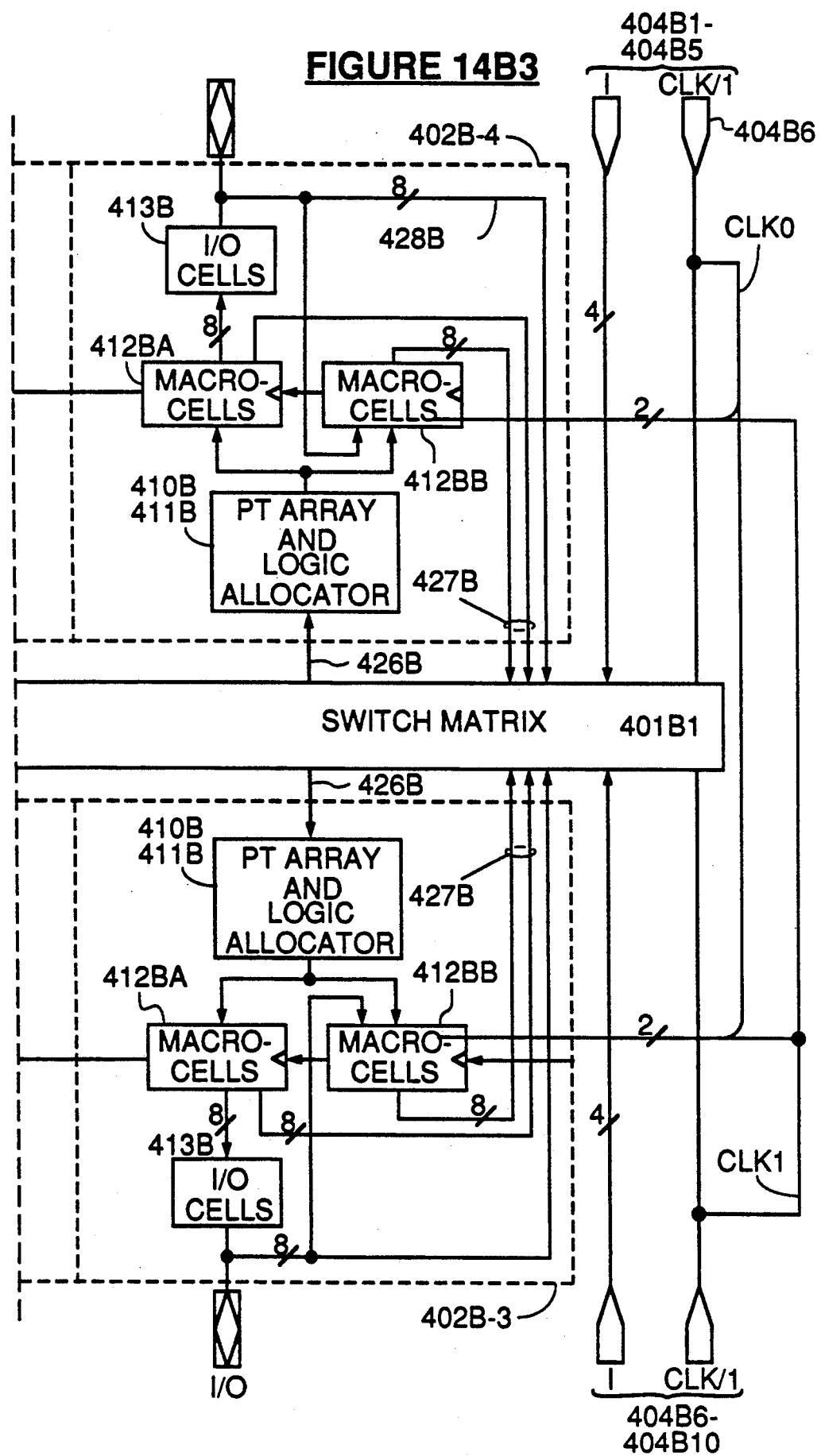
FIGURE 14B3

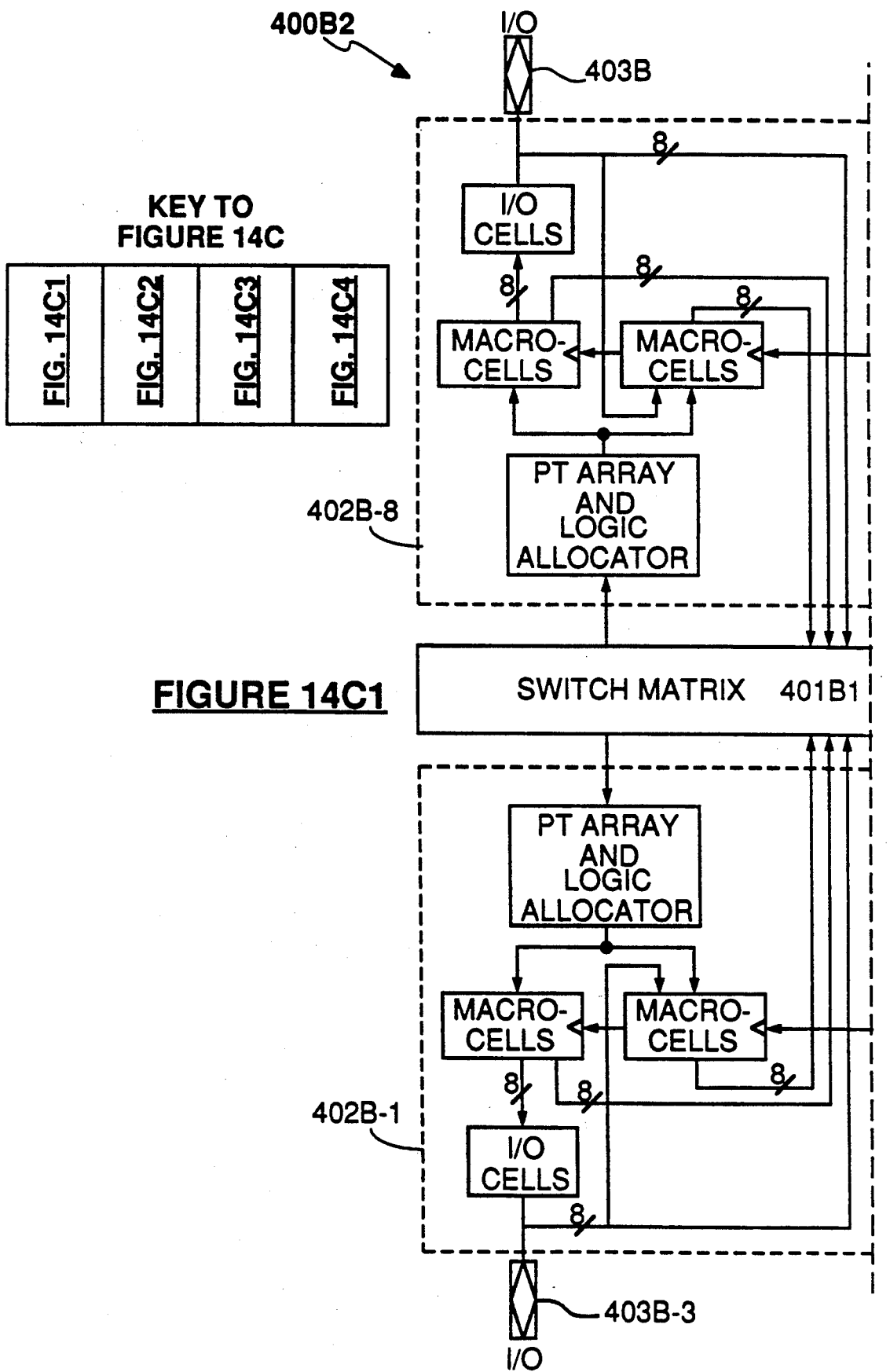

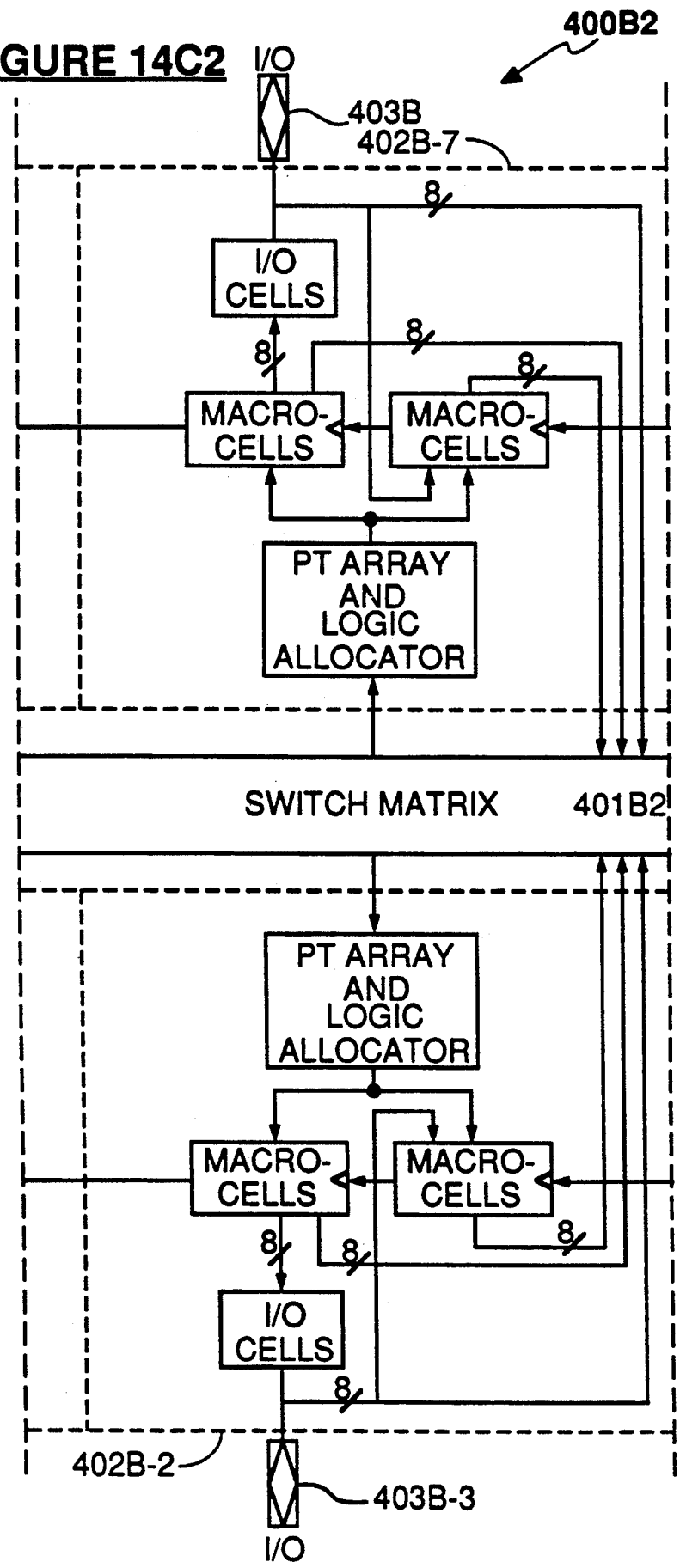
FIGURE 14C2

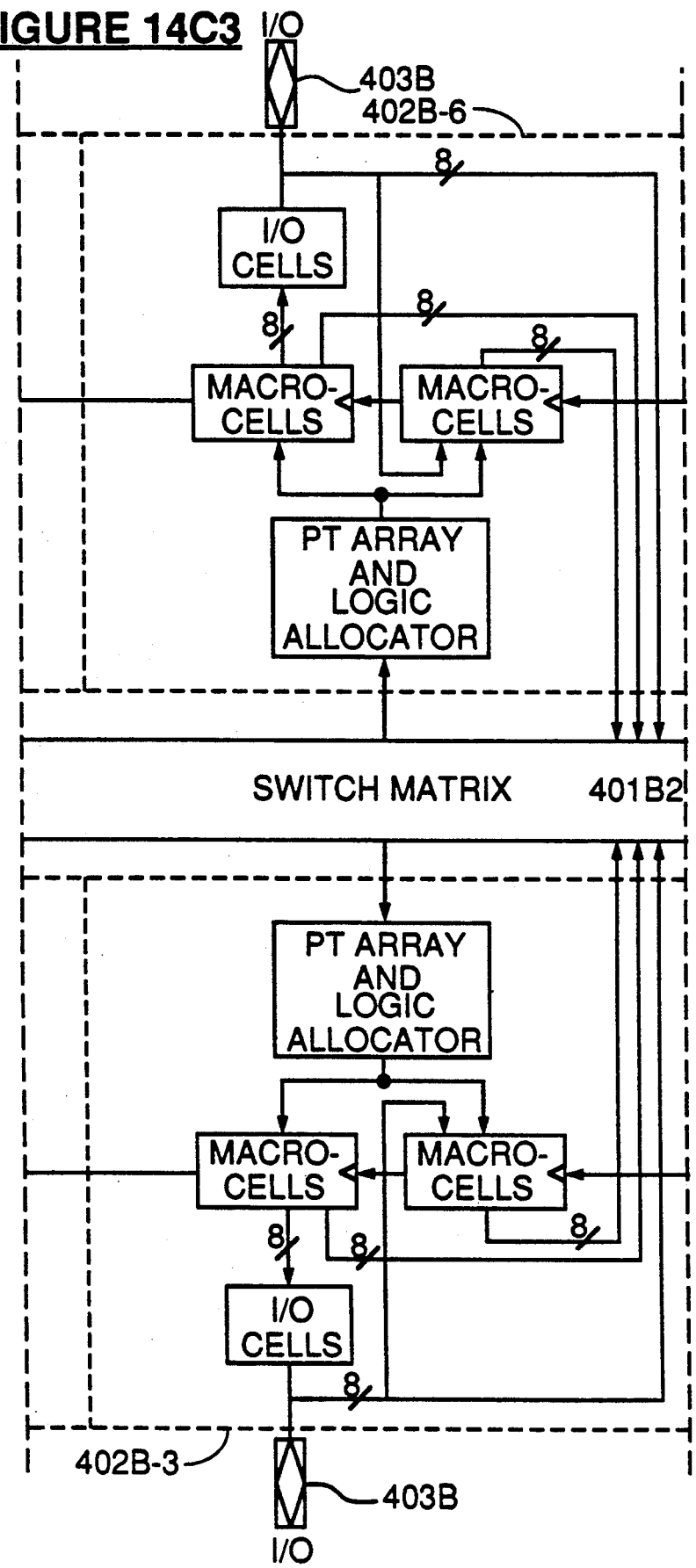
FIGURE 14C3

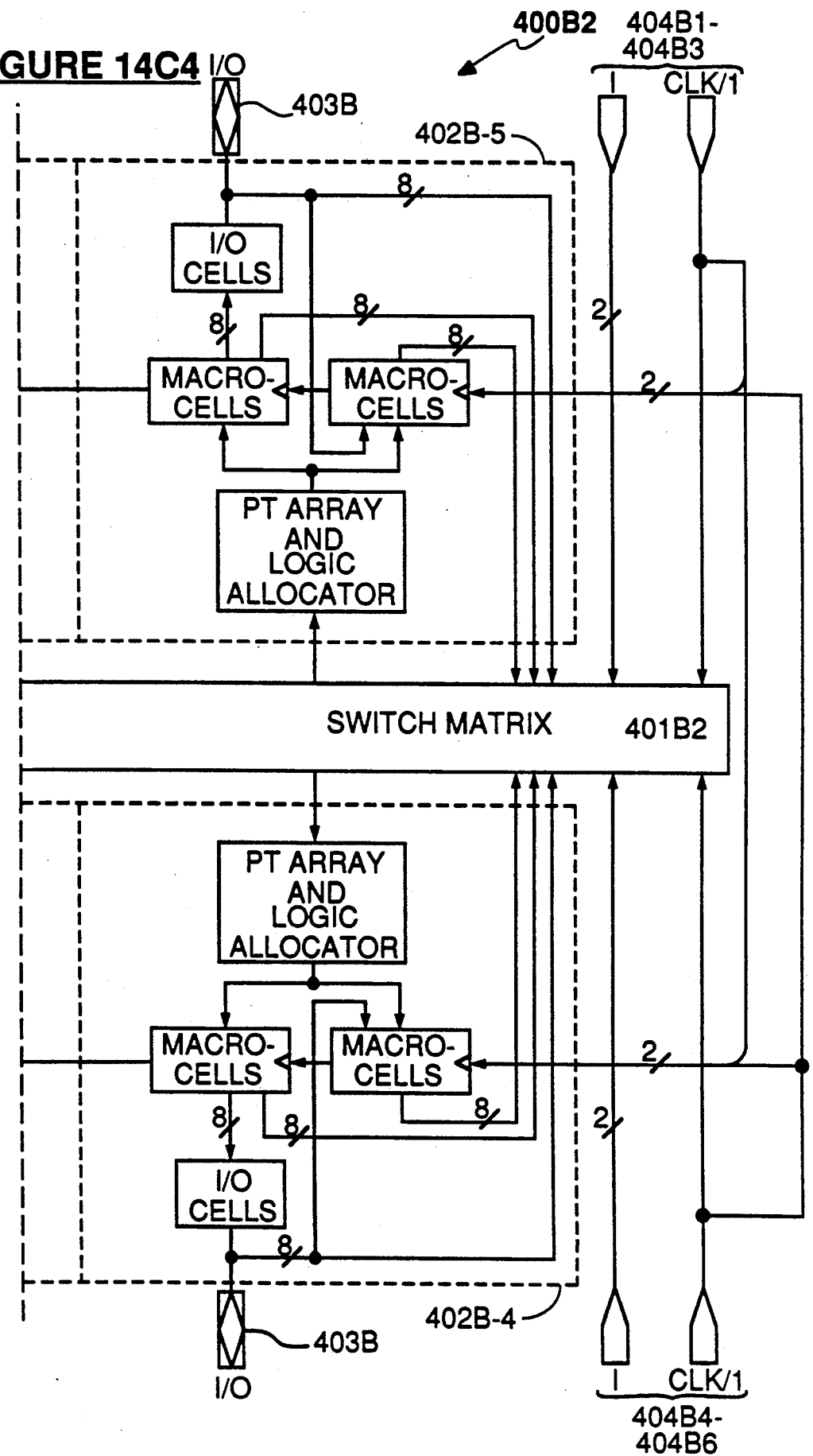

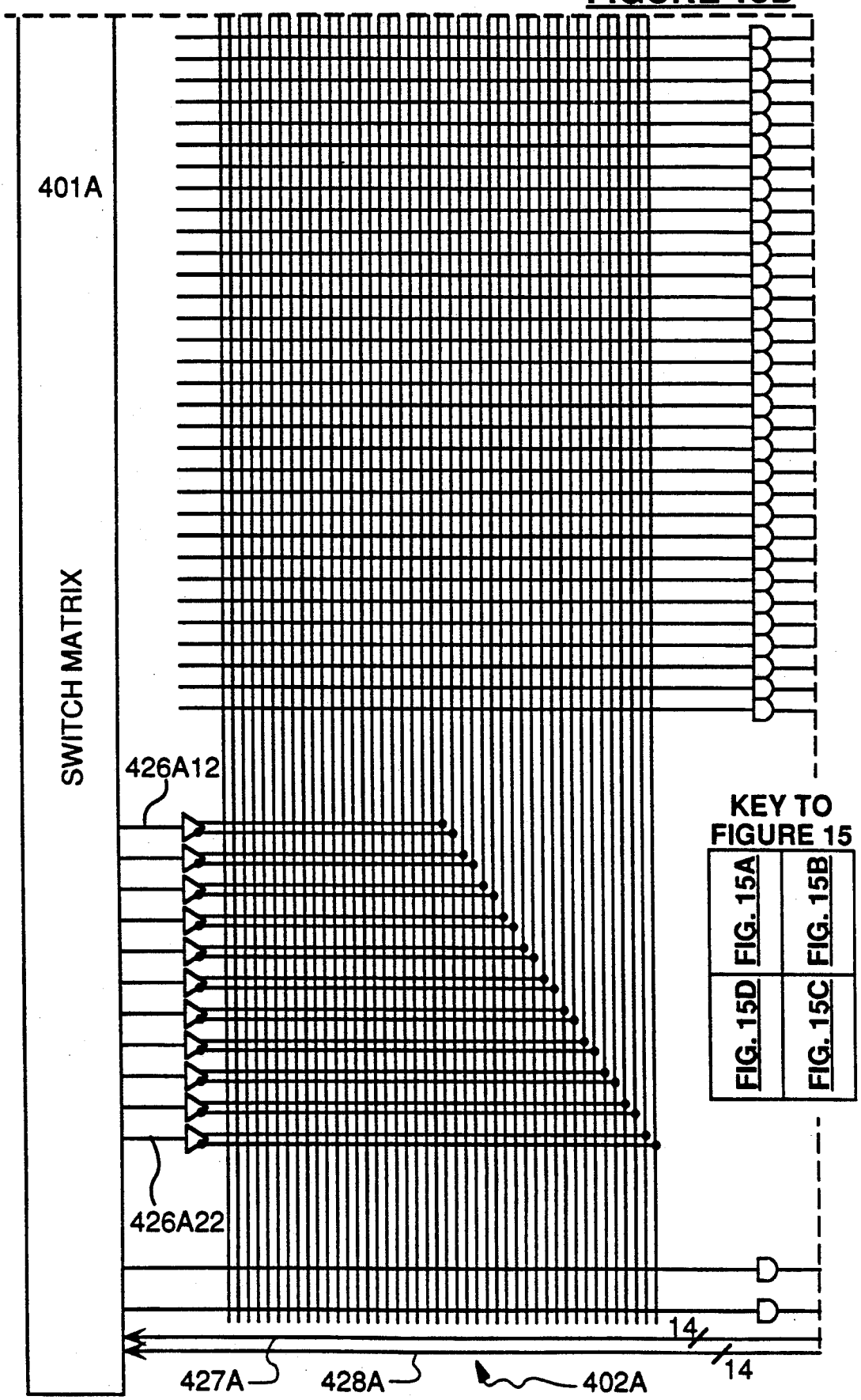

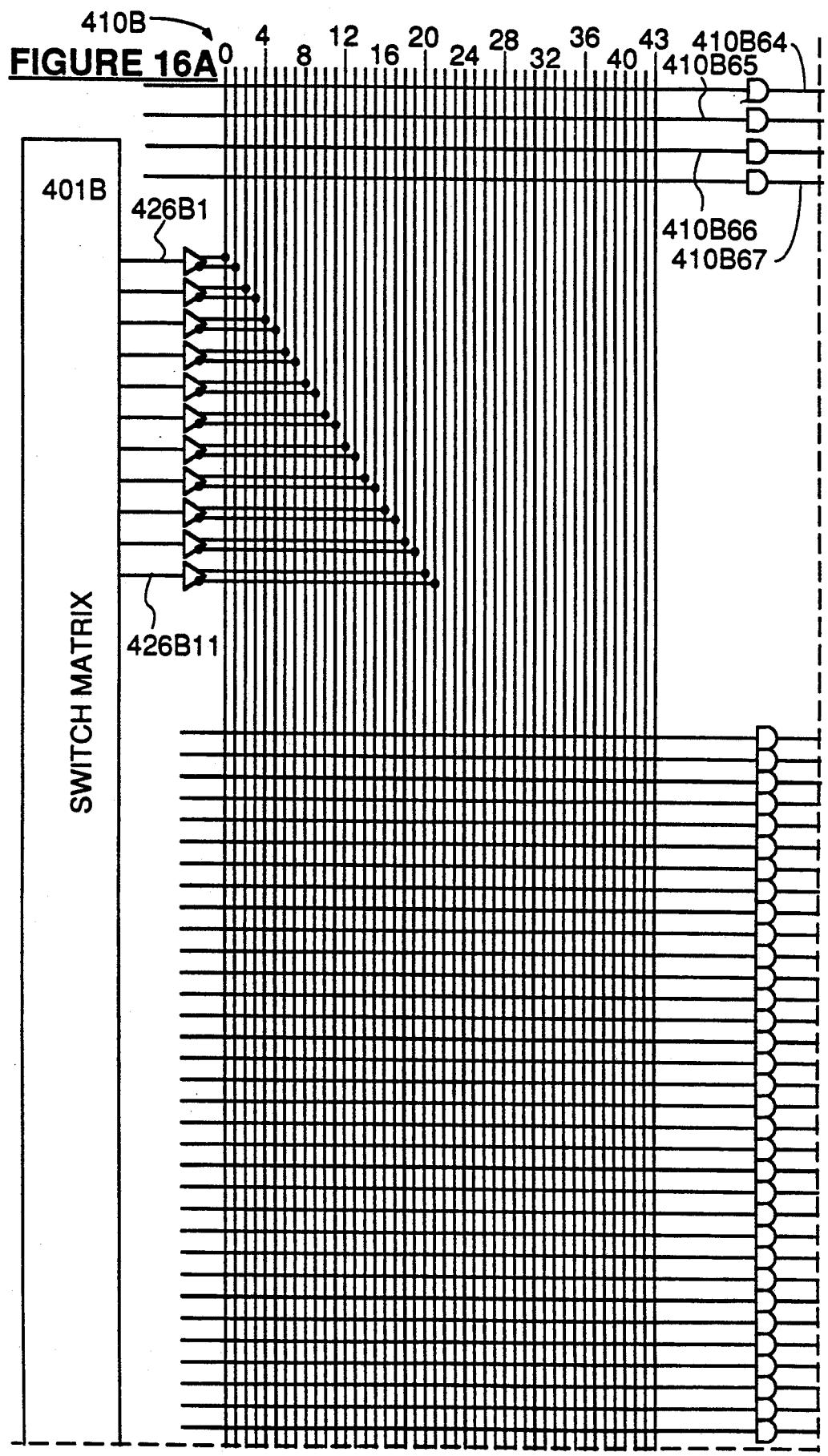

FIGURE 20

| # OF POINTS | | | # OF POINTS | |
|---|---|---|---|---|
| L0 | 4 | FROM L0,L1,L2 | 12 | R0 — I/O 0 |
| L1 | 4 | FROM L0,L1,L2,L3 | 16 | R1 |
| L2 | 4 | FROM L1,L2,L3,L4 | 16 | R2 — I/O 1 |
| L3 | 4 | FROM L2,L3,L4,L5 | 16 | R3 |
| L4 | 4 | FROM L3,L4,L5,L6 | 16 | R4 — I/O 2 |
| L5 | 4 | FROM L4,L5,L6,L7 | 16 | R5 |
| L6 | 4 | FROM L5,L6,L7,L8 | 16 | R6 — I/O 3 |
| L7 | 4 | FROM L6,L7,L8,L9 | 16 | R7 |
| L8 | 4 | FROM L7,L8,L9,L10 | 16 | R8 — I/O 4 |
| L9 | 4 | FROM L8,L9,L10,L11 | 16 | R9 |
| L10 | 4 | FROM L9,L10,L11,L12,L13 | 16 | R10 — I/O 5 |
| L11 | 4 | FROM L10,L11,L12,L13 | 16 | R11 |
| L12 | 4 | FROM L11,L12,L13,L14 | 16 | R12 — I/O 6 |
| L13 | 4 | FROM L12,L13,L14,L15 | 16 | R13 |
| L14 | 4 | FROM L13,L14,L15 | 12 | R14 — I/O 7 |
| L15 | 4 | FROM L14,L15 | 8 | R15 |

410B → , 402B → , 411B → , 412B → , 413B/403B →

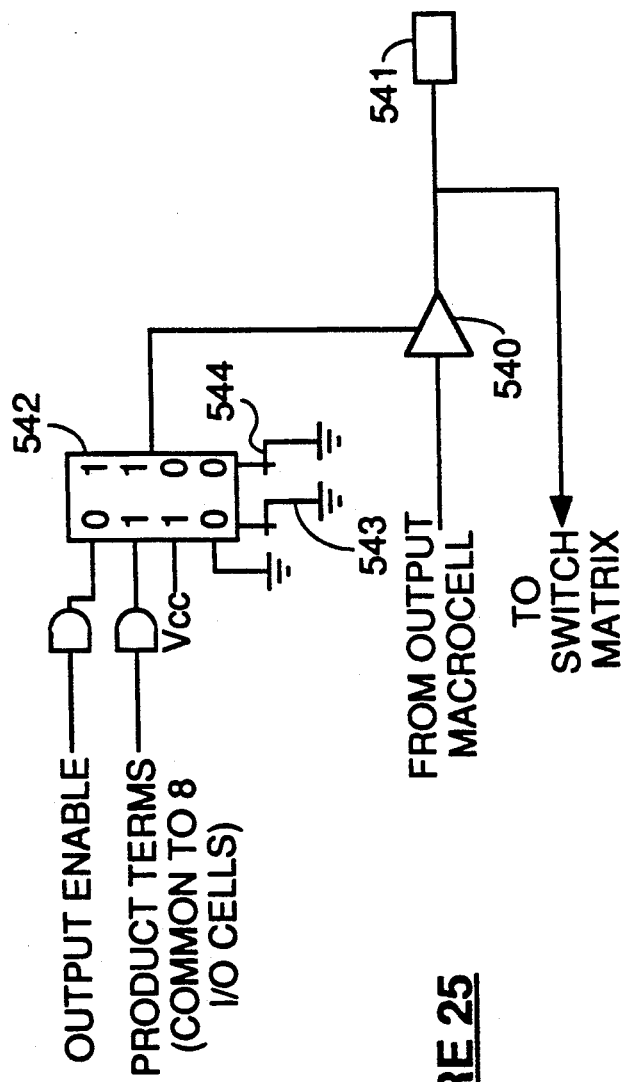

FIGURE 27A

| Programmable Logic Block Input Line | Switch Matrix Multiplexer Input Lines | | | | |
|---|---|---|---|---|---|
| A1N1  | A1^  | A9   | B1^  | B9  | |
| A1N2  | A2^  | A10  | B2^  | B10 | |
| A1N3  | A3^  | A11  | B3^  | B11 | |
| A1N4  | A4^  | A12  | B4   | B12 | |
| A1N5  | A5^  | A13  | B5^  | B13 | |
| A1N6  | A6^  | A14  | B6^  | B14 | |
| A1N7  | A7^  | A15  | B7^  | B15 | |
| A1N8  | A8^  | A16  | B8^  | B16 | |
| A1N9  | A9^  | A1   | B9^  | B1  | |
| A1N10 | A10^ | A2   | B10^ | B2  | |
| A1N11 | A11^ | A3   | B11^ | B3  | |
| A1N12 | A12^ | A4   | B12^ | B4  | |
| A1N13 | A13^ | A5   | B13^ | B5  | |
| A1N14 | A14^ | A6   | B14^ | B6  | |
| A1N15 | A15^ | A7   | B15^ | B7  | |
| A1N16 | A16^ | A8   | B16^ | B8  | |
| A1N17 | I1 | | | | |
| A1N18 | I2 | | | | |
| A1N19 | A1^ | A9^  | A2 | A10 | I3 |
| A1N20 | A3^ | A11^ | A4 | A12 | I4 |
| A1N21 | A5^ | A13^ | A6 | A14 | I5 |
| A1N22 | A7^ | A15^ | A8 | A16 | I6 |

FIGURE 27B

| Programmable Logic Block Input Line | Switch Matrix Multiplexer Input Lines | | | | |
|---|---|---|---|---|---|
| BIN1  | A1^ | A9  | B1^ | B9  |    |
| BIN2  | A2^ | A10 | B2^ | B10 |    |
| BIN3  | A3^ | A11 | B3^ | B11 |    |
| BIN4  | A4^ | A12 | B4^ | B12 |    |
| BIN5  | A5^ | A13 | B5^ | B13 |    |
| BIN6  | A6^ | A14 | B6^ | B14 |    |
| BIN7  | A7^ | A15 | B7^ | B15 |    |
| BIN8  | A8^ | A16 | B8^ | B16 |    |
| BIN9  | A9^ | A1  | B9^ | B1  |    |
| BIN10 | A10^ | A2 | B10^ | B2 |    |
| BIN11 | A11^ | A3 | B11^ | B3 |    |
| BIN12 | A12^ | A4 | B12^ | B4 |    |
| BIN13 | A13^ | A5 | B13^ | B5 |    |
| BIN14 | A14^ | A6 | BI4^ | B6 |    |
| BIN15 | A15^ | A7 | BI5^ | B7 |    |
| BIN16 | A16^ | A8 | B16^ | B8 |    |
| BIN17 | I1 |   |   |   |    |
| BIN18 | I2 |   |   |   |    |
| BIN19 | B1^ | B9^ | B2 | B10 | I3 |
| BIN20 | B3^ | B11^ | B4 | B12 | I4 |
| BIN21 | B5^ | B13^ | B6 | B14 | I5 |
| BIN22 | B7^ | B15^ | B8 | B16 | I6 |

FIGURE 29A

| Programmable Logic Block Input Line | Switch Matrix Multiplexer Input Line | | | | | | | | | | |
|---|---|---|---|---|---|---|---|---|---|---|---|
| A1IN | A1^ | A5 | A9 | B1^ | B5 | B9 | C1^ | C5 | C9 | D1^ | D5 | D9 |
| A2IN | A2^ | A6 | A10 | B2^ | B6 | B10 | C2^ | C6 | C10 | D2^ | D6 | D10 |
| A3IN | A3^ | A7 | A11 | B3^ | B7 | B11 | C3^ | C7 | C11 | D3^ | D7 | D11 |
| A4IN | A4^ | A8 | A12 | B4^ | B8 | B12 | C4^ | C8 | C12 | D4^ | D8 | D12 |
| A5IN | A5^ | A1 | A13 | B5^ | B1 | B13 | C5^ | C1 | C13 | D5^ | D1 | D13 |
| A6IN | A6^ | A2 | A14 | B6^ | B2 | B14 | C6^ | C2 | C14 | D6^ | D2 | D14 |
| A7IN | A7^ | A3 | A15 | B7^ | B3 | B15 | C7^ | C3 | C15 | D7^ | D3 | D15 |
| A8IN | A8^ | A4 | A16 | B8^ | B4 | B16 | C8^ | C4 | C16 | D8^ | D4 | D16 |
| A9IN | A1^ | A5 | A9 | B1^ | B5 | B9 | C1^ | C5 | C9 | D1^ | D5 | D9 |
| A10IN | A2^ | A6 | A10 | B2^ | B6 | B10 | C2^ | C6 | C10 | D2^ | D6 | D10 |
| A11IN | A3^ | A7 | A11 | B3^ | B7 | B11 | C3^ | C7 | C11 | D3^ | D7 | D11 |
| A12IN | A4^ | A8 | A12 | B4^ | B8 | B12 | C4^ | C8 | C12 | D4^ | D8 | D12 |
| A13IN | A5^ | A1 | A13 | B5^ | B1 | B13 | C5^ | C1 | C13 | D5^ | D1 | D13 |
| A14IN | A6^ | A2 | A14 | B6^ | B2 | B14 | C6^ | C2 | C14 | D6^ | D2 | D14 |
| A15IN | A7^ | A3 | A15 | B7^ | B3 | B15 | C7^ | C3 | C15 | D7^ | D3 | D15 |
| A16IN | A8^ | A4 | A16 | B8^ | B4 | B16 | C8^ | C4 | C16 | D8^ | D4 | D16 |
| A17IN | I1 | | | | | | | | | | |
| A18IN | I2 | | | | | | | | | | |
| A19IN | A1^ | A2 | A10 | I3 | | | | | | | |
| A20IN | A2^ | A4 | A12 | I4 | | | | | | | |
| A21IN | A3^ | A6 | A14 | I5 | | | | | | | |
| A22IN | A4^ | A8 | A16 | I6 | | | | | | | |

FIGURE 29B

| Programmable Logic Block Input Line | Switch Matrix Multiplexer Input Line | | | | | | | | | | |
|---|---|---|---|---|---|---|---|---|---|---|---|
| B1IN | A1^ | A5 | A9 | B1^ | B5 | B9 | C1^ | C5 | C9 | D1^ | D5 | D9 |
| B2IN | A2^ | A6 | A10 | B2^ | B6 | B10 | C2^ | C6 | C10 | D2^ | D6 | D10 |
| B3IN | A3^ | A7 | A11 | B3^ | B7 | B11 | C3^ | C7 | C11 | D3^ | D7 | D11 |
| B4IN | A4^ | A8 | A12 | B4^ | B8 | B12 | C4^ | C8 | C12 | D4^ | D8 | D12 |
| B5IN | A5^ | A1 | A13 | B5^ | B1 | B13 | C5^ | C1 | C13 | D5^ | D1 | D13 |
| B6IN | A6^ | A2 | A14 | B6^ | B2 | B14 | C6^ | C2 | C14 | D6^ | D2 | D14 |
| B7IN | A7^ | A3 | A15 | B7^ | B3 | B15 | C7^ | C3 | C15 | D7^ | D3 | D15 |
| B8IN | A8^ | A4 | A16 | B8^ | B4 | B16 | C8^ | C4 | C16 | D8^ | D4 | D16 |
| B9IN | A1^ | A5 | A9 | B1^ | B5 | B9 | C1^ | C5 | C9 | D1^ | D5 | D9 |
| B10IN | A2^ | A6 | A10 | B2^ | B6 | B10 | C2^ | C6 | C10 | D2^ | D6 | D10 |
| B11IN | A3^ | A7 | A11 | B3^ | B7 | B11 | C3^ | C7 | C11 | D3^ | D7 | D11 |
| B12IN | A4^ | A8 | A12 | B4^ | B8 | B12 | C4^ | C8 | C12 | D4^ | D8 | D12 |
| B13IN | A5^ | A1 | A13 | B5^ | B1 | B13 | C5^ | C1 | C13 | D5^ | D1 | D13 |
| B14IN | A6^ | A2 | A14 | B6^ | B2 | B14 | C6^ | C2 | C14 | D6^ | D2 | D14 |
| B15IN | A7^ | A3 | A15 | B7^ | B3 | B15 | C7^ | C3 | C15 | D7^ | D3 | D15 |
| B16IN | A8^ | A4 | A16 | B8^ | B4 | B16 | C8^ | C4 | C16 | D8^ | D4 | D16 |
| B17IN | I1 | | | | | | | | | | | |
| B18IN | I2 | | | | | | | | | | | |
| B19IN | B1^ | B2 | B10 | I3 | | | | | | | | |
| B20IN | B2^ | B4 | B12 | I4 | | | | | | | | |
| B21IN | B3^ | B6 | B14 | I5 | | | | | | | | |
| B22IN | B4^ | B8 | B16 | I6 | | | | | | | | |

FIGURE 29C

| Programmable Logic Block Input Line | Switch Matrix Multiplexer Input Line | | | | | | | | | | |
|---|---|---|---|---|---|---|---|---|---|---|---|
| C1IN  | A1^ | A5 | A9  | B1^ | B5 | B9  | C1^ | C5 | C9  | D1^ | D5 | D9  |
| C2IN  | A2^ | A6 | A10 | B2^ | B6 | B10 | C2^ | C6 | C10 | D2^ | D6 | D10 |
| C3IN  | A3^ | A7 | A11 | B3^ | B7 | B11 | C3^ | C7 | C11 | D3^ | D7 | D11 |
| C4IN  | A4^ | A8 | A12 | B4^ | B8 | B12 | C4^ | C8 | C12 | D4^ | D8 | D12 |
| C5IN  | A5^ | A1 | A13 | B5^ | B1 | B13 | C5^ | C1 | C13 | D5^ | D1 | D13 |
| C6IN  | A6^ | A2 | A14 | B6^ | B2 | B14 | C6^ | C2 | C14 | D6^ | D2 | D14 |
| C7IN  | A7^ | A3 | A15 | B7^ | B3 | B15 | C7^ | C3 | C15 | D7^ | D3 | D15 |
| C8IN  | A8^ | A4 | A16 | B8^ | B4 | B16 | C8^ | C4 | C16 | D8^ | D4 | D16 |
| C9IN  | A1^ | A5 | A9  | B1^ | B5 | B9  | C1^ | C5 | C9  | D1^ | D5 | D9  |
| C10IN | A2^ | A6 | A10 | B2^ | B6 | B10 | C2^ | C6 | C10 | D2^ | D6 | D10 |
| C11IN | A3^ | A7 | A11 | B3^ | B7 | B11 | C3^ | C7 | C11 | D3^ | D7 | D11 |
| C12IN | A4^ | A8 | A12 | B4^ | B8 | B12 | C4^ | C8 | C12 | D4^ | D8 | D12 |
| C13IN | A5^ | A1 | A13 | B5^ | B1 | B13 | C5^ | C1 | C13 | D5^ | D1 | D13 |
| C14IN | A6^ | A2 | A14 | B6^ | B2 | B14 | C6^ | C2 | C14 | D6^ | D2 | D14 |
| C15IN | A7^ | A3 | A15 | B7^ | B3 | B15 | C7^ | C3 | C15 | D7^ | D3 | D15 |
| C16IN | A8^ | A4 | A16 | B8^ | B4 | B16 | C8^ | C4 | C16 | D8^ | D4 | D16 |
| C17IN | I1  |    |     |     |    |     |     |    |     |     |    |     |
| C18IN | I2  |    |     |     |    |     |     |    |     |     |    |     |
| C19IN | C1^ | C2 | C10 | I3  |    |     |     |    |     |     |    |     |
| C20IN | C2^ | C4 | C12 | I4  |    |     |     |    |     |     |    |     |
| C21IN | C3^ | C6 | C14 | I5  |    |     |     |    |     |     |    |     |
| A22IN | C4^ | C8 | C16 | I6  |    |     |     |    |     |     |    |     |

FIGURE 29D

| Programmable Logic Block Input Line | Switch Matrix Multiplexer Input Line | | | | | | | | | | |
|---|---|---|---|---|---|---|---|---|---|---|---|
| D1IN  | A1^ | A5 | A9  | B1^ | B5 | B9  | C1^ | C5 | C9  | D1^ | D5 | D9  |
| D2IN  | A2^ | A6 | A10 | B2^ | B6 | B10 | C2^ | C6 | C10 | D2^ | D6 | D10 |
| D3IN  | A3^ | A7 | A11 | B3^ | B7 | B11 | C3^ | C7 | C11 | D3^ | D7 | D11 |
| D4IN  | A4^ | A8 | A12 | B4^ | B8 | B12 | C4^ | C8 | C12 | D4^ | D8 | D12 |
| D5IN  | A5^ | A1 | A13 | B5^ | B1 | B13 | C5^ | C1 | C13 | D5^ | D1 | D13 |
| D6IN  | A6^ | A2 | A14 | B6^ | B2 | B14 | C6^ | C2 | C14 | D6^ | D2 | D14 |
| D7IN  | A7^ | A3 | A15 | B7^ | B3 | B15 | C7^ | C3 | C15 | D7^ | D3 | D15 |
| D8IN  | A8^ | A4 | A16 | B8^ | B4 | B16 | C8^ | C4 | C16 | D8^ | D4 | D16 |
| D9IN  | A1^ | A5 | A9  | B1^ | B5 | B9  | C1^ | C5 | C9  | D1^ | D5 | D9  |
| D10IN | A2^ | A6 | A10 | B2^ | B6 | B10 | C2^ | C6 | C10 | D2^ | D6 | D10 |
| D11IN | A3^ | A7 | A11 | B3^ | B7 | B11 | C3^ | C7 | C11 | D3^ | D7 | D11 |
| D12IN | A4^ | A8 | A12 | B4^ | B8 | B12 | C4^ | C8 | C12 | D4^ | D8 | D12 |
| D13IN | A5^ | A1 | A13 | B5^ | B1 | B13 | C5^ | C1 | C13 | D5^ | D1 | D13 |
| D14IN | A6^ | A2 | A14 | B6^ | B2 | B14 | C6^ | C2 | C14 | D6^ | D2 | D14 |
| D15IN | A7^ | A3 | A15 | B7^ | B3 | B15 | C7^ | C3 | C15 | D7^ | D3 | D15 |
| D16IN | A8^ | A4 | A16 | B8^ | B4 | B16 | C8^ | C4 | C16 | D8^ | D4 | D16 |
| D17IN | I1  |    |     |     |    |     |     |    |     |     |    |     |
| D18IN | I2  |    |     |     |    |     |     |    |     |     |    |     |
| D19IN | D1^ | D2 | D10 | I3  |    |     |     |    |     |     |    |     |
| D20IN | D2^ | D4 | D12 | I4  |    |     |     |    |     |     |    |     |
| D21IN | D3^ | D6 | D14 | I5  |    |     |     |    |     |     |    |     |
| D22IN | D4^ | D8 | D16 | I6  |    |     |     |    |     |     |    |     |

FIGURE 30A

Interconnect 1

| | | | | | | | | | | | | |
|---|---|---|---|---|---|---|---|---|---|---|---|---|
| AR0  | A0  | A5  | A10^ | B0^ | B6  | B11  | C1  | C6^ | C12  | D2  | D7  | D12^ | I0 |
| AR1  | A0^ | A6  | A11  | B1  | B6^ | B12  | C2  | C7  | C12^ | D2^ | D8  | D13  | I1 |
| AR2  | A1  | A6^ | A12  | B2  | B7  | B12^ | C2^ | C8  | C13  | D3  | D8^ | D14  | I2 |
| AR3  | A2  | A7  | A12^ | B2^ | B8  | B13  | C3  | C8^ | C14  | D4  | D9  | D14^ | I3 |
| AR4  | A2^ | A8  | A13  | B3  | B8^ | B14  | C4  | C9  | C14^ | D4^ | D10 | D15  | I4 |
| AR5  | A3  | A8^ | A14  | B4  | B9  | B14^ | C4^ | C10 | C15  | D0  | D5  | D10^ | I5 |
| AR6  | A4  | A9  | A14^ | B4^ | B10 | B15  | C0  | C5  | C10^ | D0^ | D6  | D11  | I0 |
| AR7  | A4^ | A10 | A15  | B0  | B5  | B10^ | C0^ | C6  | C11  | D1  | D6^ | D12  | I1 |
| | | | | | | | | | | | | |
| AR8  | A0  | A6^ | A11  | B1  | B8  | B12^ | C2  | C8^ | C13  | D2^ | D9  | D14  | I2 |
| AR9  | A0^ | A7  | A12  | B2  | B8^ | B13  | C2^ | C9  | C14  | D3  | D10 | D14^ | I3 |
| AR10 | A1  | A8  | A12^ | B2^ | B9  | B14  | C3  | C10 | C14^ | D4  | D5  | D15  | I4 |
| AR11 | A2  | A8^ | A13  | B3  | B10 | B14^ | C4  | C5  | C15  | D4^ | D6  | D10^ | I5 |
| AR12 | A2^ | A9  | A14  | B4  | B5  | B15  | C4^ | C6  | C10^ | D0  | D6^ | D11  | I0 |
| AR13 | A3  | A10 | A14^ | B4^ | B6  | B10^ | C0  | C6^ | C11  | D0^ | D7  | D12  | I1 |
| AR14 | A4  | A5  | A15  | B0  | B6^ | B11  | C0^ | C7  | C12  | D1  | D8  | D12^ | I2 |
| AR15 | A4^ | A6  | A10^ | B0^ | B7  | B12  | C1  | C8  | C12^ | D2  | D8^ | D13  | I3 |
| | | | | | | | | | | | | |
| AR16 | A0  | A7  | A12^ | B2  | B9  | B14^ | C2^ | C10 | C15  | D3  | D5  | D10^ | I4 |
| AR17 | A0^ | A8  | A13  | B2^ | B10 | B15  | C3  | C5  | C10^ | D4  | D6  | D11  | I5 |
| AR18 | A1  | A8^ | A14  | B3  | B5  | B10^ | C4  | C6  | C11  | D4^ | D6^ | D12  | I0 |
| AR19 | A2  | A9  | A14^ | B4  | B6  | B11  | C4^ | C6^ | C12  | D0  | D7  | D12^ | I1 |
| AR20 | A2^ | A10 | A15  | B4^ | B6^ | B12  | C0  | C7  | C12^ | D0^ | D8  | D13  | I2 |
| AR21 | A3  | A5  | A10^ | B0  | B7  | B12^ | C0^ | C8  | C13  | D1  | D8^ | D14  | I3 |
| AR22 | A4  | A6  | A11  | B0^ | B8  | B13  | C1  | C8^ | C14  | D2  | D9  | D14^ | I4 |
| AR23 | A4^ | A6^ | A12  | B1  | B8^ | B14  | C2  | C9  | C14^ | D2^ | D10 | D15  | I5 |

FIGURE 30B

Interconnect 1

| | | | | | | | | | | | | |
|---|---|---|---|---|---|---|---|---|---|---|---|---|
| BR0  | A0  | A5  | A10^ | B0^ | B6  | B11 | C1  | C6^ | C12 | D2  | D7  | D12^ | I0 |
| BR1  | A0^ | A6  | A11 | B1  | B6^ | B12 | C2  | C7  | C12^ | D2^ | D8  | D13 | I1 |
| BR2  | A1  | A6^ | A12 | B2  | B7  | B12^ | C2^ | C8  | C13 | D3  | D8^ | D14 | I2 |
| BR3  | A2  | A7  | A12^ | B2^ | B8  | B13 | C3  | C8^ | C14 | D4  | D9  | D14^ | I3 |
| BR4  | A2^ | A8  | A13 | B3  | B8^ | B14 | C4  | C9  | C14^ | D4^ | D10 | D15 | I4 |
| BR5  | A3  | A8^ | A14 | B4  | B9  | B14^ | C4^ | C10 | C15 | D0  | D5  | D10^ | I5 |
| BR6  | A4  | A9  | A14^ | B4^ | B10 | B15 | C0  | C5  | C10^ | D0^ | D6  | D11 | I0 |
| BR7  | A4^ | A10 | A15 | B0  | B5  | B10^ | C0^ | C6  | C11 | D1  | D6^ | D12 | I1 |

| | | | | | | | | | | | | |
|---|---|---|---|---|---|---|---|---|---|---|---|---|
| BR8  | A0  | A6^ | A11 | B1  | B8  | B12^ | C2  | C8^ | C13 | D2^ | D9  | D14 | I2 |
| BR9  | A0^ | A7  | A12 | B2  | B8^ | B13 | C2^ | C9  | C14 | D3  | D10 | D14^ | I3 |
| BR10 | A1  | A8  | A12^ | B2^ | B9  | B14 | C3  | C10 | C14^ | D4  | D5  | D15 | I4 |
| BR11 | A2  | A8^ | A13 | B3  | B10 | B14^ | C4  | C5  | C15 | D4^ | D6  | D10^ | I5 |
| BR12 | A2^ | A9  | A14 | B4  | B5  | B15 | C4^ | C6  | C10^ | D0  | D6^ | D11 | I0 |
| BR13 | A3  | A10 | A14^ | B4^ | B6  | B10^ | C0  | C6^ | C11 | D0^ | D7  | D12 | I1 |
| BR14 | A4  | A5  | A15 | B0  | B6^ | B11 | C0^ | C7  | C12 | D1  | D8  | D12^ | I2 |
| BR15 | A4^ | A6  | A10^ | B0^ | B7  | B12 | C1  | C8  | C12^ | D2  | D8^ | D13 | I3 |

| | | | | | | | | | | | | |
|---|---|---|---|---|---|---|---|---|---|---|---|---|
| BR16 | A0  | A7  | A12^ | B2  | B9  | B14^ | C2^ | C10 | C15 | D3  | D5  | D10^ | I4 |
| BR17 | A0^ | A8  | A13 | B2^ | B10 | B15 | C3  | C5  | C10^ | D4  | D6  | D11 | I5 |
| BR18 | A1  | A8^ | A14 | B3  | B5  | B10^ | C4  | C6  | C11 | D4^ | D6^ | D12 | I0 |
| BR19 | A2  | A9  | A14^ | B4  | B6  | B11 | C4^ | C6^ | C12 | D0  | D7  | D12^ | I1 |
| BR20 | A2^ | A10 | A15 | B4^ | B6^ | B12 | C0  | C7  | C12^ | D0^ | D8  | D13 | I2 |
| BR21 | A3  | A5  | A10^ | B0  | B7  | B12^ | C0^ | C8  | C13 | D1  | D8^ | D14 | I3 |
| BR22 | A4  | A6  | A11 | B0^ | B8  | B13 | C1  | C8^ | C14 | D2  | D9  | D14^ | I4 |
| BR23 | A4^ | A6^ | A12 | B1  | B8^ | B14 | C2  | C9  | C14^ | D2^ | D10 | D15 | I5 |

FIGURE 30C

Interconnect 1

| | | | | | | | | | | | |
|---|---|---|---|---|---|---|---|---|---|---|---|
| CR0 | A0 | A5 | A10^ | B0^ | B6 | B11 | C1 | C6^ | C12 | D2 | D7 | D12^ | I0 |
| CR1 | A0^ | A6 | A11 | B1 | B6^ | B12 | C2 | C7 | C12^ | D2^ | D8 | D13 | I1 |
| CR2 | A1 | A6^ | A12 | B2 | B7 | B12^ | C2^ | C8 | C13 | D3 | D8^ | D14 | I2 |
| CR3 | A2 | A7 | A12^ | B2^ | B8 | B13 | C3 | C8^ | C14 | D4 | D9 | D14^ | I3 |
| CR4 | A2^ | A8 | A13 | B3 | B8^ | B14 | C4 | C9 | C14^ | D4^ | D10 | D15 | I4 |
| CR5 | A3 | A8^ | A14 | B4 | B9 | B14^ | C4^ | C10 | C15 | D0 | D5 | D10^ | I5 |
| CR6 | A4 | A9 | A14^ | B4^ | B10 | B15 | C0 | C5 | C10^ | D0^ | D6 | D11 | I0 |
| CR7 | A4^ | A10 | A15 | B0 | B5 | B10^ | C0^ | C6 | C11 | D1 | D6^ | D12 | I1 |
| CR8 | A0 | A6^ | A11 | B1 | B8 | B12^ | C2 | C8^ | C13 | D2^ | D9 | D14 | I2 |
| CR9 | A0^ | A7 | A12 | B2 | B8^ | B13 | C2^ | C9 | C14 | D3 | D10 | D14^ | I3 |
| CR10 | A1 | A8 | A12^ | B2^ | B9 | B14 | C3 | C10 | C14^ | D4 | D5 | D15 | I4 |
| CR11 | A2 | A8^ | A13 | B3 | B10 | B14^ | C4 | C5 | C15 | D4^ | D6 | D10^ | I5 |
| CR12 | A2^ | A9 | A14 | B4 | B5 | B15 | C4^ | C6 | C10^ | D0 | D6^ | D11 | I0 |
| CR13 | A3 | A10 | A14^ | B4^ | B6 | B10^ | C0 | C6^ | C11 | D0^ | D7 | D12 | I1 |
| CR14 | A4 | A5 | A15 | B0 | B6^ | B11 | C0^ | C7 | C12 | D1 | D8 | D12^ | I2 |
| CR15 | A4^ | A6 | A10^ | B0^ | B7 | B12 | C1 | C8 | C12^ | D2 | D8^ | D13 | I3 |
| CR16 | A0 | A7 | A12^ | B2 | B9 | B14^ | C2^ | C10 | C15 | D3 | D5 | D10^ | I4 |
| CR17 | A0^ | A8 | A13 | B2^ | B10 | B15 | C3 | C5 | C10^ | D4 | D6 | D11 | I5 |
| CR18 | A1 | A8^ | A14 | B3 | B5 | B10^ | C4 | C6 | C11 | D4^ | D6^ | D12 | I0 |
| CR19 | A2 | A9 | A14^ | B4 | B6 | B11 | C4^ | C6^ | C12 | D0 | D7 | D12^ | I1 |
| CR20 | A2^ | A10 | A15 | B4^ | B6^ | B12 | C0 | C7 | C12^ | D0^ | D8 | D13 | I2 |
| CR21 | A3 | A5 | A10^ | B0 | B7 | B12^ | C0^ | C8 | C13 | D1 | D8^ | D14 | I3 |
| CR22 | A4 | A6 | A11 | B0^ | B8 | B13 | C1 | C8^ | C14 | D2 | D9 | D14^ | I4 |
| CR23 | A4^ | A6^ | A12 | B1 | B8^ | B14 | C2 | C9 | C14^ | D2^ | D10 | D15 | I5 |

FIGURE 30D

Interconnect 1

| | | | | | | | | | | | | |
|---|---|---|---|---|---|---|---|---|---|---|---|---|
| DR0 | A0 | A5 | A10^ | B0^ | B6 | B11 | C1 | C6^ | C12 | D2 | D7 | D12^ | I0 |
| DR1 | A0^ | A6 | A11 | B1 | B6^ | B12 | C2 | C7 | C12^ | D2^ | D8 | D13 | I1 |
| DR2 | A1 | A6^ | A12 | B2 | B7 | B12^ | C2^ | C8 | C13 | D3 | D8^ | D14 | I2 |
| DR3 | A2 | A7 | A12^ | B2^ | B8 | B13 | C3 | C8^ | C14 | D4 | D9 | D14^ | I3 |
| DR4 | A2^ | A8 | A13 | B3 | B8^ | B14 | C4 | C9 | C14^ | D4^ | D10 | D15 | I4 |
| DR5 | A3 | A8^ | A14 | B4 | B9 | B14^ | C4^ | C10 | C15 | D0 | D5 | D10^ | I5 |
| DR6 | A4 | A9 | A14^ | B4^ | B10 | B15 | C0 | C5 | C10^ | D0^ | D6 | D11 | I0 |
| DR7 | A4^ | A10 | A15 | B0 | B5 | B10^ | C0^ | C6 | C11 | D1 | D6^ | D12 | I1 |
| DR8 | A0 | A6^ | A11 | B1 | B8 | B12^ | C2 | C8^ | C13 | D2^ | D9 | D14 | I2 |
| DR9 | A0^ | A7 | A12 | B2 | B8^ | B13 | C2^ | C9 | C14 | D3 | D10 | D14^ | I3 |
| DR10 | A1 | A8 | A12^ | B2^ | B9 | B14 | C3 | C10 | C14^ | D4 | D5 | D15 | I4 |
| DR11 | A2 | A8^ | A13 | B3 | B10 | B14^ | C4 | C5 | C15 | D4^ | D6 | D10^ | I5 |
| DR12 | A2^ | A9 | A14 | B4 | B5 | B15 | C4^ | C6 | C10^ | D0 | D6^ | D11 | I0 |
| DR13 | A3 | A10 | A14^ | B4^ | B6 | B10^ | C0 | C6^ | C11 | D0^ | D7 | D12 | I1 |
| DR14 | A4 | A5 | A15 | B0 | B6^ | B11 | C0^ | C7 | C12 | D1 | D8 | D12^ | I2 |
| DR15 | A4^ | A6 | A10^ | B0^ | B7 | B12 | C1 | C8 | C12^ | D2 | D8^ | D13 | I3 |
| DR16 | A0 | A7 | A12^ | B2 | B9 | B14^ | C2^ | C10 | C15 | D3 | D5 | D10^ | I4 |
| DR17 | A0^ | A8 | A13 | B2^ | B10 | B15 | C3 | C5 | C10^ | D4 | D6 | D11 | I5 |
| DR18 | A1 | A8^ | A14 | B3 | B5 | B10^ | C4 | C6 | C11 | D4^ | D6^ | D12 | I0 |
| DR19 | A2 | A9 | A14^ | B4 | B6 | B11 | C4^ | C6^ | C12 | D0 | D7 | D12^ | I1 |
| DR20 | A2^ | A10 | A15 | B4^ | B6^ | B12 | C0 | C7 | C12^ | D0^ | D8 | D13 | I2 |
| DR21 | A3 | A5 | A10^ | B0 | B7 | B12^ | C0^ | C8 | C13 | D1 | D8^ | D14 | I3 |
| DR22 | A4 | A6 | A11 | B0^ | B8 | B13 | C1 | C8^ | C14 | D2 | D9 | D14^ | I4 |
| DR23 | A4^ | A6^ | A12 | B1 | B8^ | B14 | C2 | C9 | C14^ | D2^ | D10 | D15 | I5 |

MULTIPLE ARRAY HIGH PERFORMANCE PROGRAMMABLE LOGIC DEVICE FAMILY

CROSS REFERENCE

This application is a continuation-in-part of commonly assigned U.S. patent application Ser. No. 07/243,574 entitled "Flexible, Programmable Cell Array Interconnected By A Programmable Switch Matrix," of Mr. Om Agrawal, et al. filed on Sept. 12, 1988, which issued as U.S. Pat. No. 4,963,768 on Oct. 16, 1990 and which was a continuation-in-part of U.S. patent application Ser. No. 07/178,707, entitled "Multiple Array Customizable Logic Array," of Mr. Om Agrawal filed on Apr. 7, 1988, which issued as U.S. Pat. No. 4,931,671 on June 5, 1990, and which was a continuation of U.S. patent application Ser. No. 06/717,640, entitled "Multiple Array Customizable Logic Array," of Mr. Om Agrawal, filed on Mar. 29, 1985, which issued as U.S. Pat. No. 4,742,252 on May 3, 1988.

BACKGROUND OF THE INVENTION

1. Field of the Invention

This invention relates to programmable, integrated circuit logic devices arranged in interrelating groups or cells of logic components and interconnectable by a user-programmable switch matrix.

2. Description of the Prior Art

Several integrated circuit packages containing a programmable chip, which permits alternative implementation of logic functions, are available. These integrated circuit packages include a plurality of pins, an architecture for interfacing the pins with the input and output leads of the circuit on the programmable chip, and another architecture for interfacing the pins and auxiliary circuits on the chip which are used to configure the programmable chip into a user selected circuit. Thus, these field programmable logic devices permit the user to program or modify the functions on an integrated circuit chip with readily available equipment so as to configure the logic function performed by the chip to that desired by the user. However, the prior art programmable logic arrays (PLAs), programmable logic devices (PLDs) and programmable gate arrays, impose constraints on the user in exchange for field programmability.

In programmable logic arrays, which are often employed for random logic networks, data routing, code converters, instruction decoders, state machines, and other functions, an array of logic AND gates and logic OR gates is provided which can be programmed for a user specified function. Each output function (output signal) of a programmable logic array is the sum (OR gate output signal) of selected products (AND gate output signals) and each product (AND gate output signal) is the product of selected input signals. Programming is accomplished by providing a programmable array or matrix between the circuit input lines and the AND gate input lines and between the output lines of the AND gates and the input lines of the OR gates, respectively. The PLA is programmed by blowing or not blowing fusible links interconnecting the conductors of the arrays.

In another embodiment, the output lines from subgroups of AND gates of the PLA are non-programmably connected to the input lines of an OR gate. A programmable array logic (PAL) device such as this is disclosed in U.S. Pat. No. 4,124,899 and incorporated herein by reference. The PAL design affords a reduction in the size of the integrated circuit chip which allows an increase in production yields and a lowering of production costs over a conventional PLA.

To further enhance the flexibility of a PAL device or a PLA device, each output signal from the OR gate array is processed by a programmable means which lets the user select either a registered output signal or a combinatorial output signal. Further, the output signal can be configured as either an active high or an active low signal. An example of an output macrocell 10, used in the prior art on an output line 11 of either a PLA or a PAL circuit, is shown in FIG. 1. Output line 11 from a programmable logic circuit is connected to a D input terminal of register 12 as well as a first input line 13 of a programmable multiplexer 19. The Q output terminal of register 12 drives a second input line 14 of multiplexer 19. The output signal from multiplexer 19, which is determined by the state of fuse 20 on line 21, drives a first input terminal of an exclusive OR gate 25. The power supply voltage is provided through a resistor 31 to the input select line 21 of multiplexer 19 and to a first end of fuse 20. The second end of fuse 20 is grounded. Accordingly, if fuse 20 is left intact, a logical zero signal is applied to input select line 21. However, if fuse 20 is blown, the signal on the input select line 21 is a logical one. Therefore, multiplexer 19 couples either the signal on line 13 or the signal on line 14 to output line 26.

The output signal from exclusive OR gate 25 is determined by fuse 23. If fuse 23 is left intact, then a logical zero is supplied to the second input terminal of exclusive OR gate 25 and the signal on line 26 is not inverted by gate 25. Conversely, if fuse 23 is blown, a logical one is provided to the second input terminal of exclusive OR gate 25 and exclusive OR gate 25 inverts the signal on line 26. Line 27 is used to tristate exclusive OR gate 25.

Output macrocell 10 also has means to provide a feedback signal to a logic circuit on line 17 of programmable multiplexer 18. Programmable multiplexer 18 has a first input line 22 connected to output line 25 of Exclusive OR gate 25 and a second input line 15 connected to Q output terminal of register 12. The signal on input select line 16 of multiplexer 18 is controlled by fuse 20, as previously described for multiplexer 19. Multiplexer 18 has three signal sources: (1) an inverted registered output signal from register 12; (2) an input signal on pin 30; or, (3) a signal from exclusive OR gate 25. If the signal on line tristates exclusive OR gate 25, then an input signal on pin 30 is passed over lines 29, 22 to the first input terminal of multiplexer 18. Alternatively, the output signal of exclusive OR gate 25 is passed over lines 28, 22 to the first input terminal of multiplexer 18. Output line 17 of multiplexer 18 thus provides either an inverted or uninverted registered feedback signal, an inverted or uninverted combinatorial feedback signal, or an input signal to the logic circuit to which output macrocell 10 is connected. Output macrocell 10 is discussed in further detail in U.S. Pat. No. 4,717,912, which is incorporated herein by reference.

A disadvantage of monolithic PAL circuits is that to increase the number of input lines to the programmable AND logic array requires increasing the array size in proportion to the number of input lines. Accordingly, the size of a PAL circuit is limited by both integrated circuit technology and the cost of producing such a circuit. Also, the fuses used to program a bipolar logic array can only be programmed once and so the logic array cannot be fully tested prior to programming by the user.

The functionality of a conventional PAL device is determined by the input/output capability, the number of registers and the distribution of products terms of the device. A conventional PAL device suitable for both wide gating combinational functions, such as address decoding, multiplexing and demultiplexing, and sequential functions such as wide state machines and shift-register type functions, requires both wide input capability, i.e., a number of input lines, and a reasonably large register capability. Increasing the input capability of a conventional monolithic PAL device results in a larger array size, as described previously, which in turn results in a larger silicon die, higher cost, slower performance, and ineffective array utilization.

Erasable programmable logic devices (EPLDs) overcome the one time programmability limitation of fused logic arrays and typically use a segmented structure to enhance performance. One prior art EPLD is shown as a block diagram in FIG. 2A. The device has forty-eight input/output (I/O) pins 40, twelve dedicated input pins 41, and four pins 42 which may be used either as clock input pins or additional dedicated input pins. The signal on each I/O pin 40 is either provided to a macrocell 43 as an input signal or generated by a macrocell 43 as an output signal. Macrocells 43 are divided into three general types, a general macrocell 43, a global macrocell 60, and an enhanced macrocell 61.

General macrocell 43, as illustrated in FIG. 2C, provides an input signal from I/O pin 40 to local bus 44 and programmable AND array 46 through feedback select element 47. Alternatively, a signal generated from the eight product signals on lines 49a–49h from programmable AND array 46 by I/O architecture control cell 48 is passed through buffer 49 to I/O pin 40 and through feedback select element 47 to local bus 44 and programmable AND array 46. Thus, AND array 46 is provided with either local feedback or an input signal on pin 40, but not both. In addition, programmable AND array 46 receives (1) input signals from the macrocells on the local quadrant bus 44, (2) feedback signals from global bus 45 from macrocells 60A$_0$–60A$_3$, 60B$_0$–60B$_3$, 60C$_0$–60C$_3$ and 60D$_0$–60D$_3$, and (3) signals on the sixteen dedicated input pins 41, 42 as described previously. Local macrocell programmable AND array 46 is limited to eight product terms and I/O architecture control cell 48 provides a means for generating either combinatorial or registered output signals, as previously described.

A global macrocell 60 is shown in FIG. 2B. The programmable AND array 46 of global macrocell 60 is identical to programmable AND array 46 of general macrocell 43. However, the input signals to programmable AND array 46 of global macrocell 60 include both the signal from I/O pin 40, which is provided directly to global bus 45, and the signal from I/O architecture control cell 48, which is provided to local bus 44. Enhanced macrocells 61 (not shown) are utilized for critical combinatorial logic delay paths since these cells have increased speed performance through the logic array.

In another EPLD (FIG. 3) a programmable logic array 50 is configured as two symmetrical parts 50A, 50B with each half having 14 macrocells 51, three I/O architecture control cells 53 and one buried macrocell 52. Buried macrocell 52 is similar to group I/O architecture control cells 51 except buried macrocell 52 is not connected to an I/O pin 40 and therefore is used only to interface two macrocells with a global bus and a local bus.

In this embodiment, a selected group of macrocells, 51h–51k, 51x–51aa can share a total of sixteen additional product terms from the logic array. However, the sharing must occur between adjacent pairs of macrocells so that the additional product terms are available only to one side of the device at a given time.

The electrical programmable logic devices are implemented using CMOS technology. Also, the EPLD technology permits factory testing of all elements within the EPLD, unlike a fuse blown programmable device which can only be tested for certain configurations in the factory. The programmable connections in an EPLD typically use a CMOS floating gate architecture that is erased using a short wavelength ultraviolet (UV) light.

While an EPLD offers advantages over fuse programmable devices, the UV EPLD can be inadvertently erased if the device is left in either sunlight or fluorescent lighting. Further, the number of programmable gates, the utilization of the components in the device, and the flexibility of the device are limited by the architecture of the device. Specifically, while the devices illustrated in FIGS. 2 and 3 utilize a segmented PAL approach, each of the PAL structures is relatively large. The size of the structure results in lower performance in comparison to a smaller structure and also inefficient utilization of the array. In larger arrays, if only one or two input lines of a particular product term are used or if only one or two product terms of a particular output macrocell are used, then the remaining input lines or the remaining product terms are essentially wasted or unused.

The EPLD in FIG. 2 has 48 registers in a 68-pin package and the EPLD in FIG. 3 has 28 registers in a 40-pin package. Therefore, the number of registers in comparison to the number of package pins is limited and consequently the functionality of these devices for registered applications is limited. Hence, both the speed and the functionality of these EPLDs are compromised by the architecture of the devices.

An alternative to a monolithic or a segmented programmable logic array is a programmable gate array wherein configurable logic blocks 70, as shown in FIG. 4A, are interfaced through switch matrices, as shown in FIG. 4B. Each configurable logic block 70 has a combinatorial logic cell 73 with four input lines 70A, 70B, 70C, 70D and two output lines 70G, 70H, a clock input line 70K, a storage element 71, and several programmable multiplexers for signal routing within the logic block. Combinational logic cell 73 uses a table look-up memory to implement Boolean logic functions of up to four variables. The programmable multiplexers utilize volatile memory cells in conjunction with pass transistors to provide configuration signals for the multiplexer. Each switch matrix 72 interfaces four horizontal metal segments with five vertical metal segments. The switches in the switch matrices are pass transistors that are controlled by a configuration bit in a volatile memory cell.

The programmable gate array circuit provides 112 flip-flops in a 68-pin PLCC package and 174 flip-flops in an 84-pin PGA package. Thus, while these devices significantly increase the number of registers over the EPLDs, described above, the devices are inefficient for wide gating applications because each configurable logic block 73 is relatively small. Therefore, an application, which requires wide gating, requires cascading in series of multiple configurable logic blocks which in turn results in reduced performance.

The semiconductor industry is consistently driven to offer higher integration, higher speed silicon devices for increased performance, lower cost system applications. For a high density PAL-like device achieving higher speed is extremely critical. However, a high density PAL device which provides a high speed programmable array and a large register capability is presently unavailable. Further, as described above, the available prior art programmable logic devices fail to achieve an optimum balance of functionality, silicon die size and performance.

SUMMARY OF THE INVENTION

The programmable logic device (PLD) of this invention is a high density segmented PAL-like device which gives an optimum balance between functionality, silicon die size, and performance. The high density programmable logic device has two or more identical programmable logic circuits (blocks) interconnected by a switch matrix. In one embodiment, four identical programmable logic blocks contained in a single integrated circuit are interconnected by a switch matrix while in another embodiment two identical programmable logic blocks are interconnected by a switch matrix. This segmented logic structure provides high speed performance while maintaining greater functionality than was available in prior art programmable logic devices.

The switch matrix has a bank of programmable multiplexers for each programmable logic block in the PLD. The input signals to the multiplexers in each bank are selected from input signals on the pins of the integrated circuit package containing the integrated circuit of this invention and output signals from the programmable logic blocks. Hence, the switch matrix functions as both an input means and a feedback means to the various logic circuits.

Each of the multiplexers in the switch matrix has configuration architecture cells which provide input select signals to the multiplexer. The input select signals configure the multiplexer so that one of the signals on an input line to the multiplexer is passed through the multiplexer to an output line of the multiplexer and the other signals on the remaining input lines are disconnected from the output line.

The programmable logic blocks of this invention communicate with each other only through the switch matrix. Moreover, the programmable logic blocks receive all input signals from the switch matrix. Thus, the programmable logic blocks may be viewed as independent programmable logic devices on the same integrated circuit chip.

In one embodiment, each programmable logic block of this invention includes a programmable logic array, a programmable logic allocator, programmable logic macrocells, and programmable I/O macrocells. The input lines to the programmable logic block from the switch matrix drive the programmable logic array. The logic allocator is programmable so that signals from the programmable logic array are distributed to logic macrocells as required by the user of the programmable logic device. The logic macrocells configure the signals from the logic allocator either as registered signals or combinatorial signals. The output signal from a logic macrocell is provided to an I/O macrocell and fed back to the switch matrix. The I/O macrocell selectively delivers the logic macrocell signal to the I/O pins. Alternatively, the I/O macrocell can be configured using an output enable signal so that the I/O pin provides an input signal to the switch matrix array and the logic macrocell is decoupled from the I/O pin.

The logic allocator includes a multiplicity of programmable router elements. Each router element is connected to a selected number of output lines from the programmable logic array. These output lines are input lines to a logic gate. The output line from the logic gate drives the input terminal of a programmable demultiplexer. The programmable demultiplexer has a plurality of output lines, each of which is connected to the input line of one of the programmable logic macrocells. In response to an input select signal, the programmable demultiplexer passes the signal on the input line therethrough to the selected output line. Accordingly, none of the output lines from the programmable logic array are permanently connected to a logic macrocell. Accordingly, when an I/O pin is used for an input pin, the programmable logic macrocell associated with that pin may be used as a buried register, or alternatively, if the macrocell is not used, the signals from the programmable logic array are routed to other logic macrocells so that no product terms are wasted.

While the decoupling of the logic macrocells from the I/O pins restores the usage of the logic macrocells as buried registers, such decoupling does not address scalability of the user design to higher density devices. The more important problem for scalability is decoupling the product term array from the macrocells so that as the number of macrocells increases, the product term array size does not increase proportionally.

The logic allocator allocates product term resources in a variable distribution among all macrocells in a programmable logic block. Thus, the logic allocator essentially decouples unused macrocells from the product term array and in one embodiment allocates up to twelve to sixteen product terms per logic macrocell with minimum speed penalty.

The high speed switch matrix of this invention provides a fixed, uniform, predictable and path independent time delay for all signals that are passed through the switch matrix. Further, since the programmable logic array only receives signals from the switch matrix, the switch matrix effectively decouples the product term array from the logic macrocells, the I/O macrocells and array size.

Thus, programmable interconnections within the switch matrix and within each programmable logic block are used to decouple the product-term array from the switch matrix, macrocells and I/O pins. This decoupling provides greater flexibility than was available in the prior art programmable logic devices and allows the PLD of this invention to be efficiently and quickly configured for a user application.

Further, the complete decoupling of the internal resources within a programmable logic block is in sharp contrast to the prior art programmable logic device families.

BRIEF DESCRIPTION OF THE DRAWINGS

FIG. 6 is a conceptual block diagram of another embodiment of a programmable logic device according to the principles of this invention.

FIGS. 12A, 12B and 12C are more detailed block diagrams illustrating various embodiments of the first family of programmable logic devices according to the principles of this invention.

FIGS. 13A and 13B are block diagrams of the second family of programmable logic devices according to the principles of this invention.

FIGS. 14A, 14B and 14C are more detailed block diagrams of various embodiments of the second family of programmable logic devices according to the principles of this invention.

FIGS. 15A-15D are schematic diagrams of the programmable logic block in the first family of programmable logic devices according to the principles of this invention.

FIG. 20 illustrates the product term steering of the logic allocator 411B.

FIG. 25 is a schematic diagram of an I/O macrocell according to the principles of this invention.

FIGS. 27A and 27B are an alternative representation of the input lines and the output lines to the programmable multiplexers in switch matrix 401A according to the principles of this invention.

FIGS. 29A through 29D are an alternative representation of the input lines and output lines of the programmable multiplexers in switch matrix 401B according to this invention.

FIGS. 30A through 30D illustrate another embodiment of the programmable multiplexers in the switch matrix of this invention.

Figure 1:
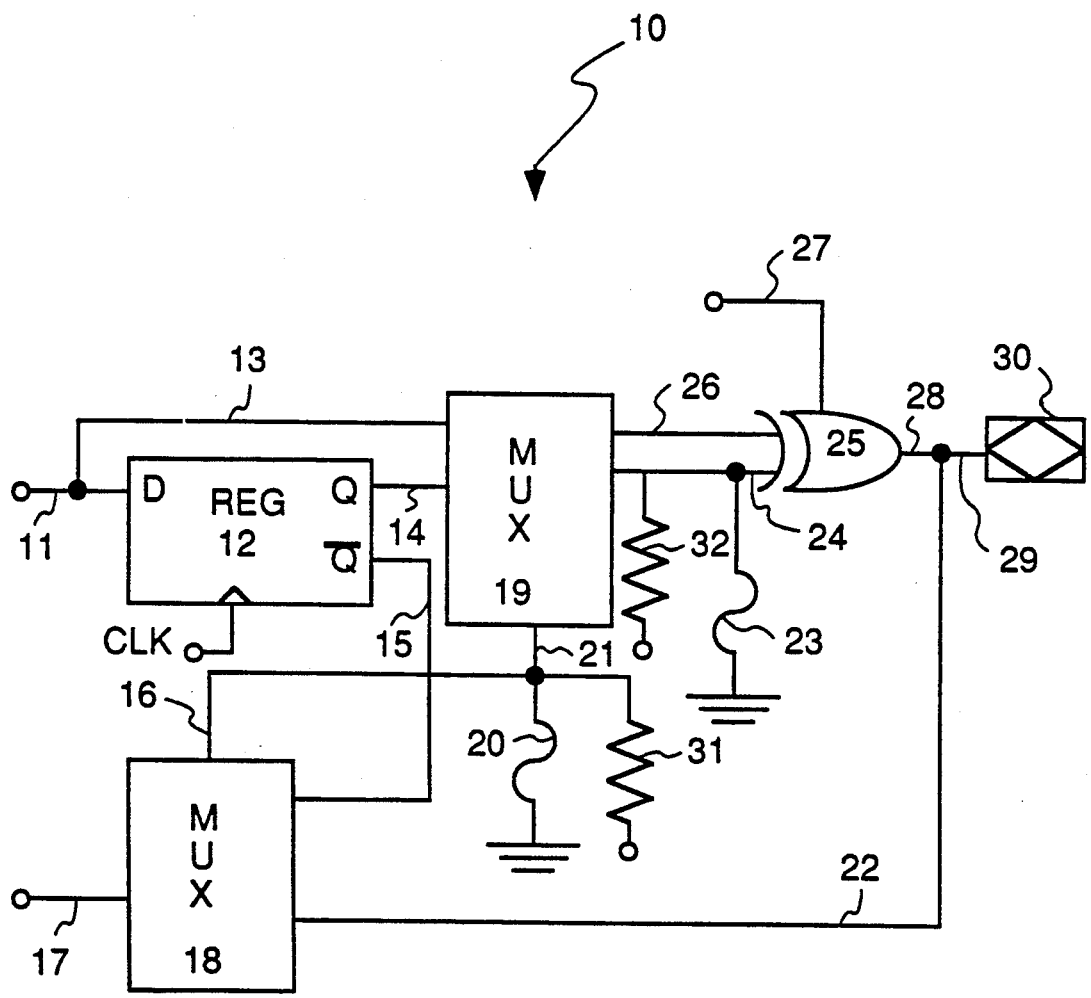
FIG. 1 is a block diagram of a prior art input/output macrocell for use with a PLA or a PAL circuit.

In the drawings, similar items have the same number. Further, a number may represent several similar devices. For example, the base number 140 represents a group of macrocells of this invention. The number 140A represents a specific set of macrocells within the group of macrocells 140 and the number 140A$_0$ or 140A0 represents a specific macrocell in the set of macrocells 140A. The same component in different parts of the invention has the same base number, a dash, and then a number that differentiates the parts. Accordingly, a base number is a shorthand notation representing several similar devices, lines, components or other related objects.

DETAILED DESCRIPTION

Figure 5:
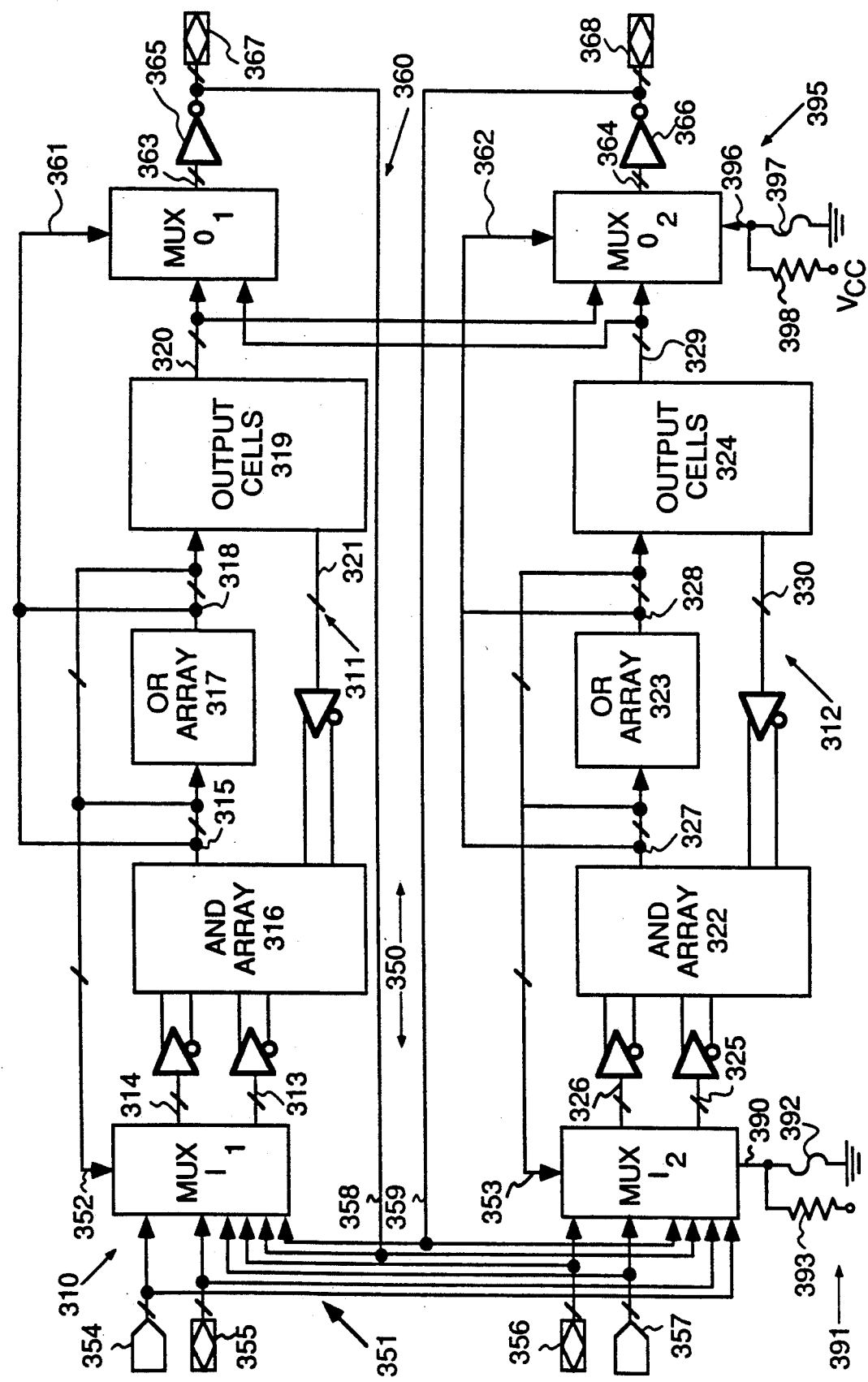
FIG. 5 is a schematic diagram of an integrated circuit according to one embodiment of the present invention.

FIG. 5 shows a diagram of the architecture of a multiple array programmable logic device 310 according to the present invention. The device 310 includes a first programmable array means 311 for receiving a plurality of first input terms (signals) and generating a plurality of first output terms (signals) and a second programmable array means 312 for receiving a plurality of second input terms and generating a plurality of second output terms.

First programmable array means 311 includes an AND array 316 that receives the plurality of first input terms across line 313 and preferably one clock input term across line 314 for sequential state machine functions and generates a plurality of first product terms across line 315 in response to the first input terms and the clock terms as programmed by the user. AND array 316 is preferably a field programmable AND array such as those described in the publication entitled *Programmable Array Logic Handbook*, published by Advanced Micro Devices, Inc. (1988), and available through Advanced Micro Devices, Inc., Sunnyvale, Calif. Of course, other embodiments of the AND array including a fixed AND array may be utilized as desired.

In first programmable array means 311, the first product terms on line 315 are supplied to an OR array 317. The OR array 317 generates a plurality of first sum-of-products terms on line 318 in response to the first product terms on line 315. The OR array may be a fixed OR array or a programmable OR array as described in the above-mentioned *Programmable Array Logic Handbook*.

The first sum-of-products terms on line 318 are supplied to a plurality of output cells 319 which generate output logic terms on line 320 for first programmable array means 311. Further, output cells 319 may generate feedback terms on line 321 which are fed back to the AND array 316 and utilized in the generation of the first product terms 315 as programmed by the user.

Second programmable array means 312 consists of components similar to first programmable array means 311. Thus, second programmable array means 312 includes AND array 322, which may be either fixed or programmable, and OR array 323, either fixed or programmable, and a plurality of output cells 324. Second programmable array means 312 receives as input a plurality of second input terms on line 325 and preferably one clock input term on line 326 for sequential state machine functions. The output signal of AND array 322 of second programmable array means 312 includes a plurality of second product terms 327. The output signal of OR array 323 includes a plurality of second sum-of-products terms on line 328. The plurality of second sum-of-products terms is passed through the output cells 324 and supplied as a plurality of second output terms on line 329. The output cells 324 may generate feedback terms across line 330 for supply back to AND array 322 for use in generation of the second product terms on line 327 as programmed by the user.

It should be appreciated that first programmable array means 311 and second programmable array means 312 may preferably be individually configured to include a programmable AND array with a fixed OR array, a fixed AND array with a programmable OR array, a programmable AND array with a programmable OR array or other programmable array configuration generating sum-of-products terms to facilitate conventional sum-of-products logic design.

Output cells 319 and output cells 324 for first and second programmable arrays means 311, 312, respectively, consist preferably of output cells such as those disclosed in the prior U.S. patent application entitled DYNAMICALLY CONTROLLABLE OUTPUT LOGIC CIRCUIT, Ser. No. 656,109, filed Sept. 28, 1984, or any of the output configurations disclosed in the *Programmable Array Logic Handbook* referred to above.

Device 310 includes a means 350 for selectively interconnecting at least subsets of the plurality of first input terms from lines 313, 314, the plurality of first output terms from lines 320, the plurality of second input terms from lines 325, 326 and the plurality of second output terms from lines 329. Means 350 for selectively interconnecting allows device 310 to be configured so that first programmable array means 311 is connected in series with second programmable array means 312, or first programmable array means 311 is connected in parallel with second programmable array means 312 or any combination of interconnections. A particular embodiment may interconnect subsets of the input and output terms, so that all or any portion of the plurality of first input terms, plurality of first output terms, plurality of second input terms, and plurality of second output terms may be routed as desired to provide the flexibility desired by a manufacturer.

In the embodiment shown in FIG. 5, means 350 for selectively interconnecting includes an input multiplexing means 351 (MUX $I_1$, MUX $I_2$), responsive to an input select signal on lines 352, 353, for selecting and supplying a set of signals as the plurality of first input terms or as the plurality of second input terms, from a plurality of signals. Input multiplexing means 351 (FIG. 5) selects from the plurality of signals including a first set of clock signals supplied from input pins 354, a first set of input signals externally supplied to the chip from a first set of input/output pins 355, a second set of input signals supplied from a second set of input/output pins 356 (these I/O pins are typically driven by an output signal from another device (not shown) which is similar to device 310), a second set of clock signals supplied from input pins 357, and a set of output signals, generated in response to at least a subset of the plurality of first output terms from line 320 and the plurality of second output terms from lines 329, supplied across lines 358 and 359 respectively.

The input select signal on lines 352 and 353 in the preferred embodiment is supplied as at least a subset of the first and second product terms from lines 315 and 327, respectively, or at least a subset of the first and second sum-of-products terms from lines 318 and 328, respectively, or any combination of the product terms and sum-of-products terms generated by first programmable array means 311 and second programmable array means 312.

Also, as shown in FIG. 5, the input select signal may be field programmable. Thus, FIG. 5 shows an input select signal supplied on line 390 to input multiplexer MUX $I_2$ from a fuse programmable signal generator 391. The fuse programmable signal generator 391 includes a fuse 392 connected from line 390 to ground and a resistor 393 connected from line 390 to a power supply voltage $V_{CC}$. Fuse 392 is a field programmable fuse such as those described in the *Programmable Array Logic Handbook*, referred to above.

Input multiplexing means 351 in the preferred embodiment consists of a first input multiplexer MUX $I_1$, responsive to the input select signal on lines 352, for selecting a set of signals for supply as input signals on lines 313, 314, and a second input multiplexer MUX $I_2$, responsive to the input select signal on lines 353 or 390, for selecting a set of signals for supply as input term signals on lines 325, 326. In the embodiment shown, both first input multiplexer MUX $I_1$ and second input multiplexer MUX $I_2$ are supplied the same sets of signals from pins 354, 355, 356 and 357 for selection and supplying as input terms. The first input multiplexer MUX $I_1$ supplies the plurality of first input terms on lines 313, 314. The second input multiplexer MUX $I_2$ supplies the plurality of second input terms on lines 325, 326.

Means 350 for selectively interconnecting also includes an output multiplexing means 360, responsive to an output select signal on lines 361, 362, for selecting and supplying as output signals on lines 363 and 364, respectively, a set of signals selected from the plurality of signals selected from at least a subset of the plurality of first output terms from lines 320 and the plurality of second output terms from lines 329. The output signals on lines 363, 364 are supplied from integrated circuit device 310 externally through output drivers 365, 366 to sets of I/O pins 367, 368.

The output select signals on lines 361 and 362 can be generated from the first set of product terms on lines 315, second set of product terms on lines 327, first set of sum-of-products terms on lines 318, second set of sum-of-products terms on lines 328 or any combination of product terms and sum-of-product terms as suits the user.

Also, as shown in FIG. 5, the output select signal may be fuse programmable. Thus, FIG. 5 shows a fuse programmable signal generator 395 supplying an output select signal on line 396. The fuse programmable signal generator 395 includes a fuse 397 connected from line 396 to ground and a resistor 398 connected from line 396 to power supply voltage $V_{CC}$. Fuse 396 is programmable as described in the above mentioned *Programmable Array Logic Handbook*.

The output multiplexing means 360 in the embodiment shown in FIG. 5 consists of a first output multiplexer MUX $O_1$ and a second output multiplexer MUX $O_2$. First output multiplexer MUX $O_1$, responsive to the output select signal on lines 361, selects a set of signals for supply as output signals on lines 363, while the second output multiplexer MUX $O_2$, responsive to the output select signal on lines 362 or 396, selects a set of signals for supply as output signals on lines 364.

The diagram of FIG. 5 shows four sets of I/O pins, designated 355, 356, 367 and 368. Each of these sets of I/O number of output signals generated on lines 363 and 364 and the number of input signals supplied from the I/O pins 355, 356 as desired. It should be noted, that the four sets of I/O pins, 355, 356, 367 and 368, are not necessarily exclusive. For instance, the set of I/O pins 367 receiving output signals across line 363 from the output multiplexer MUX $O_1$ is also connected to provide input signals to the input multiplexers MUX $I_1$ and MUX $I_2$ across line 358. Thus, an architecture for a device 310 according to the present invention may be laid out in which all or any subset of the I/O pins are configured to receive output signals and/or supply input signals.

Furthermore, in the preferred embodiment, the set of clock input pins 354 and the set of clock input pins 357 may include any number of clock inputs.

In one preferred embodiment, there are two clock input pins in the first set of clock input pins 354, two clock input pins in the second set of clock input pins 357, and forty I/O pins configured to provide sets of I/O pins such as those designated 355, 356, 367 and 368.

Thus it can be seen that device 310 provides total interconnectivity of the available signals and logic terms as input terms or as output terms. This allows the user the ability to configure the device 310 such that the first programmable array means 311 operates in series with the second programmable array means 312, such as by providing the output signals from line 363 as one of the sets of signals across line 358 that is selectable by the second input multiplexer MUX $I_2$ as at least a subset of the plurality of second input terms on line 325, 326. Of course, the second programmable array means 312 may be connected in the same manner with respect to the first programmable array means 311. Alternatively, the first programmable array means 311 and the second programmable array means 312 may be connected in parallel such that each receives the same input signals as input terms on lines 313, 314 and 325, 326, respectively, such as the input signals supplied by the set of input pins 356, and each generates a plurality of output terms across lines 320 and 329, respectively, that are selectively supplied to a set of I/O pins 367, 368.

Figure 2A:
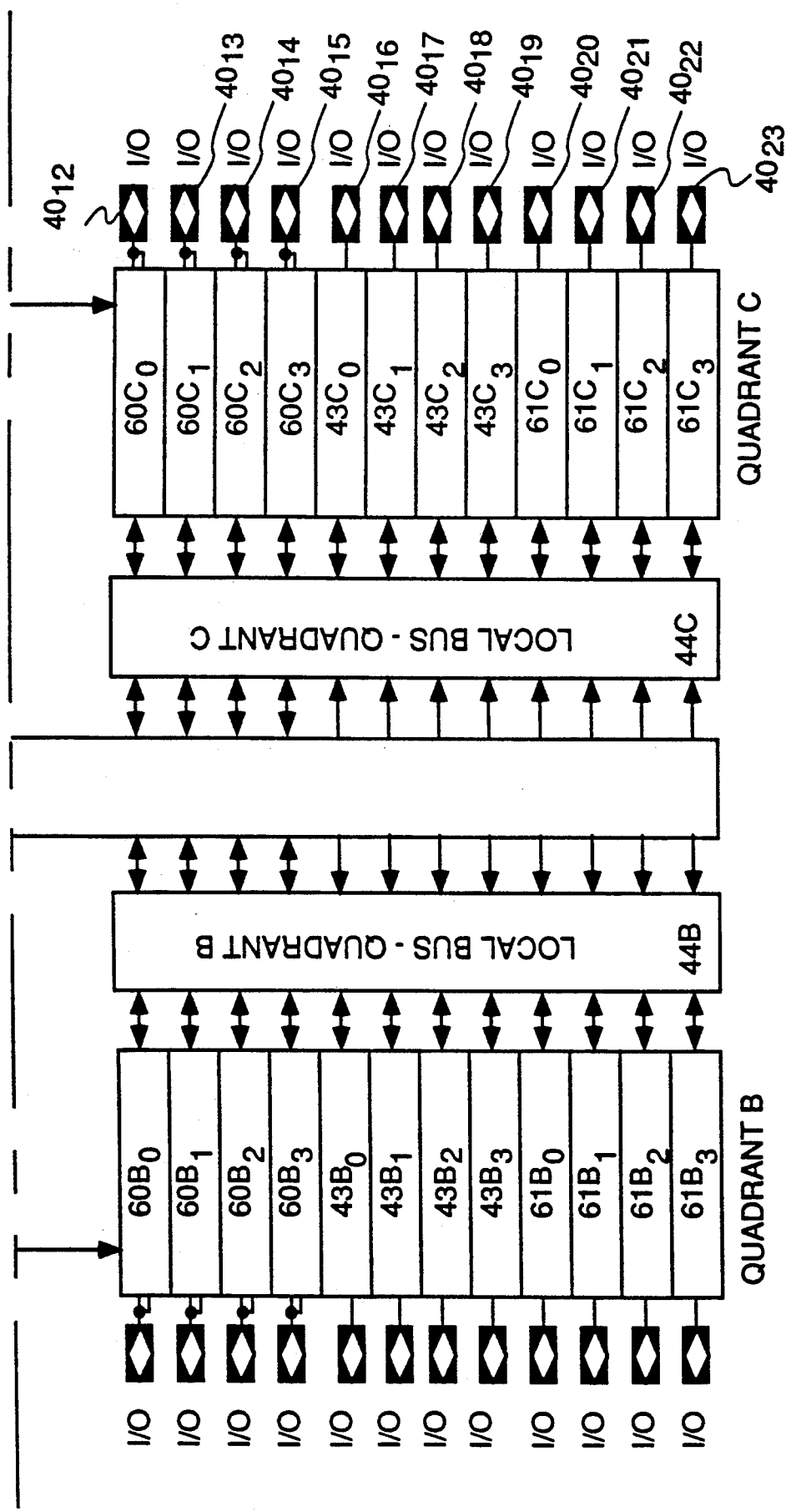
FIGS. 2A, 2B and 2C illustrate a prior art erasable programmable logic device.
Figure 2B:
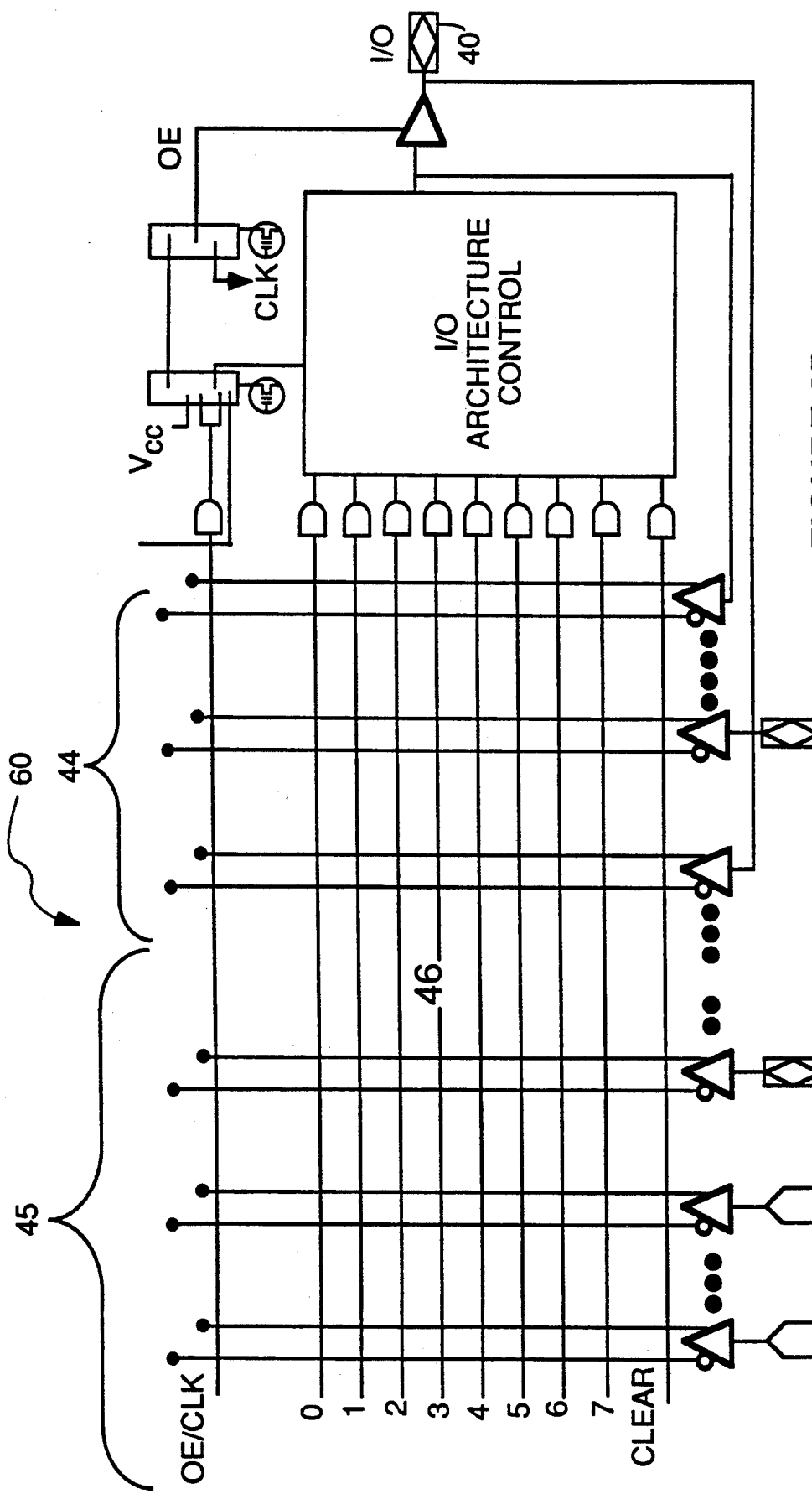
Figure 2C:
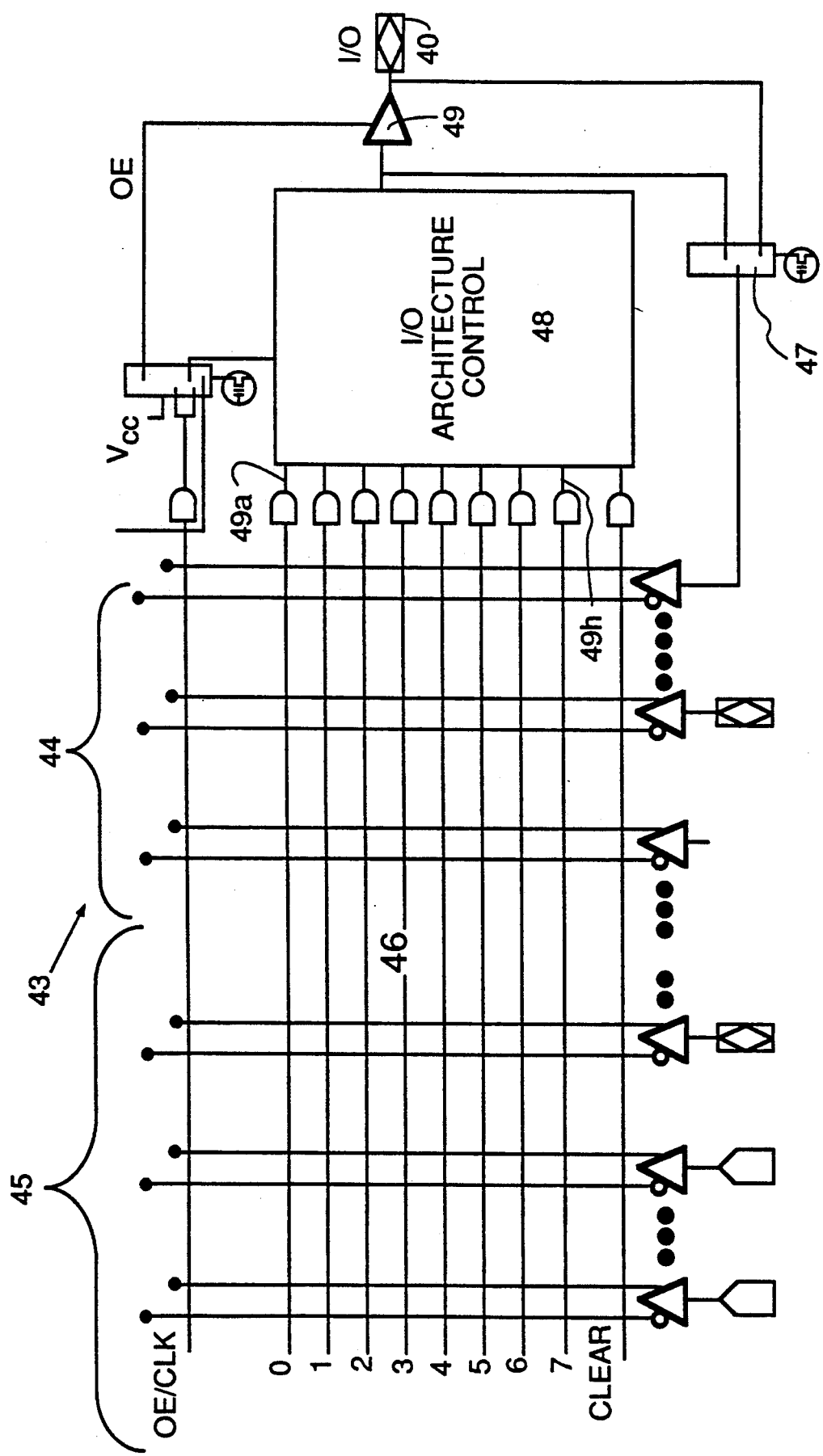
Figure 3A:
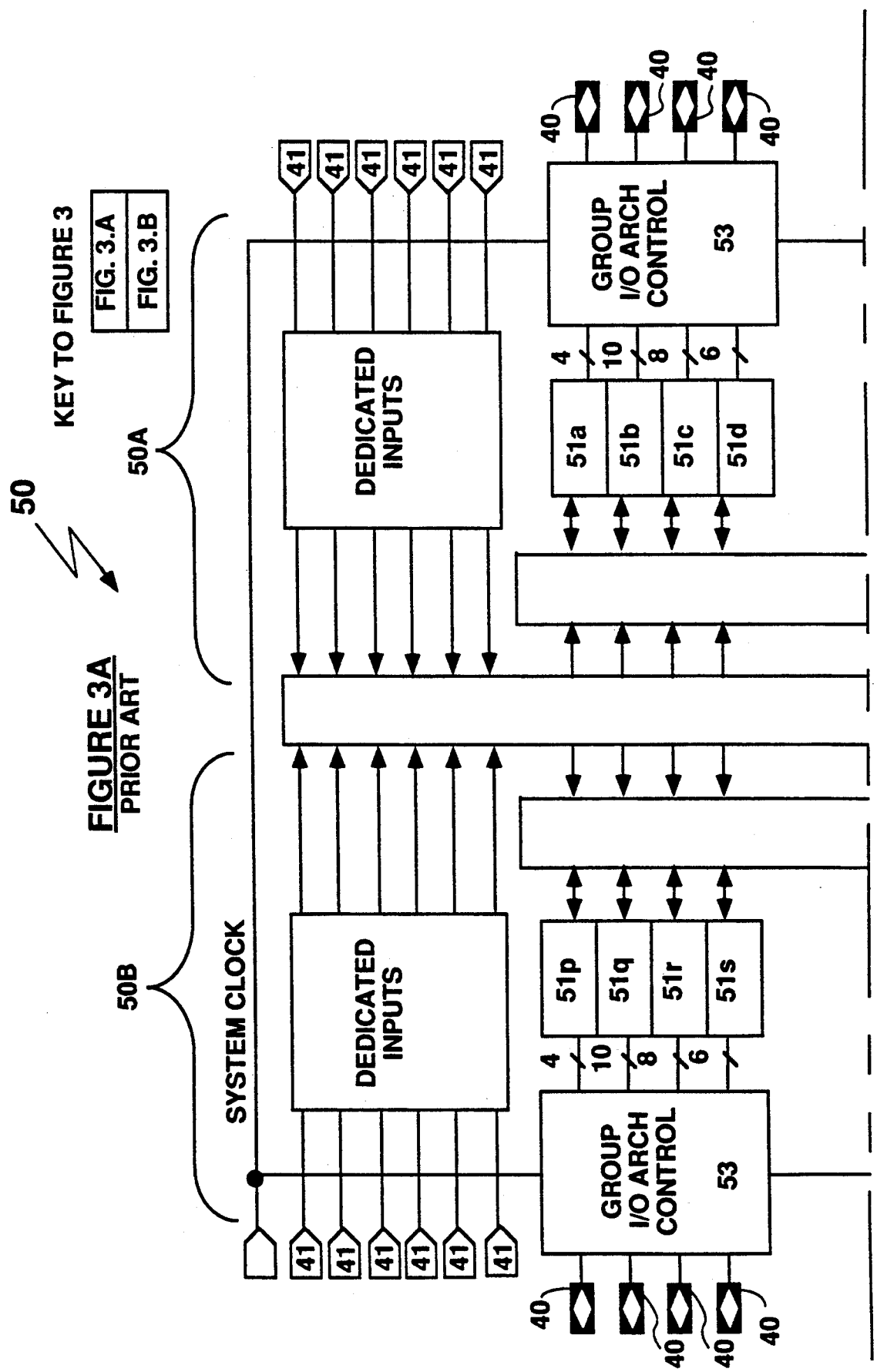
FIGS. 3A and 3B are block diagrams of another prior art erasable programmable logic device.
Figure 3B:
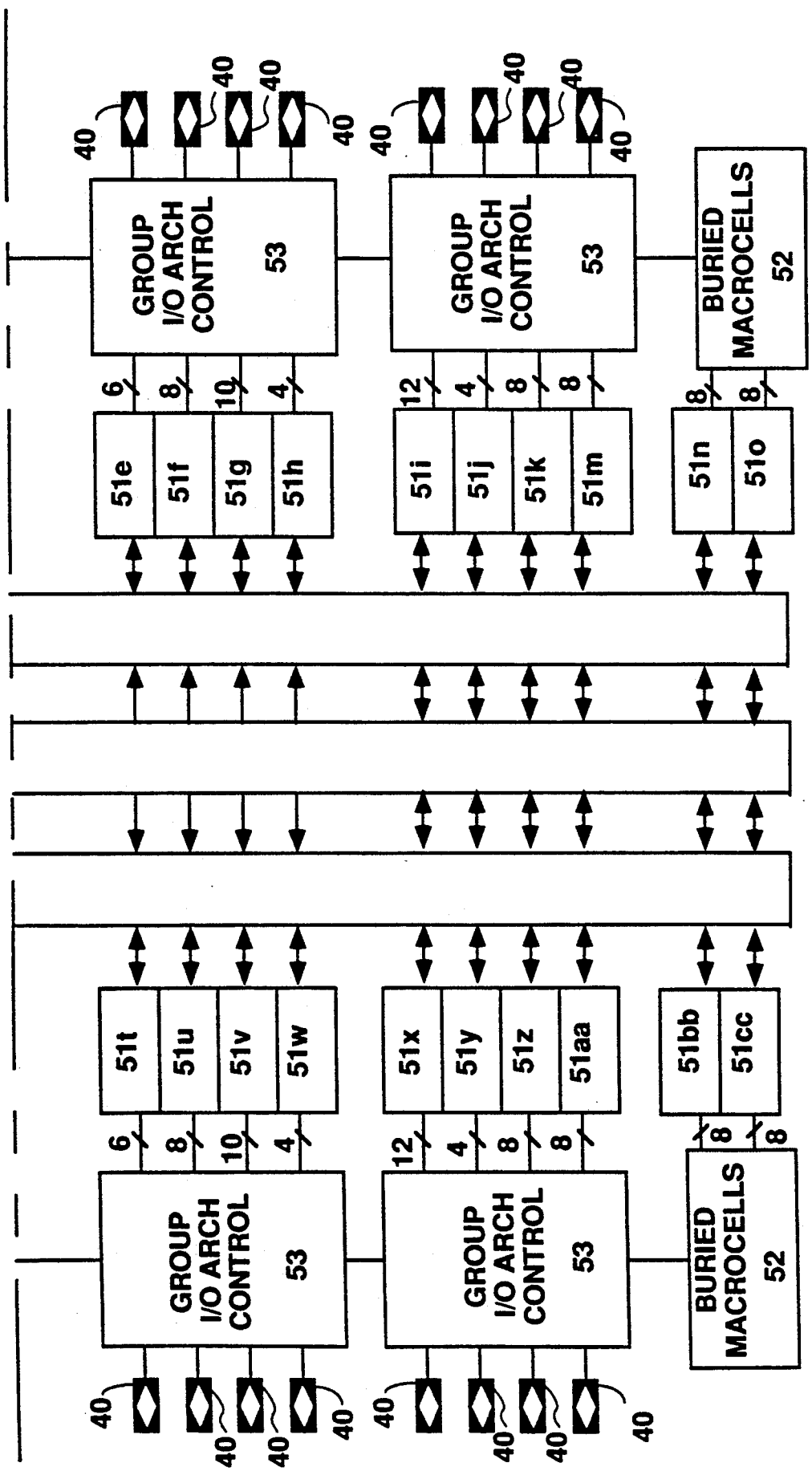
Figure 4A:
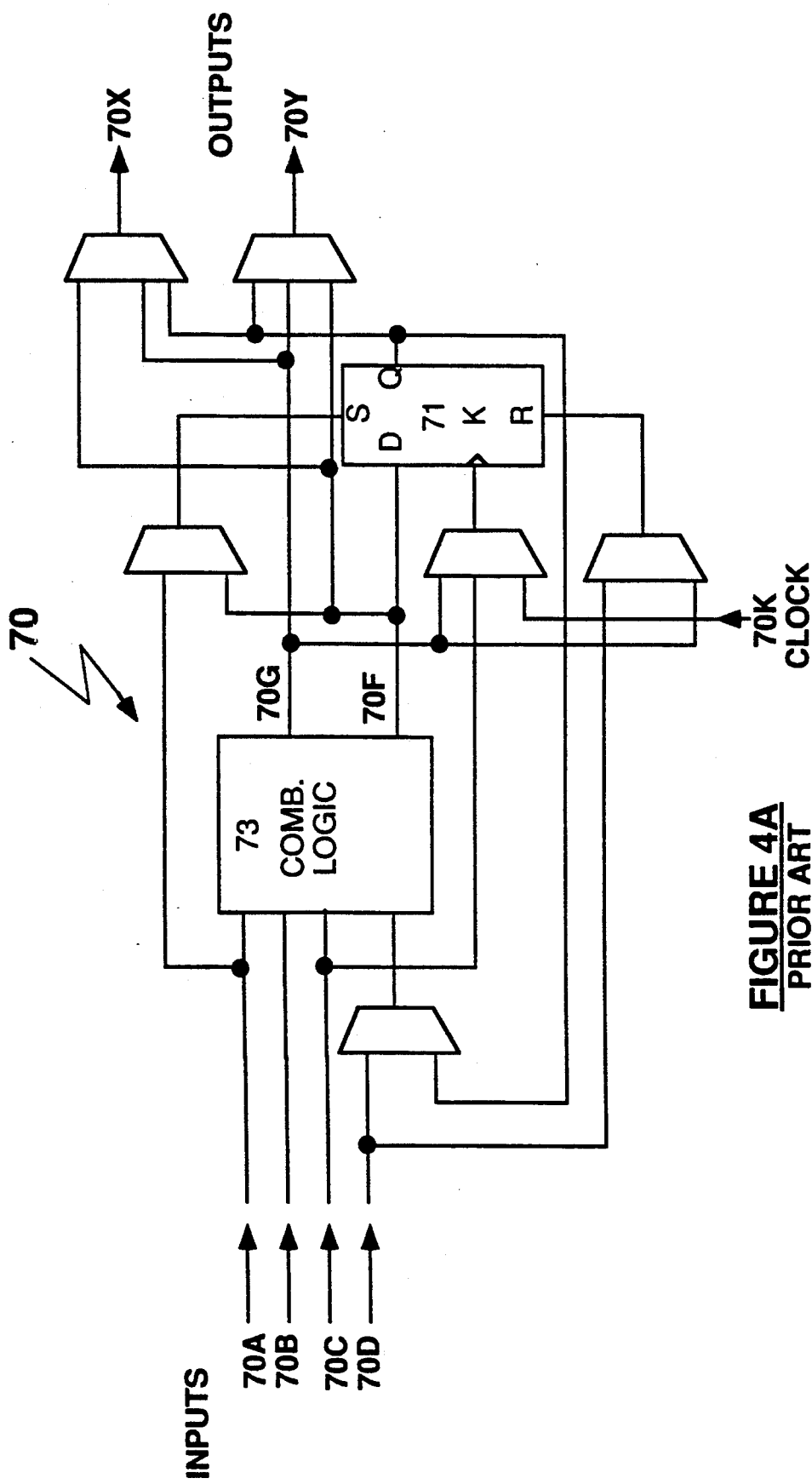
FIGS. 4A and 4B are block diagrams a prior art configurable logic block and a prior art switch matrix.
Figure 4B:
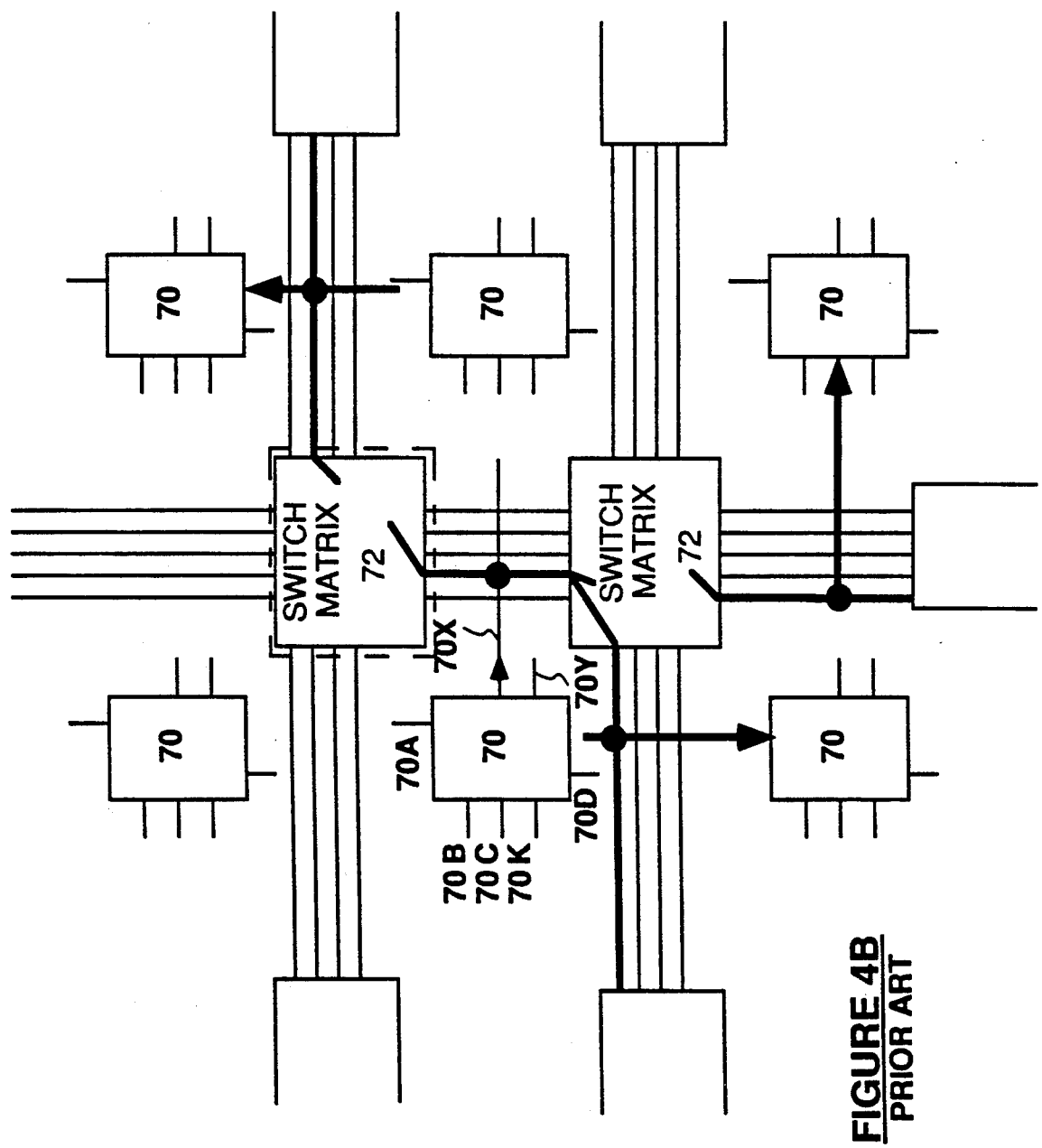

A wide variety of other interconnection architectures can be made utilizing the means 350 for selectively interconnecting according to the present invention. For instance, a subset of the output signals from lines 363 might be supplied as a part of the set of input signals selectable by second input multiplexer MUX $I_2$ across line 358. Thus, a portion of the logic terms generated by second programmable logic array means 312 would be generated in response to a series connection of first programmable logic array means 311 and second programmable logic array means 312 while others of the logic terms generated by a second programmable array means 312 would be generated in parallel with or independently from logic terms generated by first programmable array means 311. In this embodiment, for instance the I/O pins 367 receiving output terms from the first programmable array means 311 might include a fewer number of pins than I/O pins 368 supplying output signals from the second programmable array means 312. As can be seen, flexibility of the present invention is extremely valuable An alternate preferred embodiment of a customizable logic device 310 according to the present invention is discussed in the parent U.S. Pat. No. 4,742,252 (FIG. 2 of U.S. Pat. No. 4,742,252) and incorporated herein by reference.

In FIG. 6, an integrated circuit package containing an integrated circuit chip with four programmable logic quadrants (cells) 100A, 100B, 100C, 100D and a programmable switch matrix 101 is conceptually illustrated. Each logic quadrant 100A, 100B, 100C, 100D, contains a programmable logic circuit 106A, 106B, 106C, 106D and means for coupling 105A, 105B, $105C_1$, $105C_2$, $105D_1$, $105D_2$ each logic circuit to the integrated circuit package pins. Hence, in this embodiment, as in FIG. 5, a means for coupling input signals and feedback signals, programmable switch matrix 101 (FIG. 6), with multiple programmable logic circuits is provided.

Specifically, a first selected group of integrated circuit package pins 102a are dedicated input pins 102 that are coupled by a first coupling means 111 to switch matrix 101. Coupling means 111 has programmable combinatorial and registered/latched (registered) circuit paths from input pins 102a to switch matrix 101. A second selected group of the package pins 103a, 103b, 103c are bidirectional I/O pins 103, which are coupled to four programmable logic circuits 106A, 106B, 106C, 106D by second coupling means 105A, 105B, $105C_1$, $105C_2$, $105D_1$, $105D_2$ (105). Each of the second coupling means is programmable such that I/O pin 103 either provides an input signal to a logic quadrant or receives an output signal from a logic quadrant.

Each second coupling means 105 has programmable circuitry such that either a combinatorial input path or a registered/latched input path can be established between a package pin and a logic quadrant. The combinatorial input path passes the input signal to the input line of a logic quadrant, while the registered/latched input path passes the input signal to the input terminal of a programmable storage element, and the programmable storage element, subsequently passes a signal to the input line of a logic quadrant. Similarly, each coupling means 105 includes programmable circuitry so that selected output lines from a logic circuit are coupled to an I/O pin by either a combinatorial output path or a registered/latched output path. A third group of the integrated circuit package pins 104a, 104b are global clock input pins. The global clock input pins provide synchronous clock signals to coupling means 105, 111.

Each of the four logic circuits 106A, 106B, 106C, 106D may be a PLA circuit, a PAL circuit, a NAND.-NAND circuit, or a NOR.NOR circuit for example. In one embodiment, circuits 106A, 106B, 106C, 106D are programmable AND/OR logic array based PAL circuits. Each programmable AND/OR array based circuit provides 3,200 (80×40) programmable $E^2$ cells for logic flexibility. Each quadrant has twenty input lines which drive eighty product terms. Seventy-six of the product terms are used for logic functions and the other four are used for control functions, as described more completely below. This segmented structure retains the benefits of a traditional PAL such as the wide input decoding, multiplexing and demultiplexing capability, without increasing the array proportionally to the number of input lines. Further, the array size and the coupling means have been selected so that the programmable logic device of this invention achieves an optimum balance of functionality, silicon die size, and performance.

The segmented structure and performance of the programmable logic device of this invention is further enhanced by a switch matrix 101. Switch matrix 101 is connected to each of the logic circuits 106A, 106B, 106C, and 106D and is coupled by means 111 to dedicated input pins 102a. Switch matrix 101, described more completely below, provides a high speed programmable means for selectively transferring signals between logic circuits 106A-106D for selectively providing input signals to logic circuits 106A-106D, and for selectively feeding signals back to a logic circuit. Hence, switch matrix 101 (FIG. 6) performs a function similar to input multiplexers $I_1$, $I_2$ (FIG. 5). Effectively, the programmable logic device of this invention is an array of four programmable logic devices interconnected by switch matrix 101.

This embodiment of the invention permits a worst case input-to-output signal propagation delay time of 25 nanoseconds and permits a maximum external clock frequency of 33 MHz.

Figure 7A:
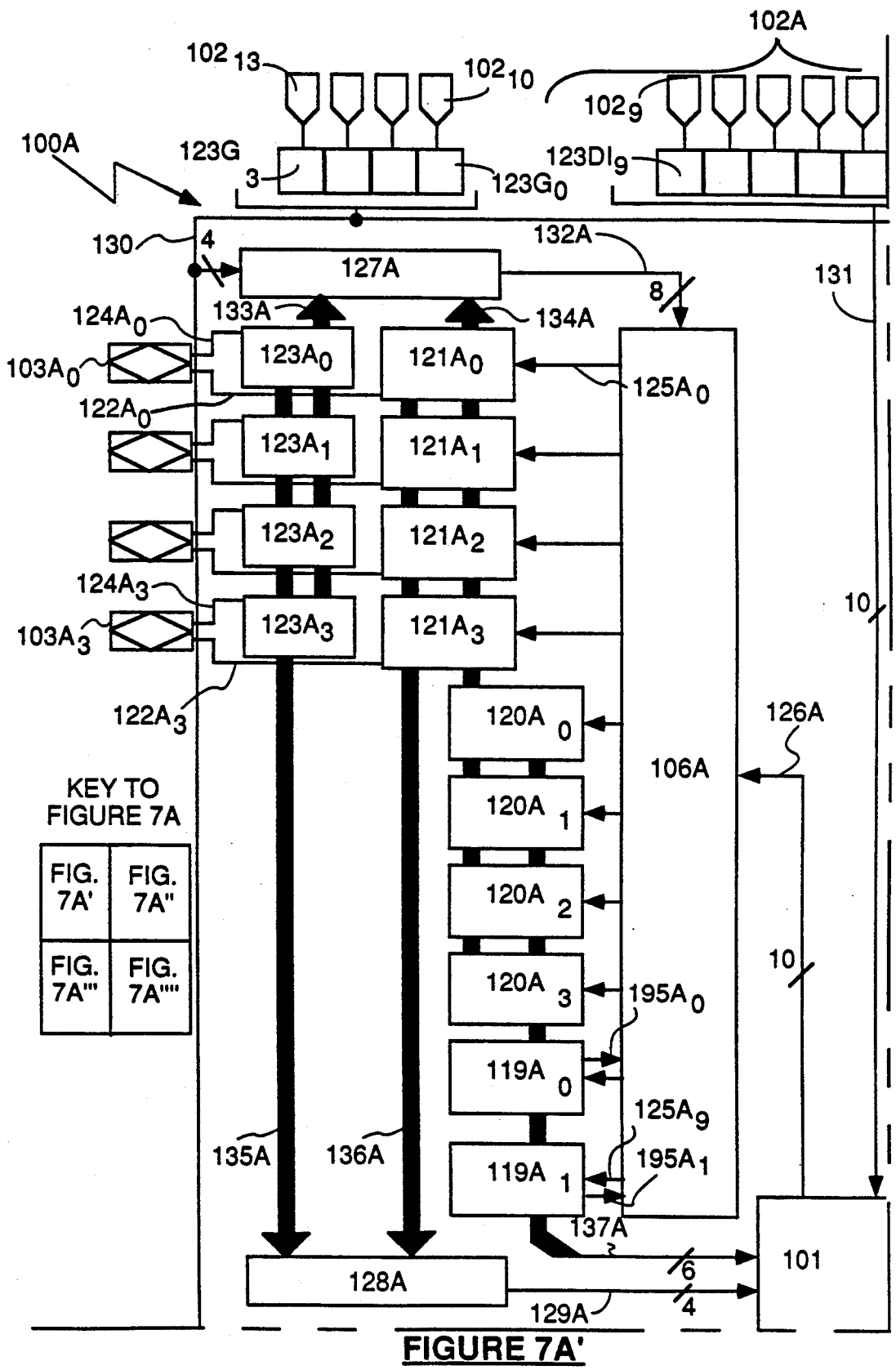
FIGS. 7A and 7B are schematic block diagrams of two embodiments of a programmable logic device according to the principles of this invention.
Figure 7A:
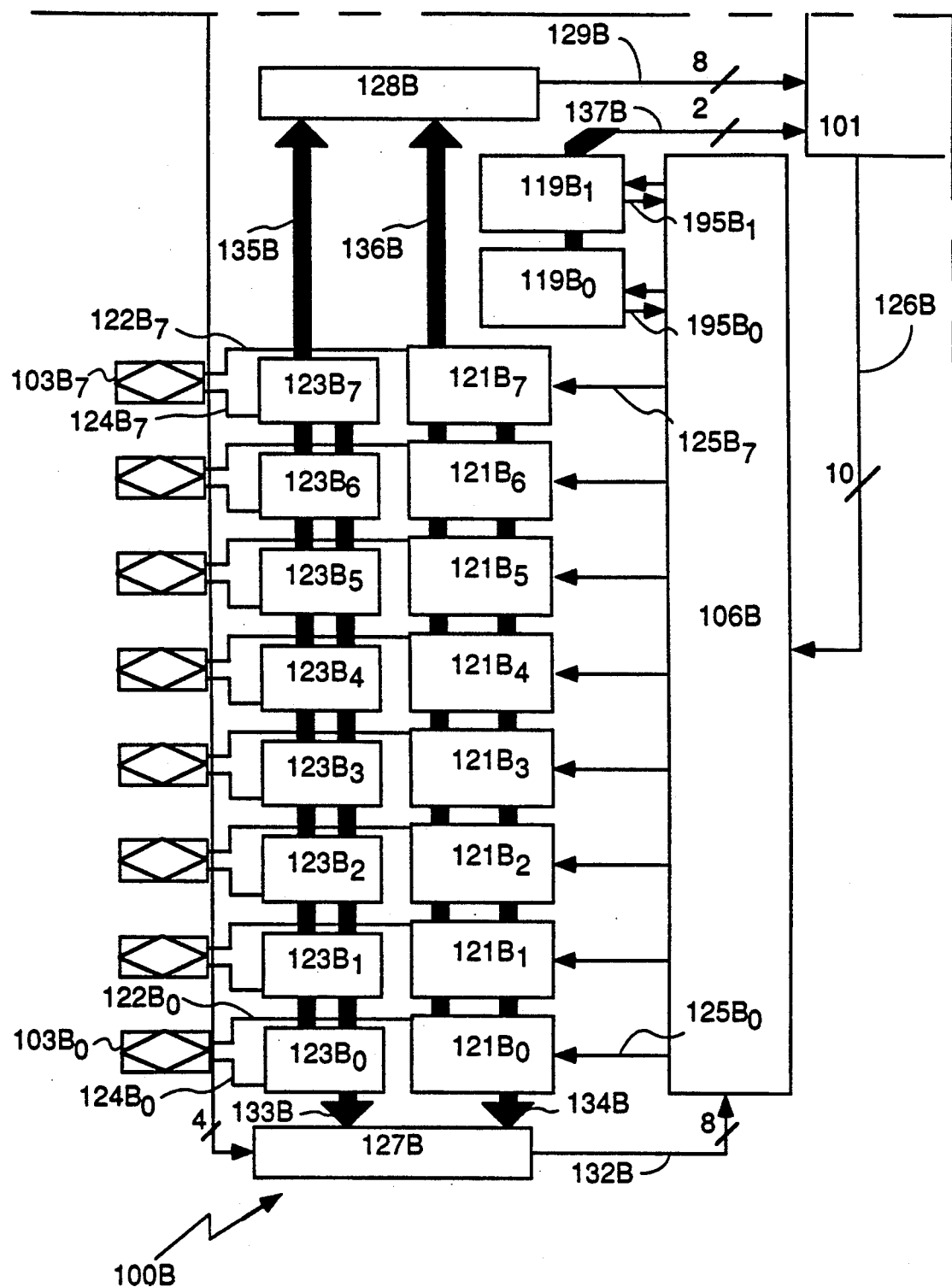
Figure 7B:
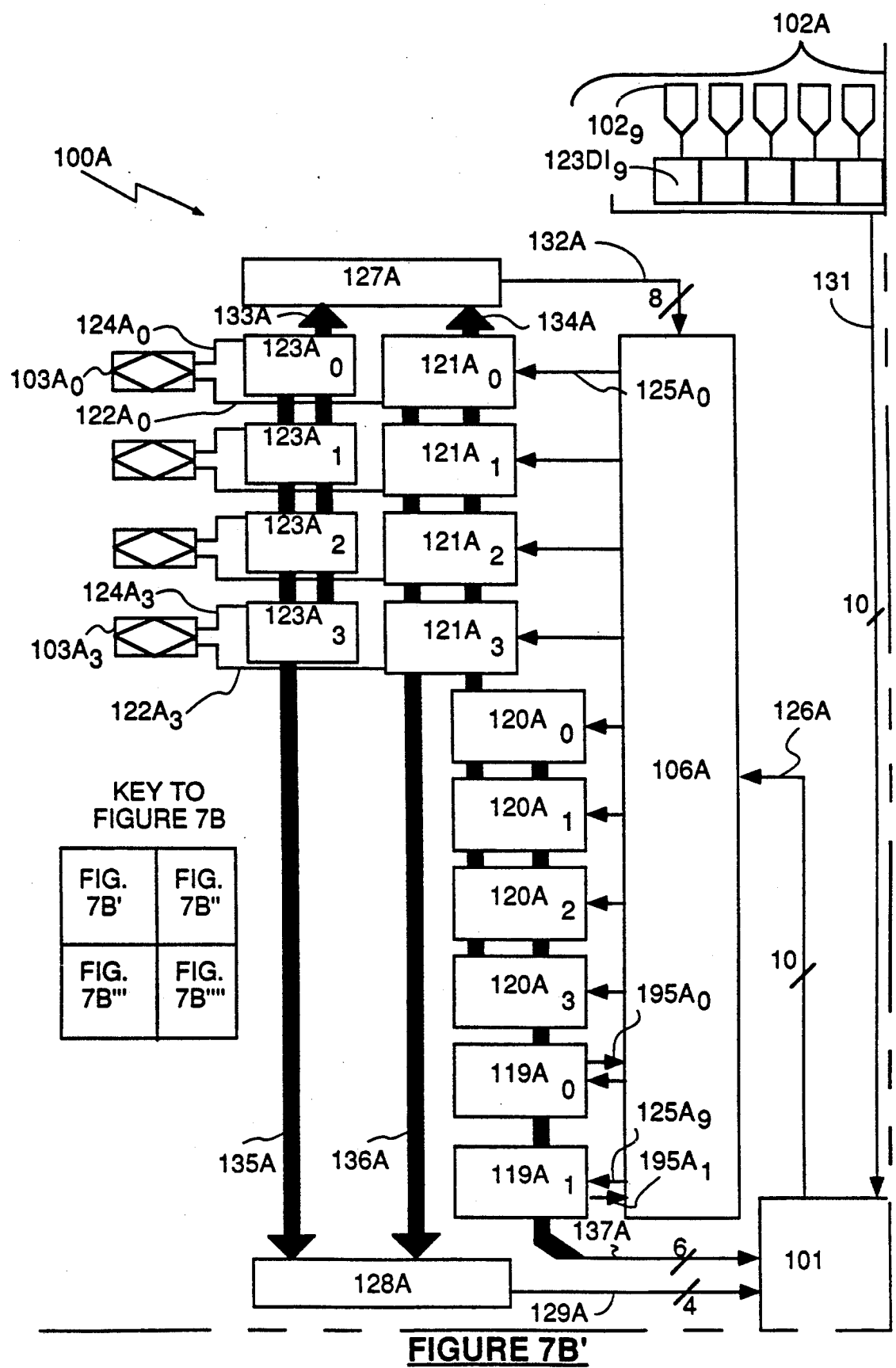
Figure 7B:
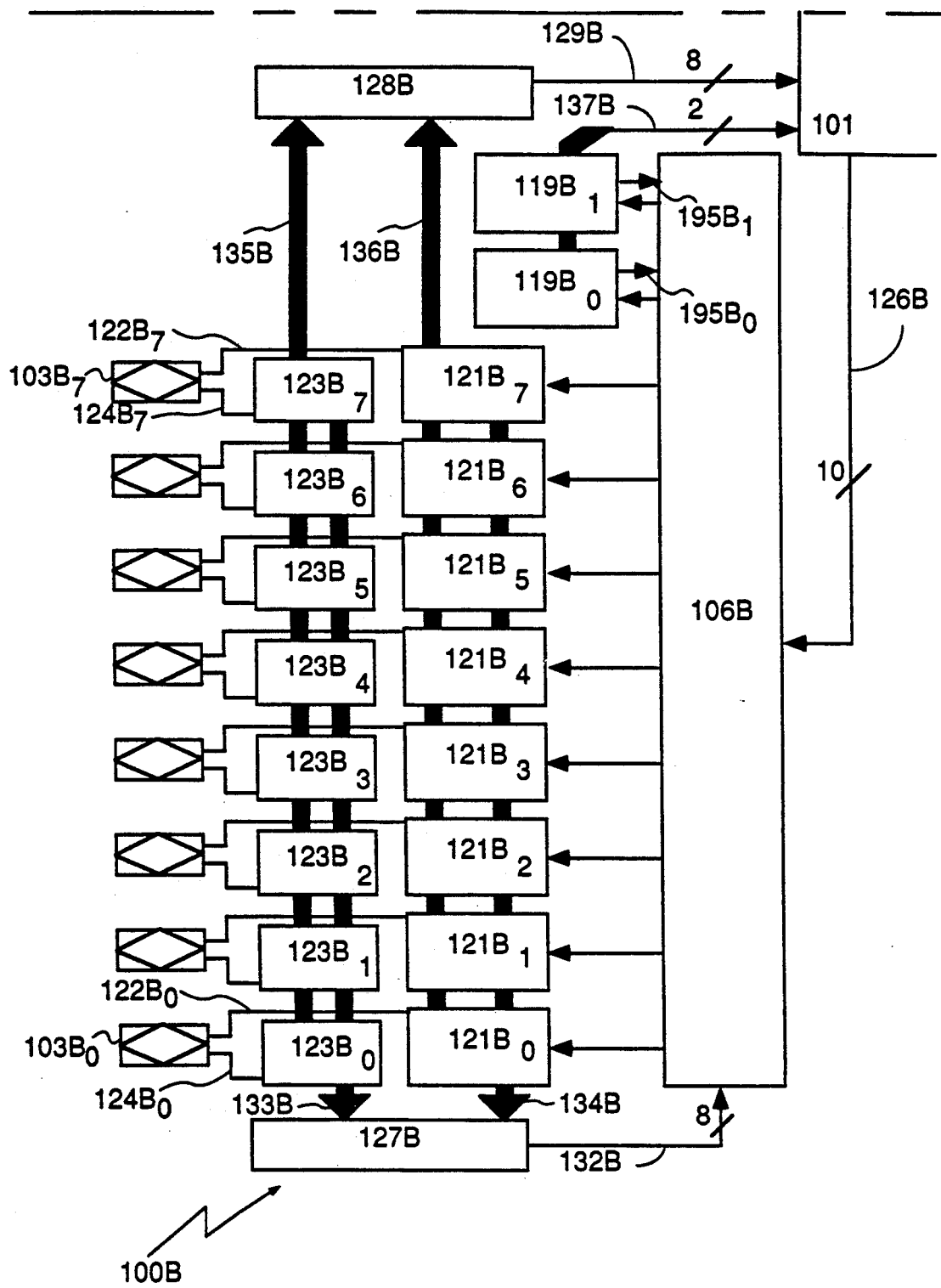
Figure 8A:
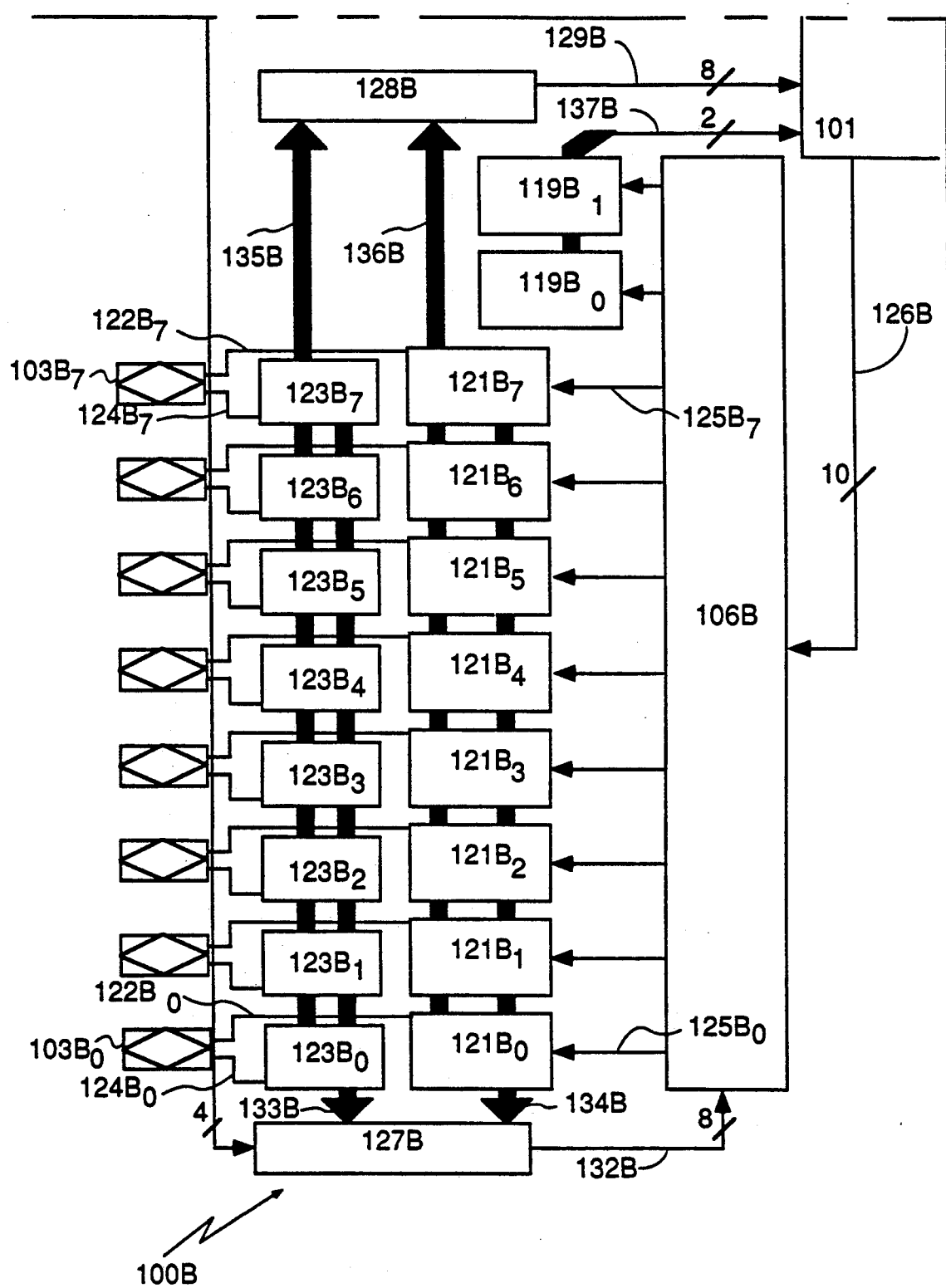
FIGS. 8A and 8B are schematic block diagrams of two other embodiments of a programmable logic device according to the principles of this invention.
Figure 8B:
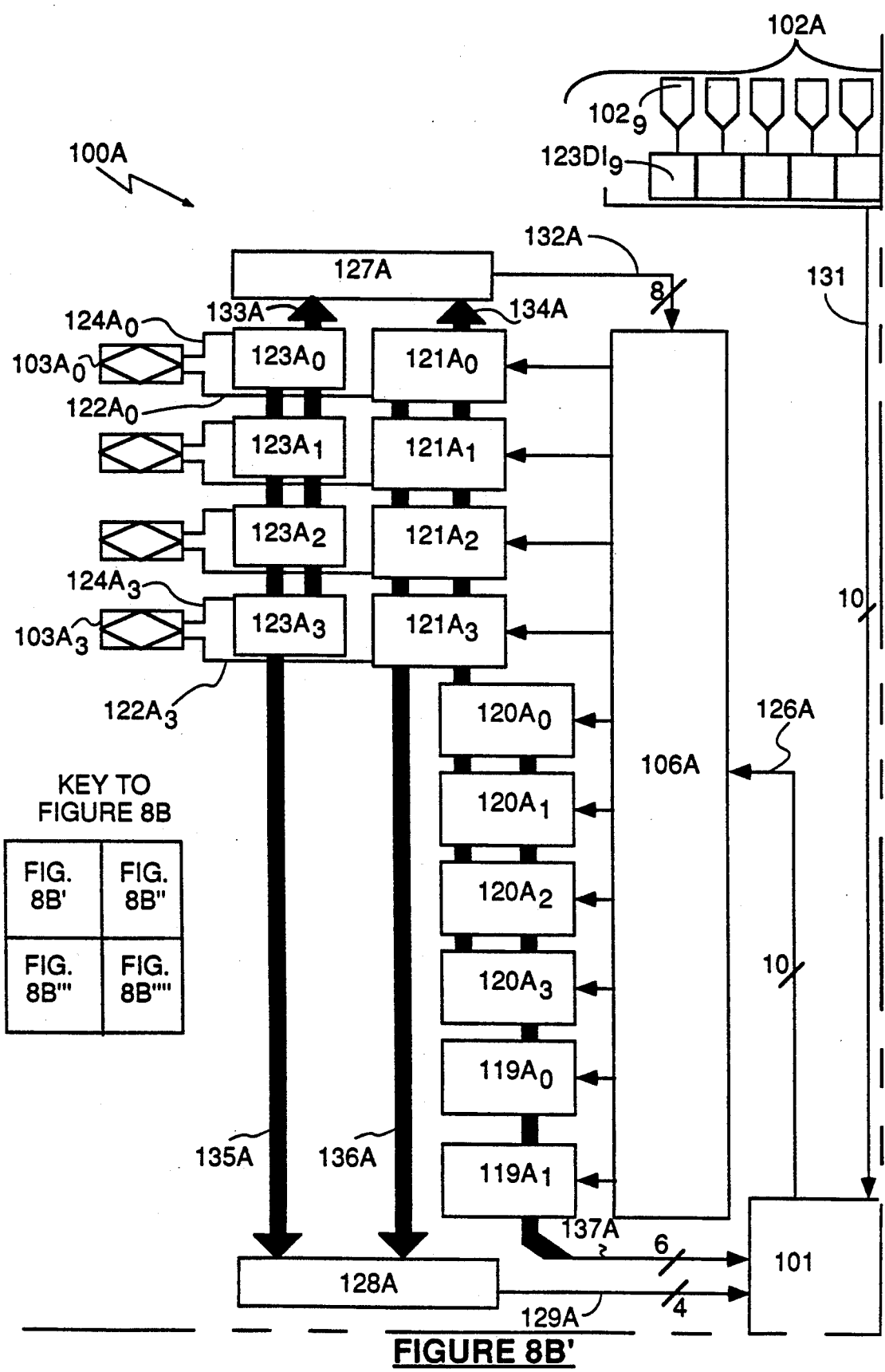

Two embodiments of the present invention are shown in FIGS. 7A and 7B. In these embodiments, quadrant 100A and quadrant 100C are identical, and quadrant 100B and quadrant, 100D are identical. The architecture shown in FIG. 7B is identical to that in FIG. 7A except the four global input pins 102 and the related circuitry are not provided. The block diagrams shown in FIGS. 7A and 7B are illustrative only and are not intended to limit the scope of the invention. In view of the principles disclosed herein, other configurations of the input macrocells, output macrocells, switch matrix input cells, and logic circuits will be apparent to one skilled in the art. For example, FIGS. 8A and 8B illustrate an architecture similar to the architecture of FIGS. 7A and 7B, respectively. In FIGS. 8A and 8B, the total number and type of macrocells in each quadrant is the same as that described above except each quadrant contains two buried macrocells 119 which are not coupled directly to the logic circuit in the quadrant, i.e., the lines 195 in FIGS. 7A and 7B are eliminated. Accordingly, the logic circuit in each quadrant has only eighteen input lines, eight from feedback cells 127 and ten from switch matrix 101 instead of the twenty input lines illustrated in FIGS. 7A and 7B.

Figure 8B:
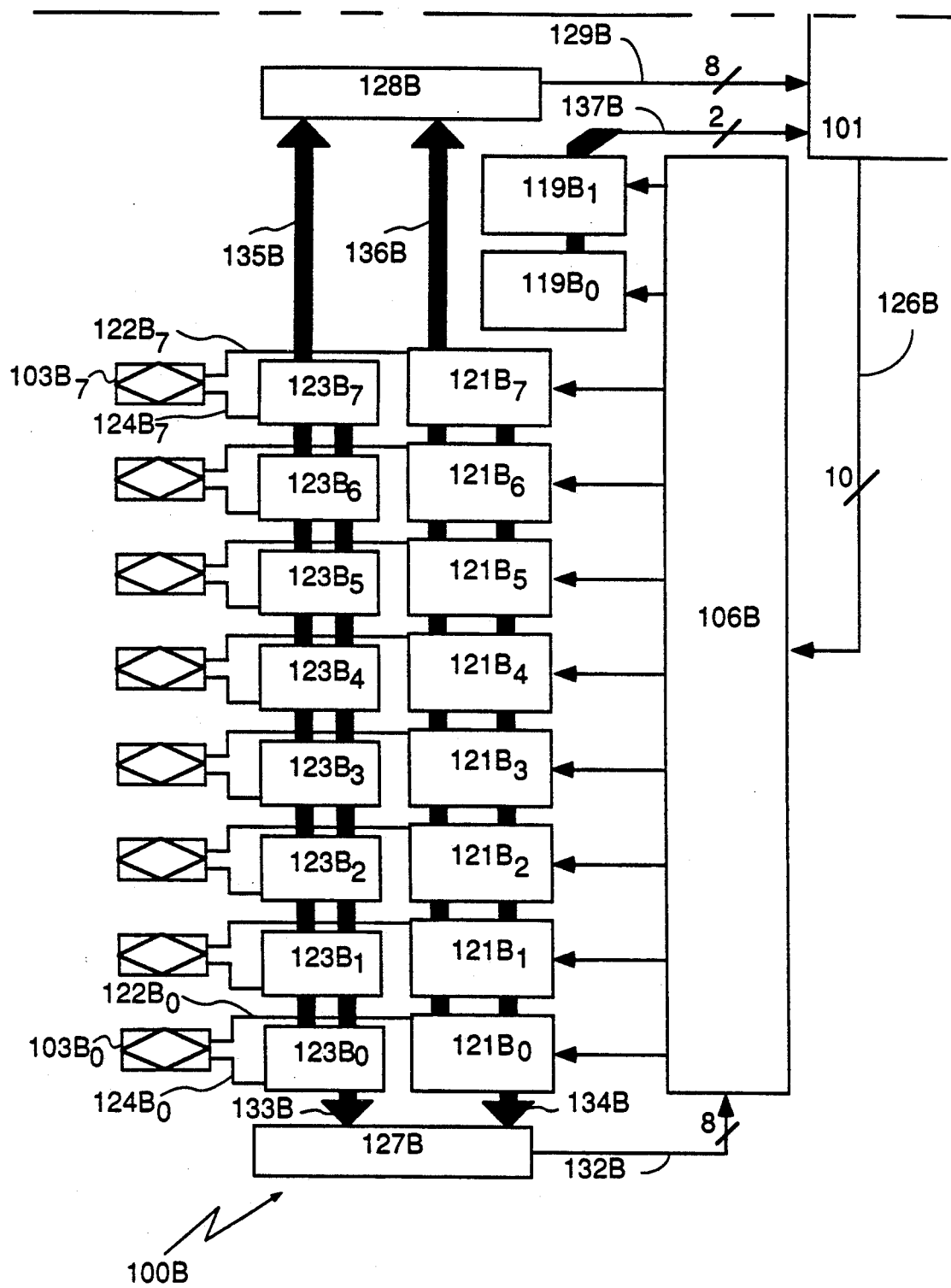

In a preferred embodiment, the integrated circuit, as shown in FIGS. 7 and 8, is a high density, electrically erasable ($E^2$) reprogrammable PLD utilizing 1.5 micron CMOS double metal $E^2$ PROM technology for high performance and logic configurability. Alternatively, the integrated circuit of the invention can be implemented using either erasable programmable ROM technology or bipolar fused technology. The structure in FIGS. 7B and 8B is contained in a single forty pin DIP and the structure in FIGS. 7A and 8A in a forty-four pin PLCC package. The forty-four pin PLCC package with the 24 I/O pins, 14 dedicated input pins, and 2 synchronous clock/latch enable pins utilizes a small amount of board space but yet a significant amount of flexibility and high speed performance is provided in the small package.

The diagonal symmetry of the programmable logic device, as illustrated in FIGS. 7A, 7B, 8A and 8B, is an important aspect of this invention. The symmetry simplifies the development of the silicon die by the silicon chip designer and the design of a system using the PLD of this invention by the system designer. Also, without the inherent symmetry, the development of software tools for the PLD is more difficult.

While the invention is described in terms of a programmable AND/OR array, the programmable AND/OR array is implemented in a preferred embodiment as a NOR.NOR array that is functionally equivalent to the programmable AND/OR array described herein. As discussed more completely below, logic circuit 106A may also be a programmable OR array/fixed AND array, a PLA (programmable AND array and a programmable OR array), a NOR.NOR array, or a NAND.NAND array, for example. Accordingly, the use of a programmable AND/OR logic array is illustrative only and is not intended to limit the scope of the invention.

In the previous embodiment, the programmable logic quadrants 100A, 100B, 100C and 100D were diagonally symmetric, i.e. quadrants 100A and 100C were identical and quadrants 100B and 100D were identical, as illustrated above in FIGS. 7A, 7B, 8A and 8B. Each programmable logic quadrant 100A-100D included a programmable array 106, buried cells 120, output cells 121, input cells 123, feedback cells 127, and switch matrix cells 128.

This architecture provides significant flexibility, high speed performance, and better silicon die efficiency than prior art programmable logic device structures. Cell array 100 has a worst case input-to-output signal propagation delay of 25 nanoseconds and permits a maximum external clock frequency of 33 MHz.

While the above embodiment provides significant advantages over prior art devices, further enhancement in silicon die efficiency, speed, and flexibility are achieved by utilizing symmetric programmable logic blocks rather than only diagonally symmetric quadrants as in the above embodiment. In the embodiment described below, the product term flexibility is further enhanced.

In this embodiment, electrically programmable logic device 400 (FIG. 9) includes a plurality of identical programmable logic blocks 402, arranged in an array. Programmable logic blocks 402 are interconnected through programmable switch matrix 401. Programmable logic blocks 402 communicate with each other only through switch matrix 401. Moreover, programmable logic blocks 402 receive all input signals from switch matrix 401. Thus, programmable logic blocks 402 may be viewed as independent programmable logic devices on the same integrated circuit chip.

Each programmable logic block 402 may receive a first plurality of input signals from a plurality of input/output (I/O) pins 403 through switch matrix 401. The input signals, as explained more completely below, are passed through block 402 to switch matrix 401. Dedicated input pins 404 provide a plurality of input signals to switch matrix 401. The input signals processed by any logic block 402 are the signals received on input lines 426 from switch matrix 401. Each programmable logic block 402 may also provide a first plurality of output signals for I/O pins 403.

Each of programmable logic blocks 402 may include a PLA circuit, a PAL circuit, a programmable NAND.NAND circuit, or a programmable NOR.NOR circuit for example. In one embodiment, each programmable logic block 402 includes a programmable AND/OR logic array based PAL circuit. Each programmable logic block 402 has twenty-two input lines from switch matrix 401 which drive on the order of eighty product terms.

This segmented structure, like the other embodiments described above, retains the benefits of a traditional PAL circuit such as the wide input decoding, multiplexing and demultiplexing capability, without increasing the array proportionally to the number of input lines. Further, the array size and switch matrix 401 have been selected so that programmable logic device 400 of this invention achieves an optimum balance of functionality, silicon die size, and performance.

An important aspect of this invention is the fixed number of input lines to each programmable logic block 402 from switch matrix 401. As described more completely below, this feature maintains the speed performance of the device as the input/output capability is increased and this feature enhances the designer's ability to migrate a design to other devices in the family of programmable logic device 400.

Prior art devices typically provide to the programmable logic array one input line for each logic macrocell in the programmable logic block and one input line to the programmable logic array for each dedicated input pin. Each input line to the programmable logic array typically drives two lines within the array. Hence, in these prior art devices, as the number of physical pins increases the number of macrocells increases and consequently the number of input lines to the programmable logic array. As the number of input lines increases, the programmable logic array size increases. The larger array size results in poor speed performance and poor utilization of the array. Also, increasing the size of the programmable logic array limits migrating designs to other devices with enhanced input/output capability.

Figure 9:
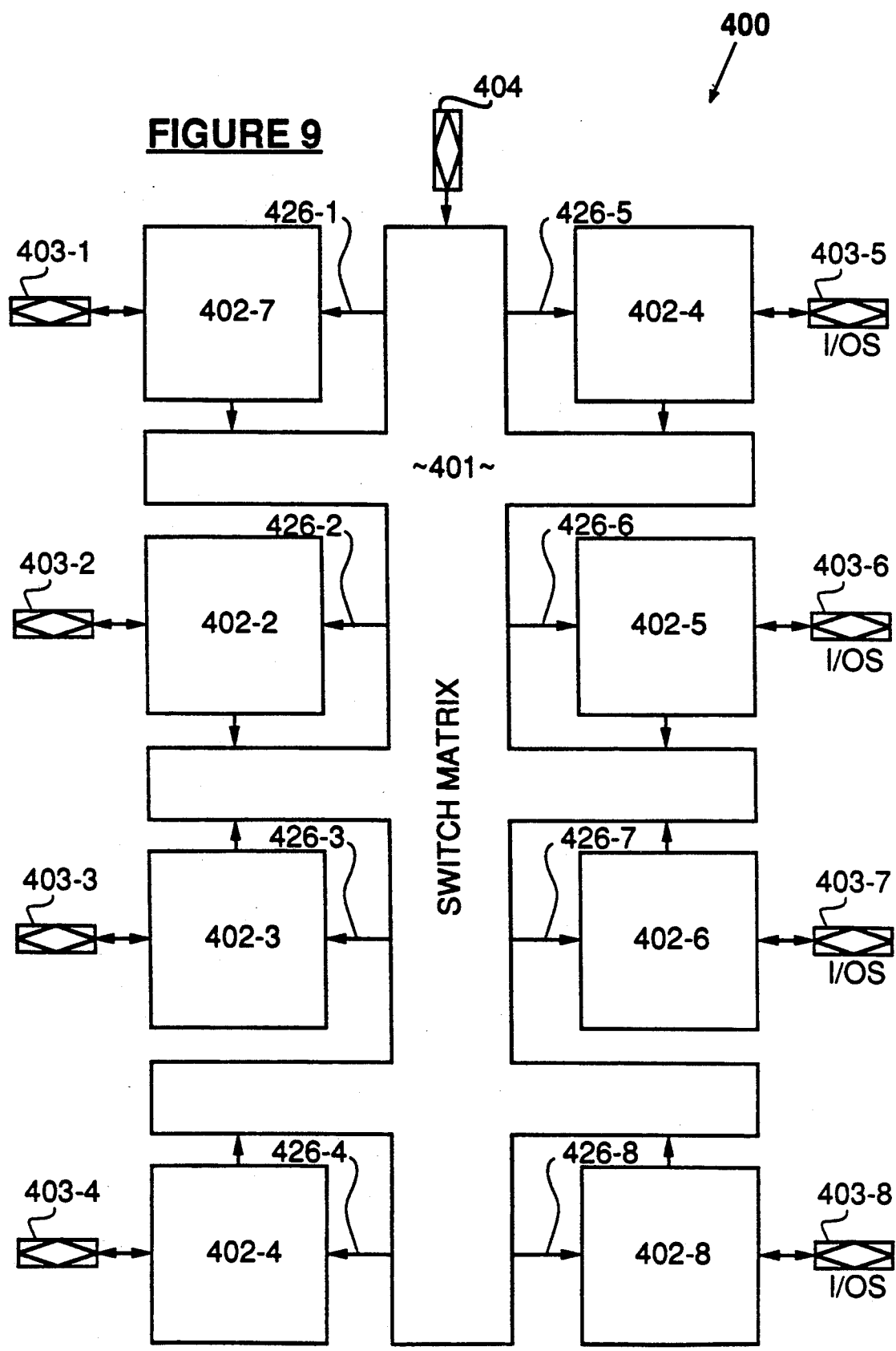
FIG. 9 is a conceptual block diagram of an embodiment of a programmable logic device having complete symmetry according to the principles of this invention.

Another important aspect in one embodiment of this invention is the complete symmetry of programmable logic device 400. Each of the programmable logic blocks 402 in device 400 are identical. Moreover, programmable logic blocks 402 in programmable logic device 400 are arranged symmetrically around switch matrix 401 (FIG. 9). The symmetry simplifies the development of the silicon die by the silicon chip designer and the design of a system using the PLD of this invention by the system designer. Also, without the inherent symmetry, the development of software tools for the PLD is more difficult.

Switch matrix 401 provides a means for selecting twenty-two input signals, i.e. twenty-two paths for information, for the logic circuit in each programmable logic block 402. Switch matrix 402 can route signals from one block to another block, signals from the dedicated input pins to a block or blocks and a signal from a block back to that block. Signal transfer through this switch matrix is very rapid and the twenty-two path flexibility for each programmable logic block provides numerous combinations of input signals to each programmable logic block of the device.

In one embodiment, switch matrix 401 is implemented using programmable multiplexers. As described more completely below, multiple configurations of switch matrix 401 are feasible using programmable multiplexers. The number of multiplexers and size of each multiplexer is a tradeoff between the size of the die and silicon utilization. A preferred embodiment is described below and in view of this discussion other embodiments will be apparent to those skilled in the art.

Figure 10:
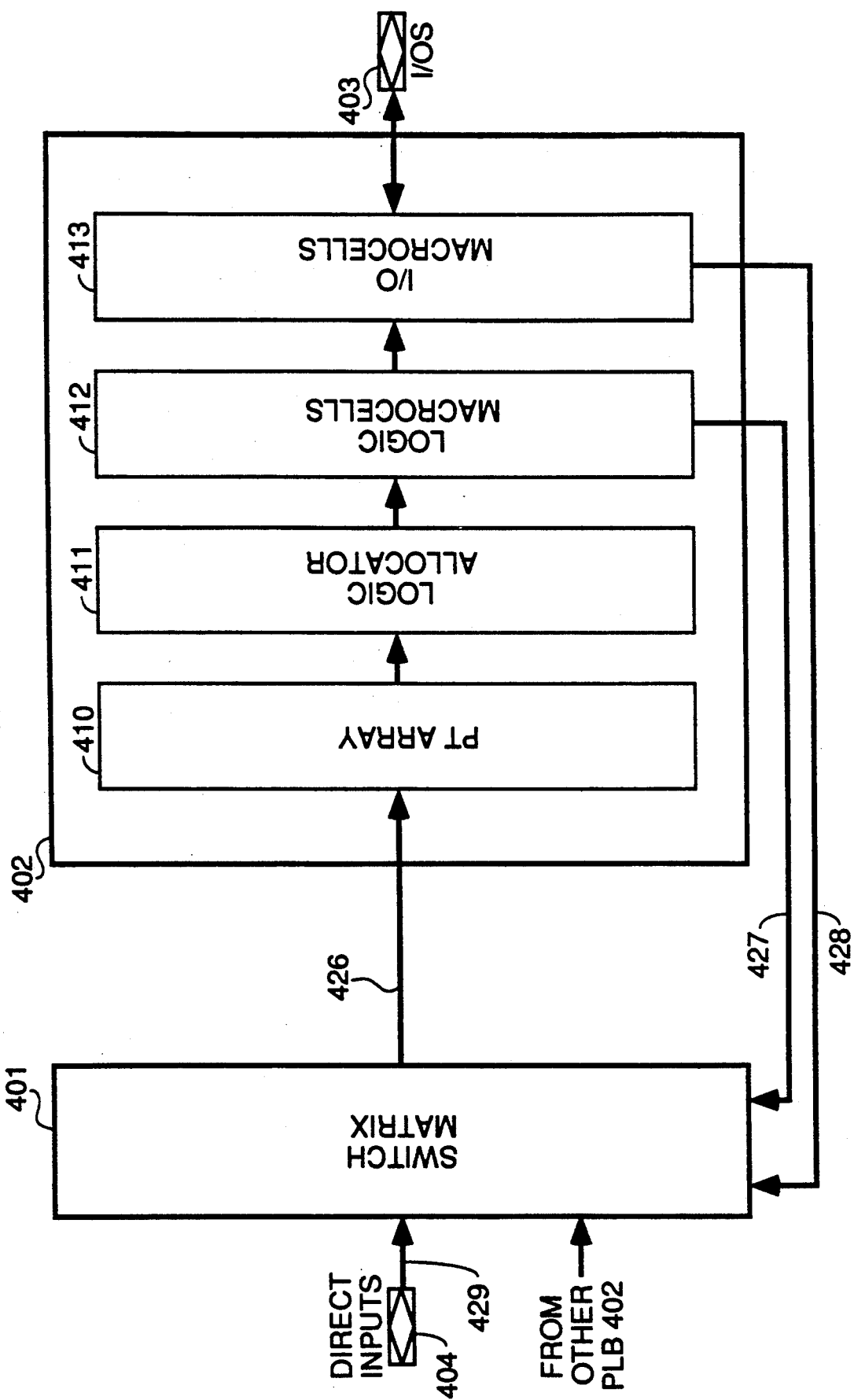
FIG. 10 is a more detailed block diagram of the symmetric programmable logic block of this invention.

As illustrated in more detail in FIG. 10, each programmable logic block 402 contains a programmable logic array, for example a product-term array 410, a logic allocator 411, programmable logic macrocells 412, and I/O macrocells 413. Product-term array 410 generates the basic logic using signals provided only by switch matrix 401.

While programmable logic array 410 is described in terms of a programmable AND/OR array, the programmable AND/OR array is implemented in a preferred embodiment as a NOR.NOR array that is functionally equivalent to the programmable AND/OR array described herein. As discussed more completely below, product term array 410 may also be a programmable OR array/fixed AND array, a PLA (programmable AND array and a programmable OR array), a NOR.NOR array, or a NAND.NAND array, for example. Accordingly, the use of a programmable AND/OR logic array is illustrative only and is not intended to limit the scope of the invention.

Logic allocator 411 is programmable so that product terms from array 410 are distributed to logic macrocells 412 as required by the user of device 400. Logic macrocells 412 configure the signals from logic allocator 411 as explained more completely below. Each logic macrocell includes a programmable storage element.

The output signals from logic macrocells 412 are provided to I/O macrocells 413 and fedback to switch matrix 401 over lines 427. Each logic macrocell that may be used to generate an output signal is coupled to an I/O macrocell. I/O macrocells 413 selectively deliver the output signals from macrocells 413 to I/O pins 403. Alternatively, I/O macrocells 413 provide input signals from I/O pins 403 to switch matrix 401 over lines 428. If an I/O cell is used to configure an I/O pin as an input pin, the logic macrocell associated with that I/O cell can function as a buried logic macrocell. Hence, as explained more completely below, the architecture of programmable logic device 400 is designed for efficient use of all the resources within the device.

Each programmable logic block 402 additionally contains, in this embodiment, an asynchronous reset product term and an asynchronous preset product term. These product terms are used to initialize all flip-flops within programmable logic block 402. In addition, in one embodiment, each programmable logic block 402 contains two output enable product terms for every eight I/O macrocells in the block. In each programmable logic block 402, I/O macrocells 413 are divided into banks where each bank, in this embodiment, contains eight I/O macrocells. Each bank of I/O macrocells 413 receives two of the output enable product terms.

Thus, each programmable logic block 402, in this embodiment, has a multiplicity of product terms in product term array 410 which provide control functions to all macrocells in block 402. In contrast, most prior art EPLDs had a plurality of control product terms associated with each macrocell. In most synchronous registered applications, the prior art plurality of control product terms were not completely utilized. Thus, prior art devices with a plurality of control product terms per macrocell were typically very inefficient. Consequently, the die size and the cost of the prior art devices were larger than required. In contrast, the control product terms of this invention provide functionality equivalent to that typically implemented with prior art devices while eliminating the inefficient use of resources within the device.

As described more completely below, programmable interconnections within each programmable logic block 402 are used to decouple product-term array 410 from switch matrix 401, macrocells 412, 413 and I/O pins 403. This decoupling provides greater flexibility than was available in the prior art programmable logic devices and allows device 400 to be efficiently and quickly configured for a user application. Another significant advantage of this architecture is that switch matrix 401 provides a fixed, uniform, predictable and path independent time delay for all signals that are passed through switch matrix 401. Hence, in many circumstances, the performance of a design is design-independent and is known before the design is even begun.

In addition, switch matrix 401 allows global connectivity and high silicon efficiency. In this embodiment, the delay time through switch matrix 401 for connecting one programmable logic block to another programmable logic block is in the range of about one to two nanoseconds. In contrast, prior art centralized programmable interconnect array based architectures had an interblock delay time in the range of from 13 to 16 nanoseconds. The high internal speed of switch matrix 401 of this invention allows a programmable logic block to communicate with other programmable logic blocks without the normal output buffer delays.

The decoupling of the internal resources within a programmable logic block 402 is in sharp contrast to the prior art programmable logic device families. Historically, two of the most popular synchronous programmable logic device families have been the industry standard low complexity 16R8/16V8 architecture programmable logic devices and the medium complexity 22V10 architecture programmable logic devices. Each of these device architectures includes a programmable AND-OR array.

In each of these three industry standard synchronous programmable logic devices, i.e., the 16R8, 16V8 and 22V10 devices, the AND-OR array is strongly coupled with the macrocells, i.e., the product terms associated with each of the macrocells belong to that particular macrocell only. The macrocells are also strongly coupled with the I/O pins. If the I/O pin is used as the input pin then the register associated with the I/O pin is lost. These devices do not provide the capability of operating the storage elements as buried registers. Also, a dedicated output enable product term for each of the I/O pins results in inefficient product term array utilization.

The major shortcomings of the existing synchronous programmable logic devices have been (i) complete coupling of macrocells with the AND-OR array and I/O pins, (ii) static allocation of product terms with macrocells, (iii) the absent of T-type flip-flops within the macrocells for building counters, (iv) the lack of flexible clock source selection, (v) the dedication of individual output enable product terms for each I/O pin; (vi) a limited number of I/O pins; and (vii) a limited number of macrocells.

Moreover, complete coupling of macrocells to the programmable array and the I/O pins with fixed, static allocation of product terms for logic and control function results in poor silicon efficiency and speed degradation. Also, migration of the architecture into high density structures becomes extremely difficult. In particular, prior art devices, which have increased numbers of I/O pins and macrocells, typically have poor speed performance and the architecture is not amenable to increased density because, as explained above, the product term array is further enlarged as the number of macrocells increases.

In contrast, programmable logic blocks 402 (FIG. 10) of this embodiment provide a simple high performance, yet flexible dense and scalable architecture. Programmable logic blocks 402 include the best features of the popular industry standard programmable logic devices as described above, such as architectural simplicity with a single programmable logic array and macrocell structures, along with decoupled elements and an optimized global connectivity with fixed high speed predictable delays. Programmable logic blocks 402 eliminate the poor silicon efficiency of the prior art devices.

In one embodiment, programmable logic device 400 of this invention is implemented with 0.8 micron double metal, electrically erasable CMOS technology. Further, device 400 has about a 15 nanosecond worse case pin-to-pin signal propagation delay time with a 50 MHz external system clock. Moreover, according to the principles of this invention, the logic macrocells, both output and buried, are decoupled from the product term array by the switch matrix and the logic allocator. As the number of macrocells is increased, the product term array is not proportionally affected. Therefore, unlike the prior art devices, the product term array of this invention does not degrade speed performance as the density of macrocells is increased.

In fact, as the logic macrocell density is increased, the pin-to-pin signal propagation delay time remains about constant because the switch matrix provides a fixed known delay, and the product term array size is maintained. Thus, a design implemented with one device of this invention is easily migrated to a device having more macrocell capability. As explained more completely below, with this architecture there is no longer a need to trade device speed for macrocell density.

Symmetric programmable logic device 400 with programmable switch interconnect matrix 401, in this embodiment, is further subdivided into two families. A first family 400A (FIG. 11, Table 1) includes 44, 68, and 84 pin devices with 32, 48 and 64 logic macrocells respectively. This family, with a high pin-to-logic ratio, is targeted to address I/O intensive applications.

Figure 13B:
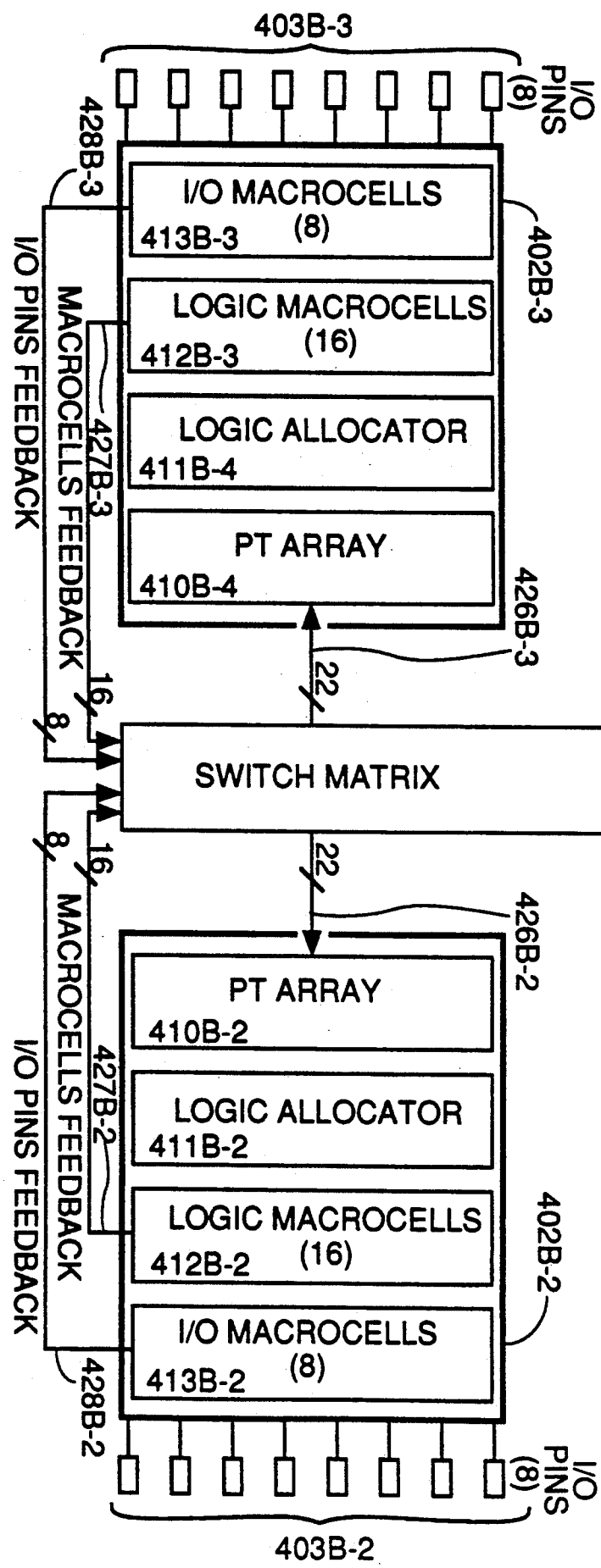

Conversely, a second family 400B (FIG. 13, Table 1), with a high logic-to-pin ratio, is targeted to address logic intensive applications. The second family offers twice the logic capability of the first family in the same package. The use of two families provides a convenient way for migrating designs up or down with little difficulty. The I/O and logic intensive nature of the families offers system designers broader options, allowing them to suit their designs to appropriate devices.

The features for several embodiments of each family are given in Table 1.

TABLE 1

|  | Pins | Logic Macrocells | I/O Macrocells | Max Inputs | Max Outputs | Max F/Fs |
| --- | --- | --- | --- | --- | --- | --- |
| Family 1 | 44 | 32 | 32 | 38 | 32 | 32 |
|  | 68 | 48 | 48 | 58 | 48 | 48 |
|  | 84 | 64 | 64 | 70 | 64 | 64 |
| Family 2 | 44 | 64 | 32 | 38 | 32 | 64 |
|  | 68 | 96 | 48 | 58 | 48 | 96 |
|  | 84 | 128 | 64 | 70 | 64 | 128 |

The column "Pins" in Table 1 is the total number of pins for the package containing programmable logic device 400. The columns "Max Inputs" and "Max Outputs" correspond to the total number of pins available for input signals and output signals, respectively. In this embodiment, each of the devices has either six or ten dedicated input pins. Further, as explained below, two of the dedicated input pins may function either as clock sources or input sources. The column "Max F/Fs" represents the maximum number of flip-flops in device 400 and as explained more completely below, in this embodiment each logic macrocell in both families includes one flip-flop.

Figure 11:
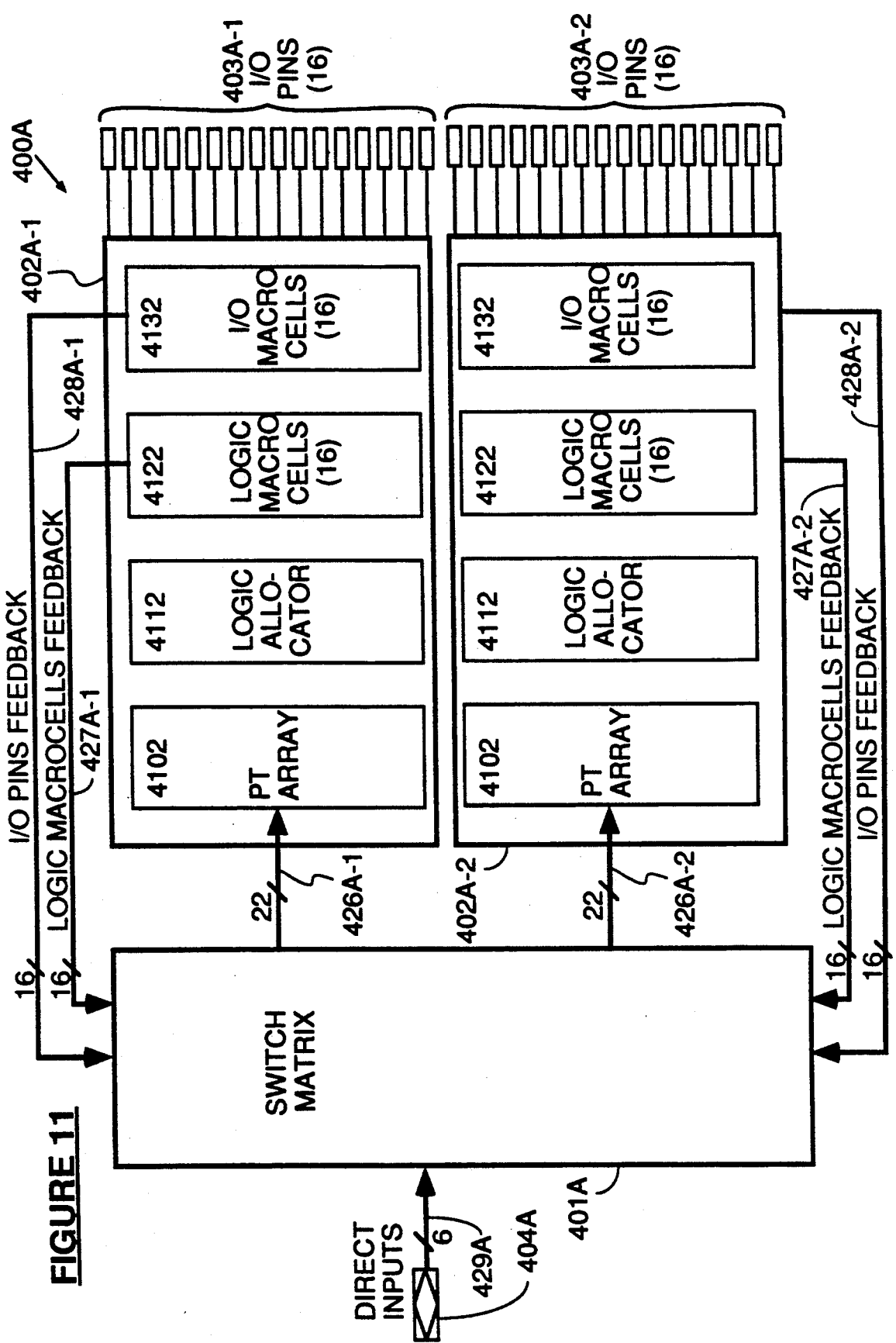
FIG. 11 is a more detailed block diagram of one family of programmable logic devices according to the principles of this invention.
Figure 12A:
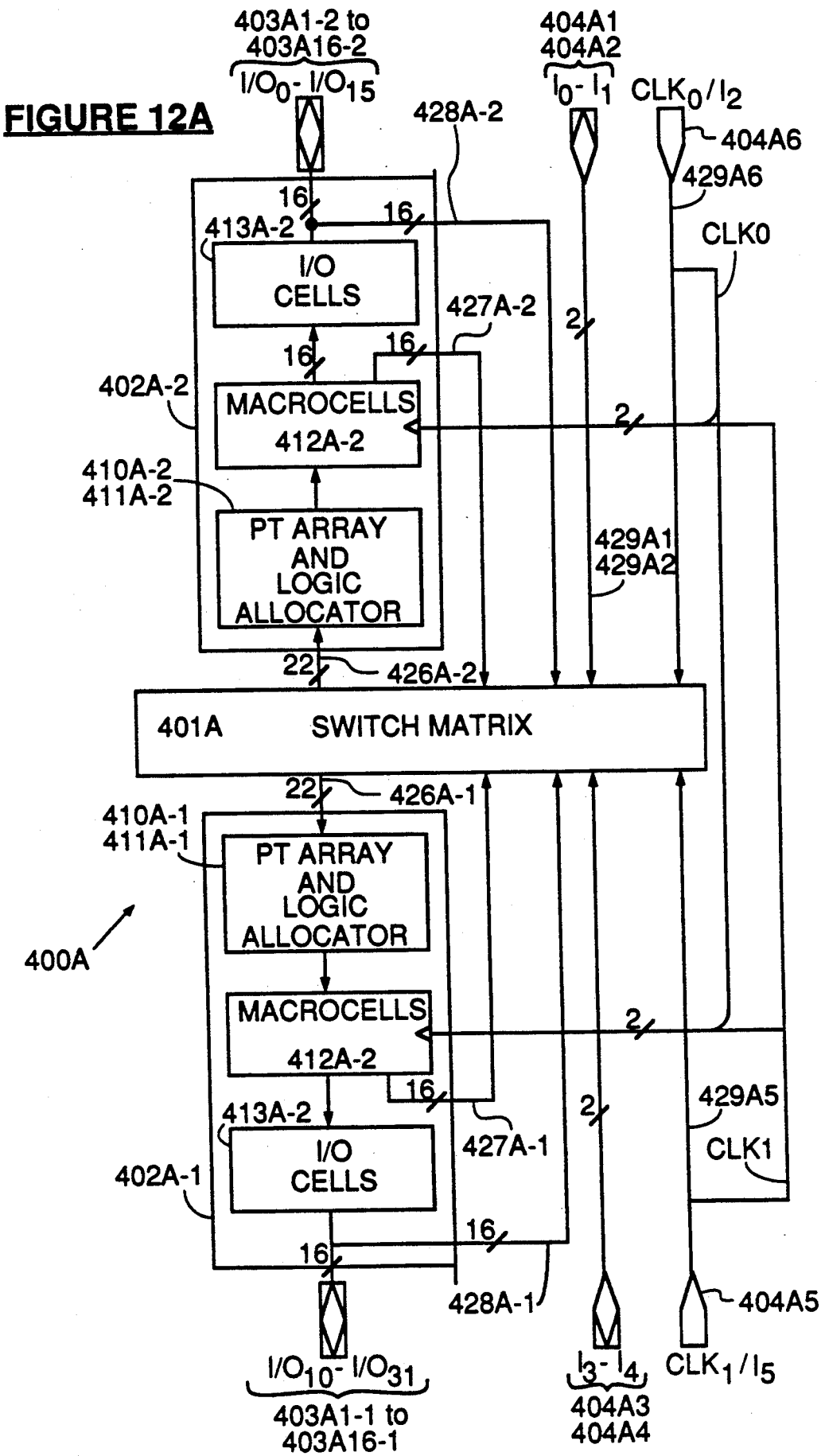

FIGS. 11, 12A, 12B and 12C are diagrams illustrating the first family of programmable logic devices 400A, according to the principles of this invention. FIGS. 11 and 12A illustrate the 44 pin device which has 32 I/O pins 403A-1, 403A-2 and six dedicated direct input pins 404A. As previously described, each of the programmable logic blocks 402A-1, 402A-2 are identical and include a programmable product term array 410A-1, 410A-2, a programmable logic allocator 411A-1, 411A-2, 16 programmable logic macrocells 412A-1, 412A-2, and 16 programmable I/O macrocells 413A-1, 413A-2.

In the figures, a line with a slash through the line and then a number N is used to indicate that the line represents N lines. Hence, switch matrix 401A provides twenty-two input signals to product term array 410A-1 over twenty-two input lines 426A-1. Similarly, logic macrocells 412A-1 provide feedback signals to switch matrix 401A over sixteen lines 427A-1 and I/O macrocells 413A-1 provide I/O pin feedback signals to switch matrix 401A over sixteen lines 428A-1.

FIGS. 12A and 12C illustrate two different embodiments of device 400A (FIG. 11) with the connection of dedicated input pins 404A shown in more detail. In FIGS. 12A and 12C, two dedicated input pins 404A5, 404A6 are either a dedicated input pin, a dedicated clock pin, or a clock/input pin. Pins 404A5, 404A6 are coupled to switch matrix 401A and to logic macrocells 412A. Notice that in FIGS. 12A and 12C, product term array 410A and logic allocator 411A have been combined and are represented by a single box 410A-411A.

FIG. 12B, is similar to FIGS. 11 and 12A, but in this embodiment programmable logic device 400A1 includes four identical programmable logic blocks 402A1 and has 10 dedicated input pins, two of which may be used as dedicated clock signal input pins. Each programmable logic block 402A1 has 12 logic macrocells 412A1, 12 I/O macrocells 413A1 and 12 I/O pins 403A1.

FIGS. 13, 14A, 14B and 14C are block diagrams of the second family of programmable logic devices 400B according to the principles of this invention. As previously described, this family of logic devices 400B has a higher logic to pin ratio than the first family 400A. Thus, in this embodiment, each programmable logic block 402B (FIG. 13) has only eight I/O pins 403B. Product term array 410B, logic allocator 411B and logic macrocells 412B in programmable logic block 402B are similar to the corresponding devices in programmable logic block 402A (FIG. 11). However, as explained more completely below, logic macrocells 412B (FIG. 13) include output logic macrocells 412BA (FIG. 14A) and buried logic macrocells 412BB.

In one embodiment of second family 400B, each programmable logic block 402B (FIG. 13) is connected to only eight I/O pins 403B. Thus, only eight of logic macrocells 412B are coupled to eight I/O macrocells 413B which in turn are coupled to eight I/O pins 403B (FIG. 14A). The other eight logic macrocells are buried logic cells 412BB that provide feedback signals on line 427B to switch matrix 401B.

FIGS. 14A, 14B and 14C show more clearly the division of logic macrocells 412B into two groups. The first group of logic macrocells 412BA provides feedbacks signals to switch matrix 401B and signals to I/O macrocells 413B. The second group of logic macrocells 412BB receive signal from I/O pins 403B and provide either feedback signals or input signals to switch matrix 401 and therefore function, as previously described, as buried logic macrocells. Also, as in first family 400A of devices, the second family of devices 400B has either six or ten dedicated input pins 404B of which two may be configured as either direct input pins or clock signal input pins. Extension of the principles of the second family of programmable logic devices 400 to other logic macrocells to pin ratios, e.g. 3:1 or 4:1, will be apparent to those skilled in the art in view of this disclosure.

Figure 15A:
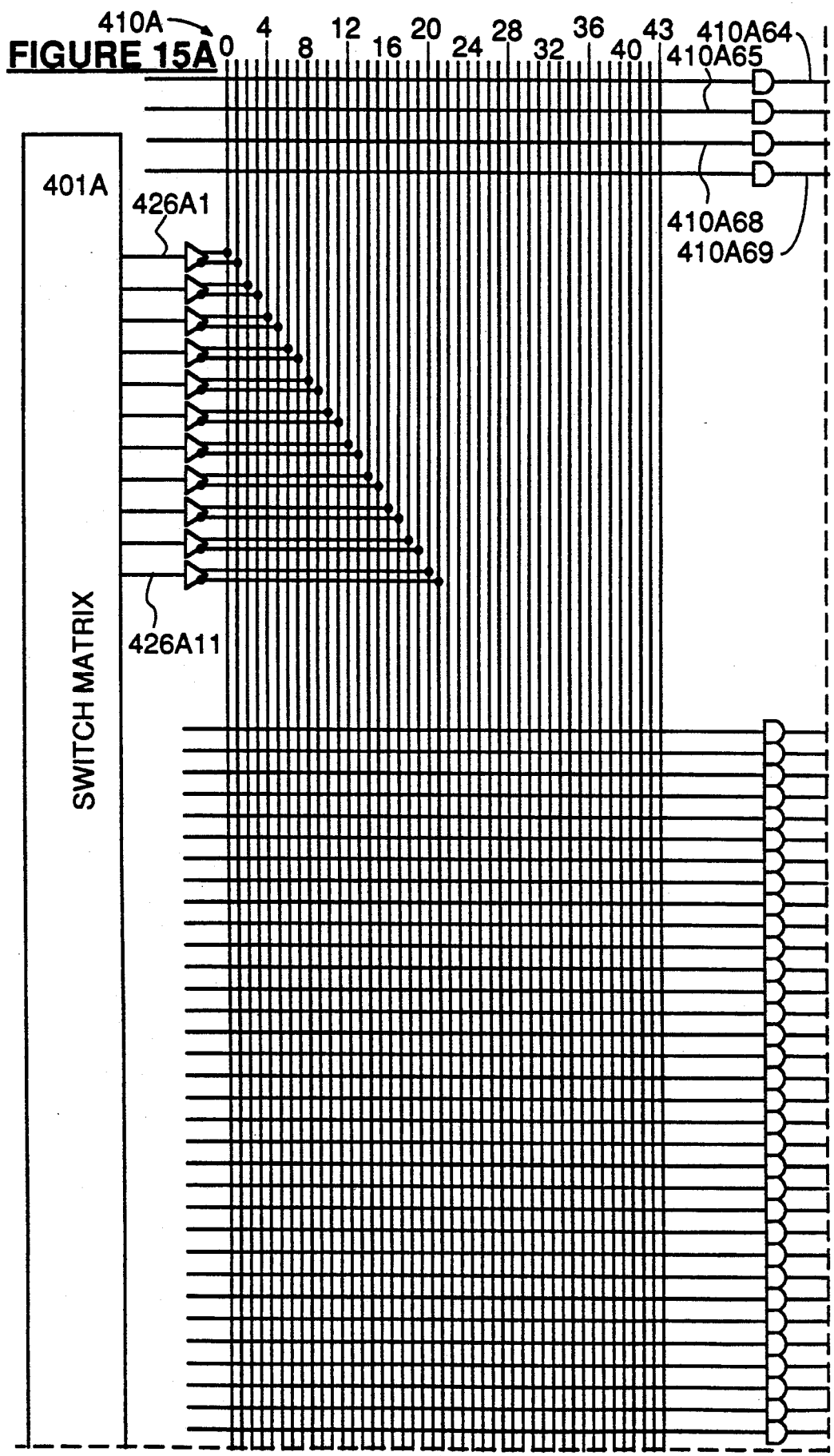
Figure 15B:
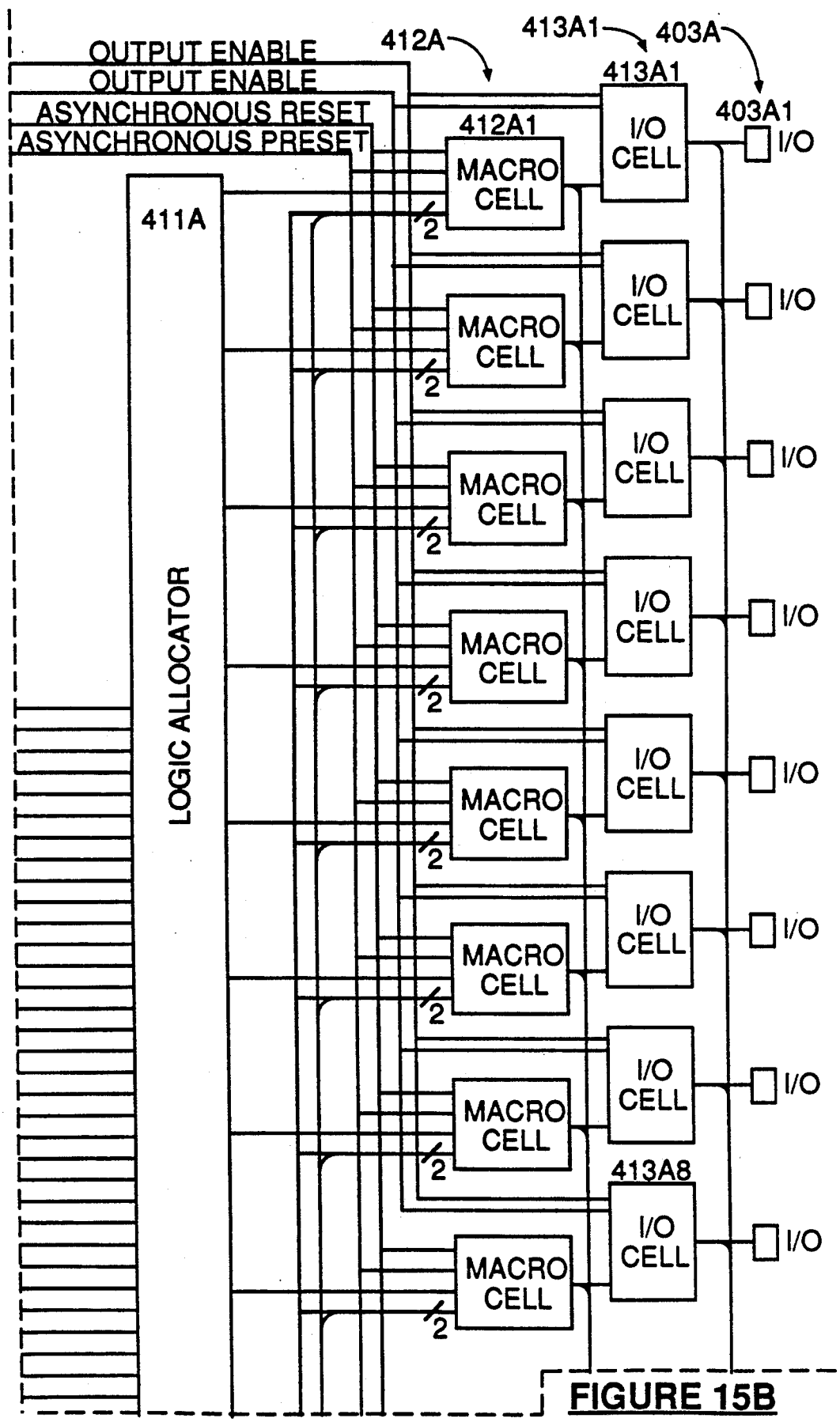
Figure 15C:
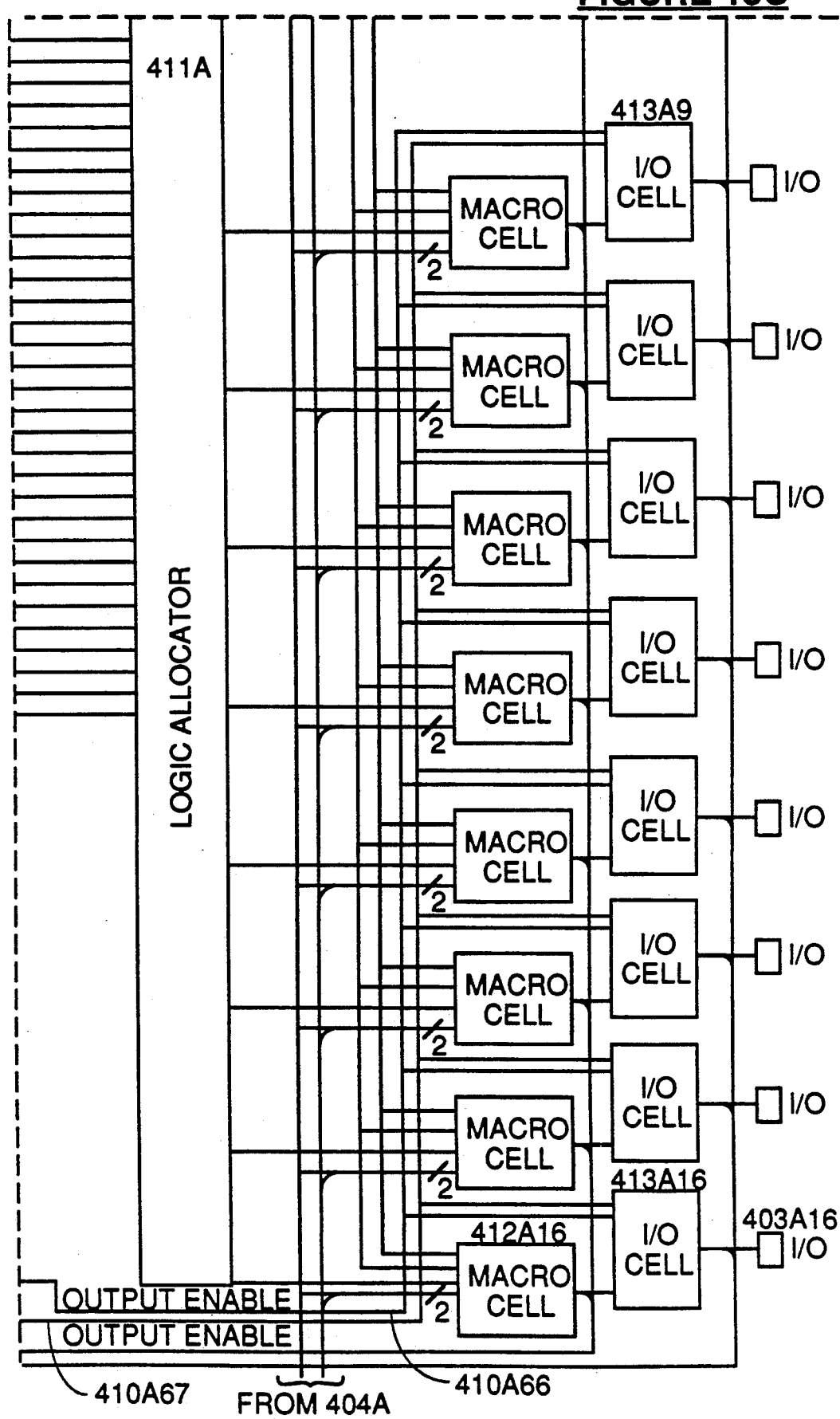

Programmable logic block 402A for the first family of programmable logic devices 400 of this invention is shown in more detail in FIG. 15. In particular, the interconnection of switch matrix 401A, product term array 410A, logic allocator 411A, a column of sixteen logic macrocells 412A, a column of sixteen I/O macrocells 413A and a column of sixteen I/O pins 403A are illustrated. Product term array 410A includes a 44 by 70 programmable AND logic array. Sixty-four of the product term lines are provided to logic allocator 411A. In addition, product term array 410A in this embodiment has six additional product term lines 410A64 through 410A69. (However, product term array 410A1 (FIG. 12B) is only a 44×54 programmable AND logic array. The 54 product terms include 48 logic product terms and six control product terms. In the following description, this device is not considered further. However, in view of this disclosure the architecture of this device will be apparent to those skilled in the art.)

In FIG. 15, a single line is shown connecting logic allocator 411A to each logic macrocell 412An (n=1,...16). However, as explained more completely below, the line between logic allocator 411A and each macrocell 412An represents a multiplicity of lines, e.g. 3 to 4 lines.

I/O macrocells 413A, in this embodiment, are divided into two banks. The first bank of I/O macrocells 413A is defined by I/O macrocells 413A1 to 413A8 that receive the signals on output enable product term lines 410A64 and 410A65. Similarly, the second bank of I/O macrocells 413A is defined by I/O macrocells 413A9 to 413A16 that receive signals on output enable product term lines 410A66 and 410A67. The signals on lines CLK0, CLK1 from dedicated input pins 404A5, 404A6 (FIG. 12A) are provided to each logic macrocell 412A (FIG. 15). Similarly, the product term on asynchronous reset line 410A68 and the product term on asynchronous preset line 410A69 are provided to each of logic macrocells 412A.

Extensive studies of the popular prior art PAL devices' usage pattern showed that product term arrays with more than about twenty-two input lines are both silicon inefficient and slow in performance. As a result, each product term array 410A in this embodiment has twenty-two input lines from switch matrix 401A. Each input line from switch matrix 401A is connected to a driver that provides both the signal on the input line and the complement of the signal on the input line to product term array 410A which in turn generates all the logic and control product terms for programmable logic block 402A.

The 44×70 product term array of this invention is sized between the product term arrays in the 16V8 architecture and the 22V10 architecture described above. Thus, the product term array is optimized to have the performance and cost structure of the 16V8 architecture with higher silicon efficiency than either the 16V8 or 22V10 architecture. In fact, product term array 410A has the equivalent logic functionality of the 22V16 architecture but this functionality is provided in a programmable logic device with a product term array that is approximately one-half the size of the 22V10 architecture.

Figure 16B:
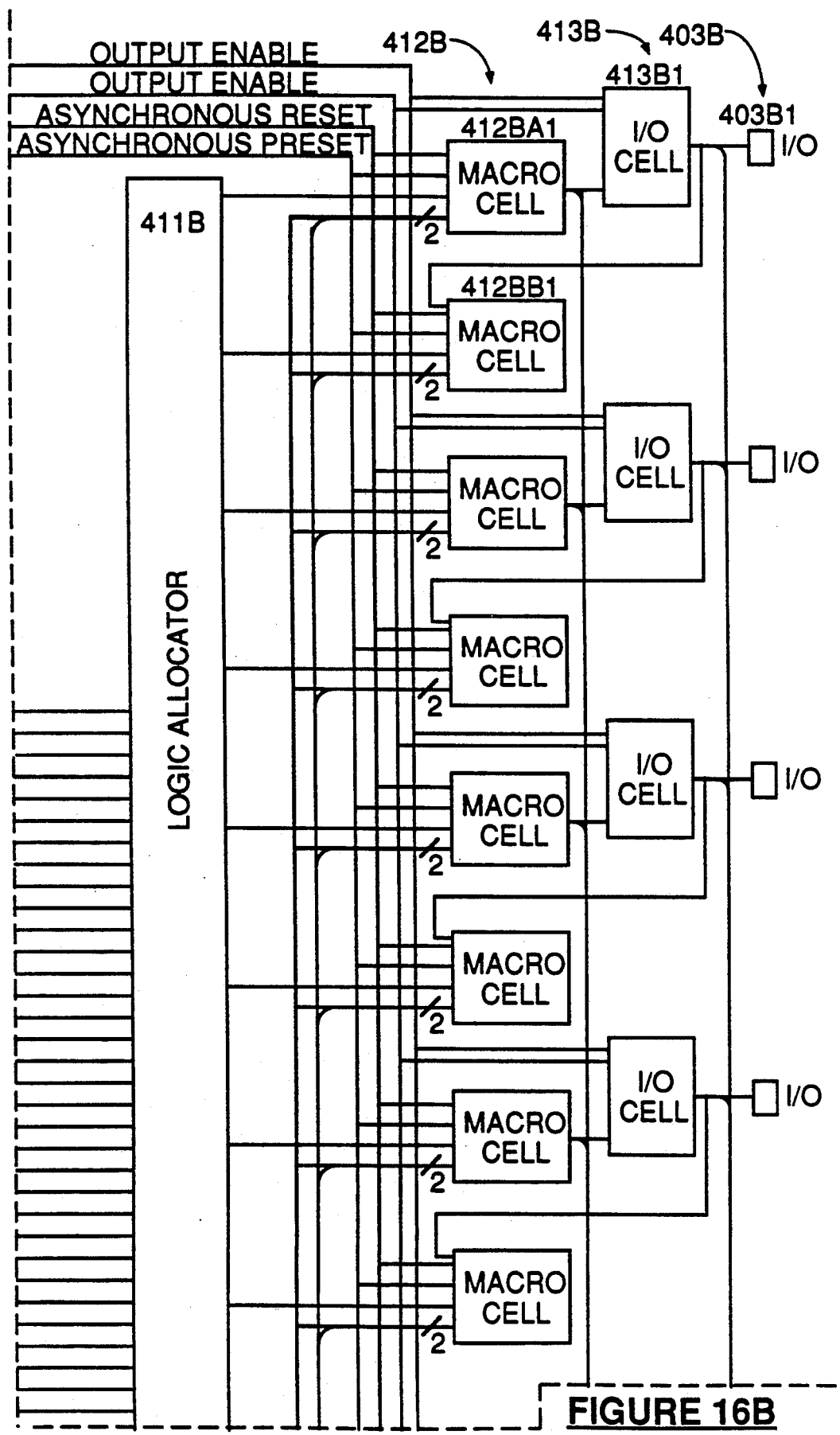
FIG. 16A-16C are schematic diagrams of the programmable logic block in the second family of programmable logic devices according to the principles of this invention.
Figure 16C:
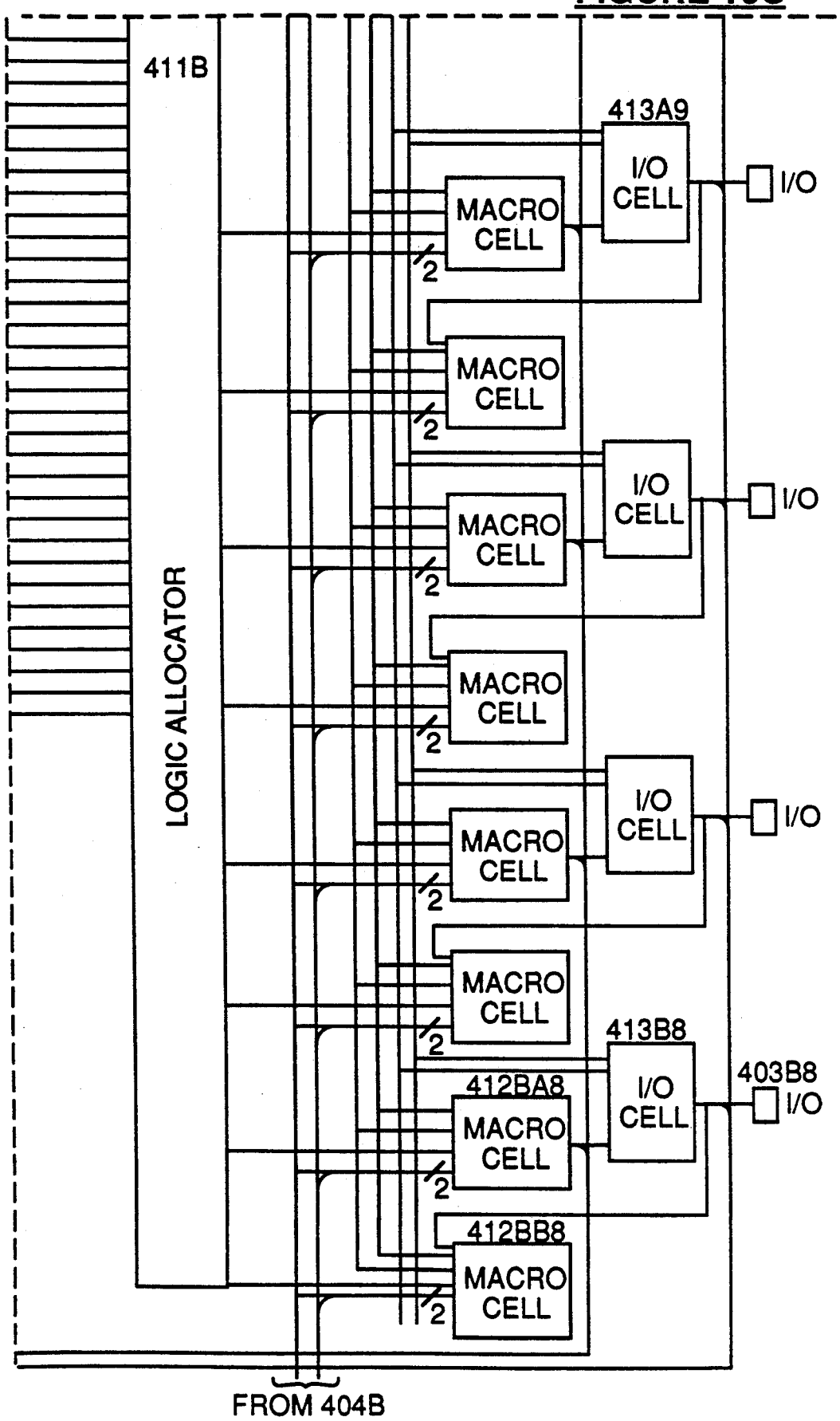
Figure 16D:
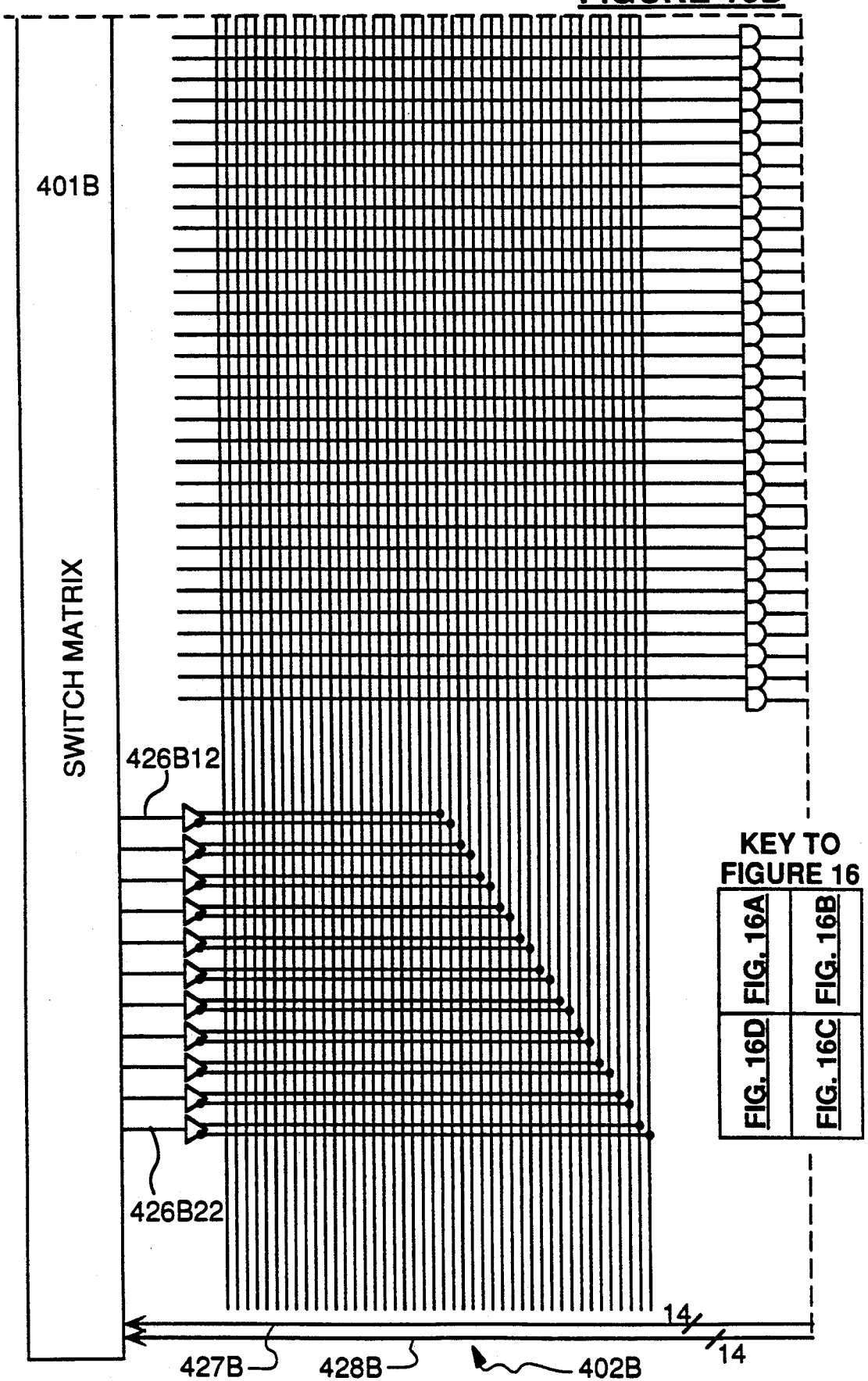

Programmable logic block 402B for the second family of programmable logic devices 400 of this invention is shown in more detail in FIG. 16. In particular, the interconnection of switch matrix 401B, product term array 410B, logic allocator 411B, a column of sixteen logic macrocells 412B, which has eight output logic macrocells 412BA and eight buried logic macrocells 412BB, a column of eight I/O macrocells 413B and a column of eight I/O pins 403B are illustrated. Product term array 410B includes a 44 by 68 programmable AND logic array. Sixty-four of the product term lines are provided to logic allocator 411B. In addition, product term array 410B in this embodiment has four additional product term lines 410B64 through 410B67.

I/O macrocells 413B, in this embodiment, receive the signals on output enable product term lines 410B64 and 410B65. The signals on lines CLK0, CLK1 from dedicated input pins 404B5, 404B6 (FIG. 14A) are provided to each output logic macrocell 412BA and buried logic macrocell 412BB (FIG. 16). Similarly, the product term on the asynchronous reset line 410B66 and the product term on the asynchronous preset line 410B67 are provided to each output logic macrocell 412BA and buried logic macrocell 412BB.

Each I/O pin is connected to a buried logic macrocell so that, as explained more completely below, when the I/O pin is configured as an input pin, the input signal is supplied to both the buried logic macrocell and switch matrix 401B. Thus, the input signal may be either processed by the buried logic macrocell, i.e., may be a registered input signal, and then provided to switch matrix 401B or provided directly to switch matrix 401B as a simple combinatorial input signal.

Switch matrix 401B is coupled to programmable product term array 410B by twenty-two input lines. As described above for device 410A, each input line is connected to a driver that generates the signal on the input line and the complement of the signal on the input line.

Logic allocator 411, i.e., logic allocator 411A (FIG. 15) and logic allocator 411B (FIG. 16) includes a multiplicity of router elements wherein each router element steers the sum of a selected number of sum of product terms from product term array 410 to a selected macrocell. The number of product terms per router element may be selected in numerous ways. In this embodiment, the selected number of product terms is four and there is one router element for each logic macrocell 412.

Hence, as described above, if a programmable logic block has sixteen logic macrocells, the product term array provides sixty-four product terms to logic allocator 411. Similarly, in the embodiment which has 12 logic macrocells per programmable logic block, the product term array provides forty-eight product terms to the logic allocator. The configuration of router elements is illustrative only of a plurality of router elements with each router element steering a fixed number of product terms to a selected macrocell and is not intended to limit the invention to this specific configuration.

Figure 17A:
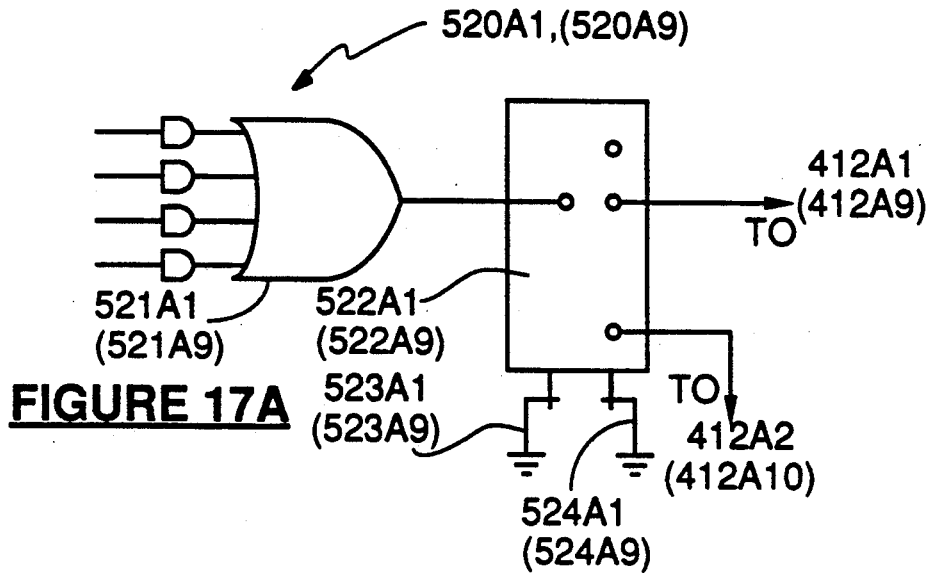
FIGS. 17A through 17C illustrate the router elements in the logic allocator of the first family of programmable logic devices of this invention.
Figure 17B:
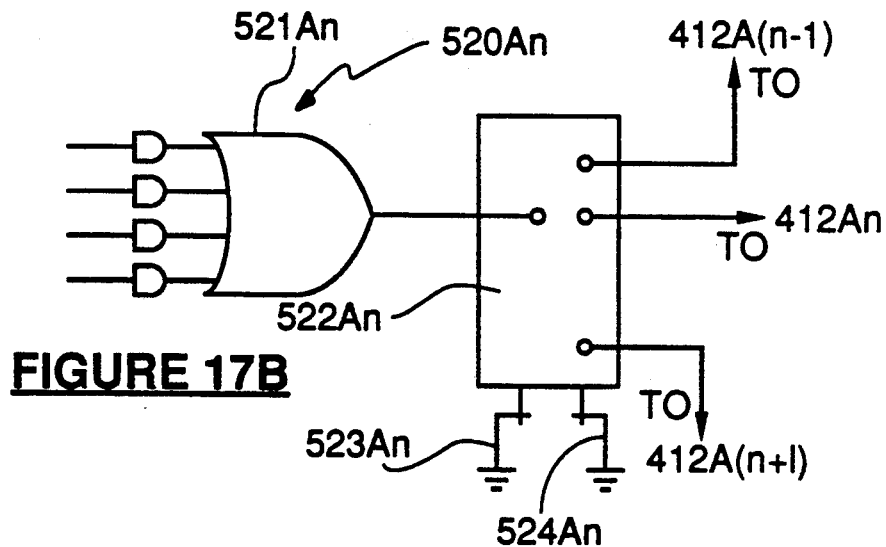
Figure 17C:
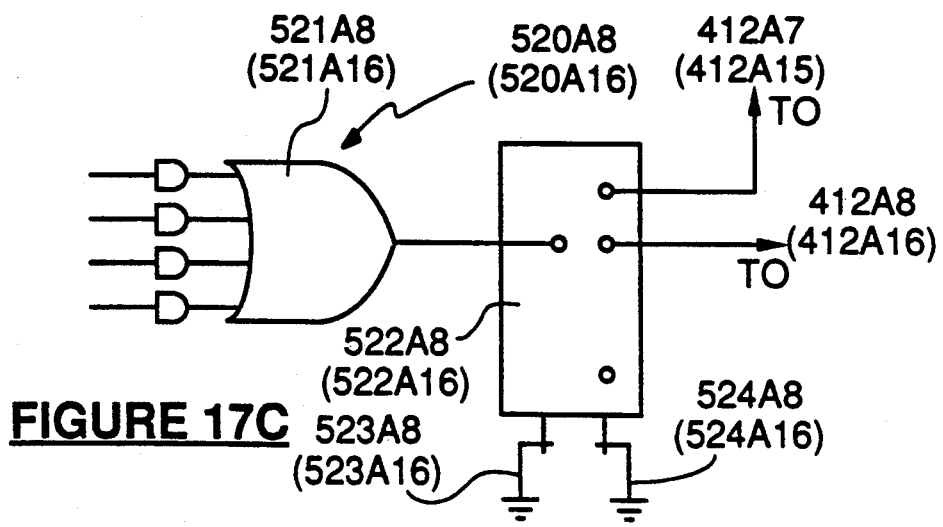

In the first family 400A of logic devices 400, logic allocator 411A includes sixteen router elements 520A (FIG. 17A through FIG. 17C). Each router element 520A includes OR gate 521A, which is driven by signals from four product term lines in product term array 410A, and a programmable one-to-three demultiplexer 522A which has a single input terminal and three output terminals. Architectural configuration cells 523A, 524A are used to form a connection between the input terminal and only one of the output terminals, as explained more completely below. Cells 523A, 524A provide an output select signal to the demultiplexer so that the signal on the input line is passed therethrough to the selected output line. In this embodiment, OR gate 521A is included within router element 520A, but alternatively the OR gate could be included with the AND array so that a programmable AND-OR array generated signals for logic allocator 411A.

Two router elements 520A1, 520A9 (FIG. 17A) of logic allocator 411A may provide a signal to only two macrocells, e.g. router element 520A1 drives either logic macrocell 412A1 or logic macrocell 412A2 and router element 520A9 drives either logic macrocell 412A9 or logic macrocell 412A10 (FIG. 15). Similarly, router elements 520A8, 520A16 (FIG. 17C) in logic allocator 411A may provide a signal to only two macrocells, element 520A16 to logic macrocell 412A15 or logic macrocell 412A16 and element 520A8 to logic macrocell 412A7 or logic macrocell 412A8 (FIG. 15). Each of the other twelve router elements 520An (FIG. 17B) in logic allocator 411A may provide a signal to the macrocell 412A(n−1) or to macrocell 412An, or to macrocell 412A(n+1), where n=2, 3, ..., 7, 10, ..., 15.

Thus, in this embodiment, logic macrocells 412A2 through 412A7 and 412A9 through 412A15 may receive up to a maximum of a sum of twelve product terms while logic macrocells 412A1, 412A8, 412A9 and 412A16 may receive up to a maximum of a sum of only eight product terms. Logic macrocells 412A1, 412A8, 412A9 and 412A16 receive only up to a sum of eight product terms because complete wraparound at the end of programmable logic block 402A, e.g., providing a line from demultiplexer 522A16 to logic macrocell 412A1, is not supported. Complete wraparound is estimated to cause a degradation in speed performance of about one to two nanoseconds for signal propagation from an input pin through programmable logic device 400A to an output pin.

Figure 18:
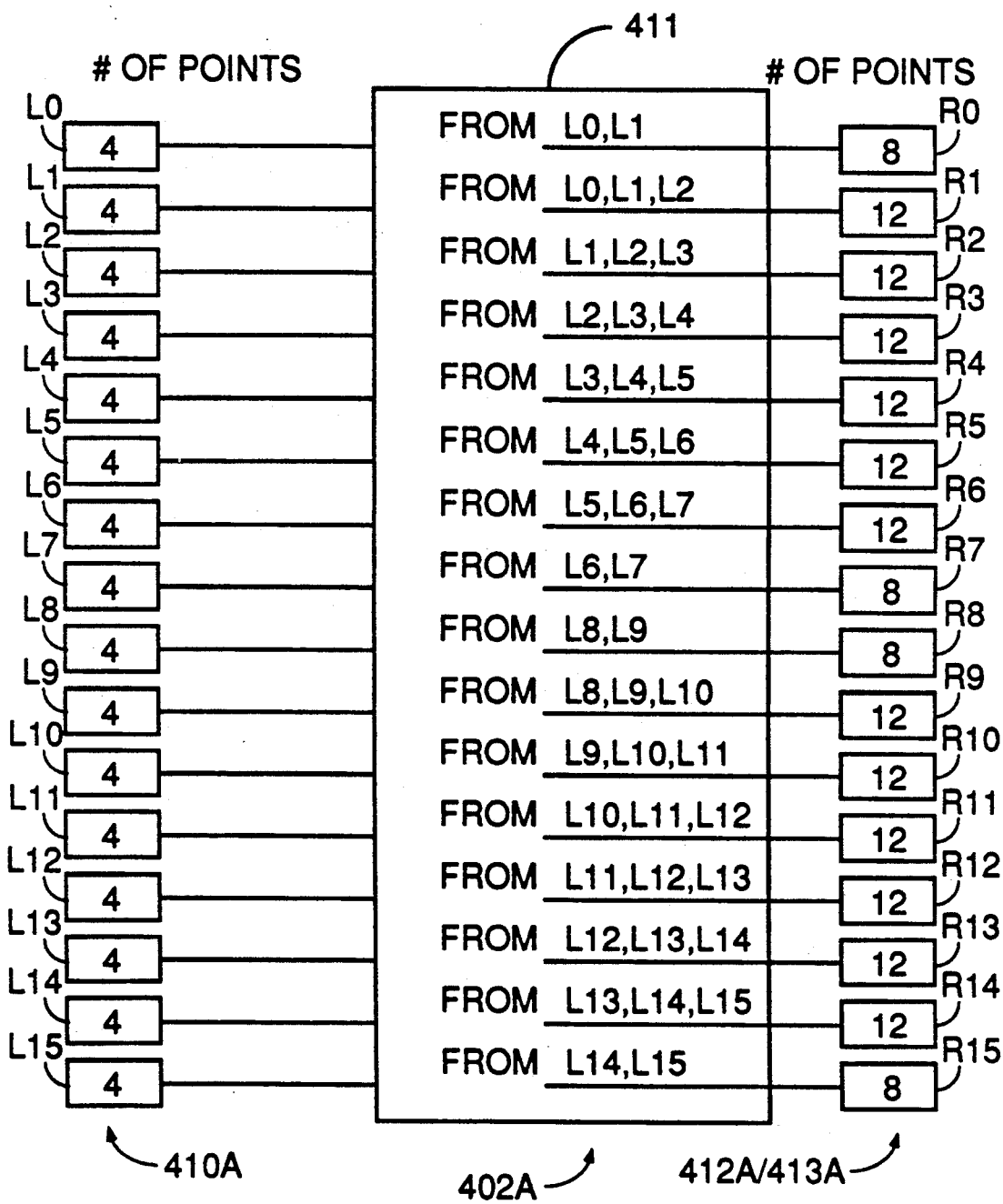
FIG. 18 illustrates the product term steering of logic allocator 411A.

The operation of logic allocator 411A is illustrated in FIG. 18. Boxes L0 through L15 on the left-hand side of the figure, each of which contains the numeral "4", represent the product term clumps, each of which has four product terms, in product term array 410A. On the right-hand side of FIG. 18 are 16 boxes R0 through R15 which represent logic macrocells 412A1–412A16 respectively. The number within boxes R0 to R15 is the maximum number of product terms that logic allocator 411A can route to that logic macrocell. The numbers within logic allocator 411A represent the product terms as numbered on the left-hand side of the figure. Accordingly, FIG. 18 clearly illustrates the product term steering capability of logic allocator 411A of this invention.

It is important to note that no product term resources are permanently allocated to a specific macrocell by logic allocator 411A. Accordingly, if an I/O pin that is coupled to a macrocell, for example the macrocell labeled R7 in FIG. 18, is used as an input pin and the buried register capability of macrocell R7 is not needed, the product terms from cells L6 and L7 in product term array may be utilized by macrocell R6. Thus, there are no wasted product terms associated with macrocell L7, when the macrocell is not utilized.

The signal passed from the output terminal of OR gate 521A is provided to the input terminal of demultiplexer 522A and the output terminal of demultiplexer 522A that receives the input signal is determined by the configuration of architectural cells 523A and 524A. The possible values of the architectural cells 523A and 524A are shown in Table 2 along with the logic macrocell that receives the sum of product terms when the architectural cells have these values. The numbers n, n−1 and n+1 in Table 2 are as defined in FIG. 17B. The configuration of architectural cells in Table 2 as well as the other Tables herein is illustrative only and is not intended to limit the invention to the specific configuration given in Table 2 or the other Tables.

TABLE 2

| Product Term Steering | | |
|---|---|---|
| Architectural Cell 523A | Architectural Cell 524A | Output Signal Supplied to Logic Macrocell |
| 0 | 0 | reserved |
| 0 | 1 | 412A (n − 1) |
| 1 | 0 | 412An |
| 1 | 1 | 412A (n + 1) |

In Table 2, a zero corresponds to a logical zero and is equivalent to a programmed state and a one corresponds to a logical one and is equivalent to an unprogrammed or erased state. The programming for logic macrocells 520A1, 520A8, 520A9, and 520A16 is also given by Table 2, where n=1, 8, 9 and 16 respectively where (i) the logic macrocell 412A(n−1) is reserved for macrocells 520A1 and 520A9; and (ii) the logic macrocell 412(n+1) is reserved for logic macrocells 520A8 and 520A16.

In the second family 400B of logic devices 400, logic allocator 411B also includes sixteen router elements 520B (FIG. 19A through FIG. 19D). Each router element 520B includes OR gate 521B, which is driven by signals from four product term lines in product term array 410B, and a programmable one-to-four demultiplexer 522B which has a single input terminal and four output terminals. Architectural configuration cells 523B, 524B are used to form a connection between the input terminal and only one of the output terminals, as explained more completely below.

First router element 520B1 (FIG. 19A) of logic allocator 411B may provide a signal to either output logic macrocell 412BA1 (FIG. 16), or buried logic macrocell 412BB1. Second router element 520B1 (FIG. 19B) may provide a signal to either output logic macrocell 412BA1 (FIG. 16), buried logic macrocell 412BB1 or output logic macrocell 412BA2. Similarly, the last router element 520B16 (FIG. 19D) in logic allocator 411B may provide a signal to buried logic macrocell 412BB7 (FIG. 16), output logic macrocell 412BA8, or buried logic macrocell 412BB8.

Figure 19A:
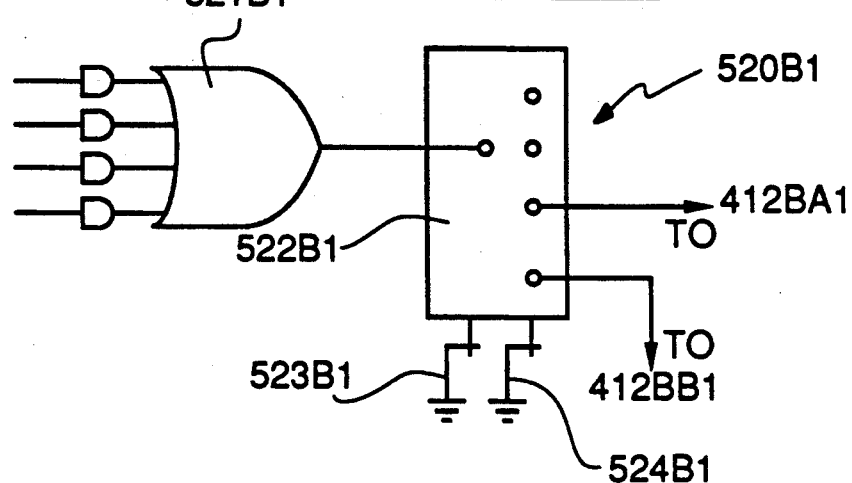
FIGS. 19A, 19B, 19C, and 19D illustrate the router elements in the logic allocator of the second family of programmable logic devices of this invention.
Figure 19B:
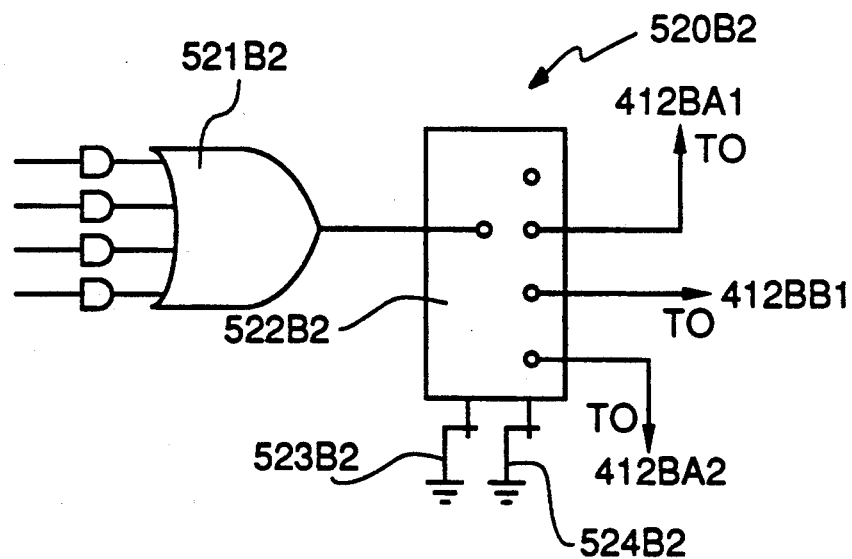
Figure 19C:
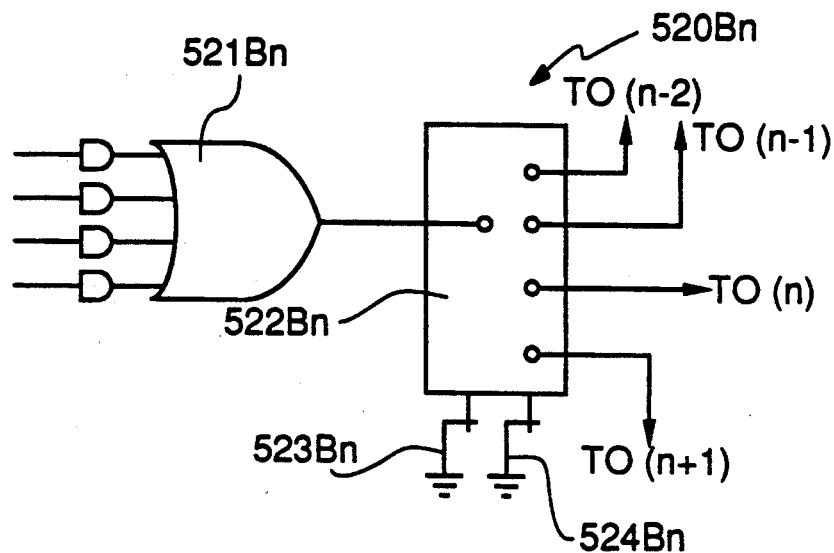
Figure 19D:
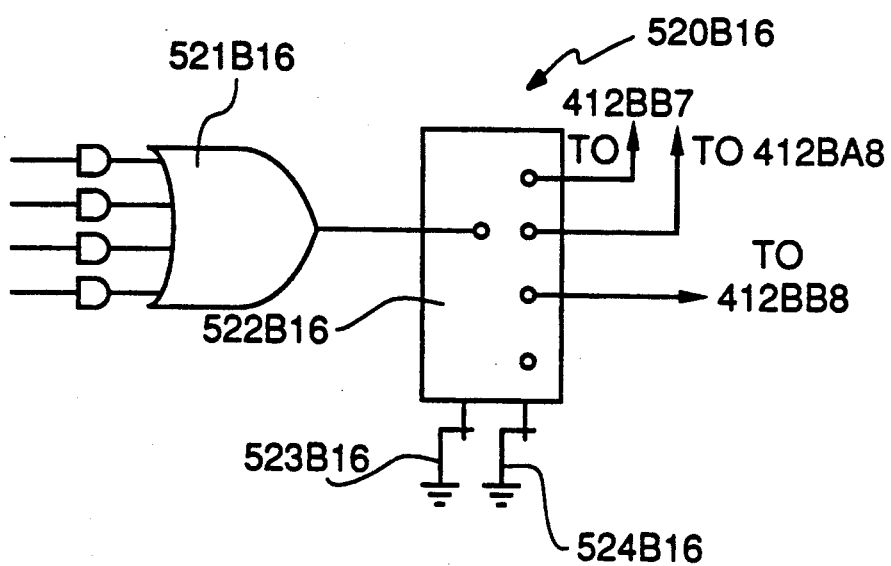

Each of the other thirteen router elements 520Bn (FIG. 19C) in logic allocator 411B may provide a signal to one of four logic macrocells. In FIG. 19C, the four output lines from demultiplexer 522Bn are given as lines to macrocells (n−2), (n−1), (n), and (n+1) where n=3, 4, ..., 15. Here, n represents the position of router element 520Bn in the column of router elements within logic allocator 411B. To locate the output logic macrocells and buried logic macrocells (n−2), ..., (n+1) to which the output lines n−2, ..., n+1 from programmable demultiplexer 522Bn are connected, column 412B of output logic macrocells 412BA and buried logic macrocells 412BB (FIG. 16) are numbered consecutively from one to sixteen where output logic macrocell 412BA1 is one and buried logic macrocell 412BB8 is sixteen, i.e., n=1 ... 16. Line n is then connected to the nth logic macrocell in column 412B.

For example, consider n=7, i.e., router element 520B7. The seventh macrocell in column 412B (FIG. 16) is output logic macrocell 412BA4. Thus, line n from router element 520B7 is connected to output logic macrocell 412BA4. Line n−1 is connected to buried logic macrocell 412BB3 and line n−2 is connected to output logic macrocell 412BA2. Line n+1 is connected to buried logic macrocell 412BB4.

Thus, in this embodiment, logic macrocells 412B3 through 412B14 may receive up to a maximum of a sum of sixteen product terms while logic macrocells 412B1 and 412B15 may receive up to a maximum of a sum of twelve product terms. Macrocell 412B16 may receive only up to a sum of eight product terms. Again, complete wraparound at the end of programmable logic block 402B is not supported.

The operation of logic allocator 411B is illustrated in FIG. 20. Boxes L0 through L15 on the left-hand side of the figure, each of which contains the numeral "4", represent the product term clumps, each of which has four product terms, in product term array 410B. On the right-hand side of FIG. 20 are 16 boxes R0 through R15 where boxes R0, R2, ..., R14 represent output logic macrocells and boxes R1, R3, ..., R15 represent buried logic macrocells. The number within boxes R0 to R15 is the maximum number of product terms that logic allocator 411B can route to that logic macrocell. The numbers within logic allocator 411B represent the product terms as numbered on the left-hand side of the figure. Accordingly, FIG. 20 clearly illustrates the product term steering capability of logic allocator 411B of this invention.

It is important to note that no product term resources are permanently allocated to a specific macrocell by logic allocator 411B. Thus, in this embodiment, as previously described for logic allocator 411A, there are no wasted product terms associated with a macrocell when the macrocell is not utilized.

The signal passed from the output terminal OR gate 521B is provided to the input terminal of demultiplexer 522B and the output terminal that receives the input signal is determined by the configuration of architectural cells 523B and 524B. The possible values of the architectural cells 523B and 524B are shown in Table 3 and the numbers n, n−1, n−2, and n+1 are as defined in FIG. 19C. Again, the architectural cell values in Table 3 are illustrative only, as described above for Table 2, and are not intended to limit the invention to the particular values shown.

TABLE 3

| | Product Term Steering | |
|---|---|---|
| Architectural Cell 523B | Architectural Cell 524B | Output Signal Supplied to Logic Macrocell |
| 0 | 0 | (n − 2) |
| 0 | 1 | (n − 1) |
| 1 | 0 | n |
| 1 | 1 | (n + 1) |

In Table 3, a zero corresponds to a logical zero and is equivalent to a programmed state and a one corresponds to a logical one and is equivalent to an unprogrammed or erased state. The programming for cells 520B1, 520B2 and 520B16 is also given by Table 3 where n=1, 2 and 16 respectively.

Thus, according to the principles of this invention, the numbers of sums of logical product terms for each macrocell 412 in programmable logic block 402 are variable and may range from a one sum of four product terms to four sums of four product terms, i.e., sixteen product terms, for each logic macrocell. Unlike most of the conventional industry standard programmable logic devices where product terms are preassigned and fixed with each macrocell either in an equal fixed distribution pattern, such as in the 16R8/16V8 architecture, or in a variable but fixed distribution pattern, such as the 22V10 architecture, according to the principles of this invention the product term resources are allocated to a specific macrocell as needed. This flexibility in allocation of product terms to macrocells results in significant increased utilization of the programmable AND array capability. Further, logic device 400 offers higher speed and lower cost over the prior art devices.

One of the main reasons associated with the prior art PAL structures' silicon inefficiency was fixed product term allocation for each macrocell. Most of the synchronous PAL devices have a fixed overhead of seven or more logic product terms and less than one or two control product terms for each output pin. Although fixed allocation of product terms allows flexibility in having product terms available when needed, the product terms are wasted if the application for which the device is used requires less than the fixed allocated resources. The fixed allocation of product terms to macrocells along with fixed coupling of the macrocells to the I/O pins or I/O cells, as explained previously, results in significant silicon inefficiency and difficulty in migrating the architecture to higher densities.

Extensive studies of the most popular PAL device usage patterns have shown that a device with four to sixteen product terms per macrocell that contains either a D- or T-type flip-flop would address 90-95% of the high density programmable logic needs. Any fixed allocation of product terms per macrocell, even two to three product terms per macrocell, is wasteful. Thus, programmable logic device 400 has overcome these limitations by having no fixed allocation of product terms per logic macrocell, but yet device 400 through logic allocator 411 has four to sixteen product terms programmably available for each logic macrocell 412.

Also, we have discovered that 85-95% of synchronous logic applications of PAL device structures do not require individual control product terms, such as RESET, PRESET, output enable or clock, for each logic macrocell. Hence, prior art devices with a plurality of control product terms for each macrocell are not silicon efficient when used for synchronous applications because the majority of the control product terms are wasted. Further, as described above, for maximum silicon efficiency, the logic macrocells must be decoupled from both the product term array and the I/O pins.

However, simply decoupling the logic macrocells from the I/O pins is not sufficient for maximum silicon efficiency. While the decoupling of the logic macrocells from the I/O pins restores the usage of a logic macrocell as a buried register, such decoupling does not address the scalability problem. The more important problem is decoupling the product term array from the macrocells so that as the number of macrocells is increased, the product term array size remains constant or nearly constant, i.e. changes by about one to five input lines.

Logic allocator 411 allocates, as described above, product term resources in a variable distribution among all macrocells 412 in a programmable logic block 402. Thus, logic allocator 411 essentially decouples unused macrocells 412 from product term array 410 and allocates up to twelve to sixteen product terms per used logic macrocell 412 with minimal speed penalty, i.e., the pin to pin signal delay time, which includes the signal delay time of logic allocator 411, is smaller than equivalent density prior art devices.

Logic allocator 411 contrasts sharply with the expander array concept of second generation EPLDs family. More particularly to solve the fixed allocation product term inefficiency problem, some of the second generation mid-density EPLDs opted for the concept of an expander product term array. The expander array concept, which is a variation of folded NANDs array concept, is one attempt to solve the fundamental problem of a fixed overhead of at least seven to eight product terms per output pin. The expander product term array is a collection of unallocated product terms that are available for expanding logic capability of the programmable logic device.

However, since the expander array overhead is an addition to the fixed overhead of eight product terms per macrocell (three to four logic product terms plus four control product terms), this approach appears to degrade the product term overhead problems rather than solve the problems. Further, the expander array introduces a significant speed delay because the time for a signal to traverse the array was about 13-16 nanoseconds for logic requiring more than three product terms.

Thus, the expander array concept not only imposes a significant performance penalty on logic intensive applications of more than three product terms, but also the concept imposes a significant cost penalty in the fixed overhead associated with the expander array and consequently larger die size for less logic intensive functions. Hence, unlike the expander array, logic allocator 411 of this invention not only decouples product term array 410 from logic macrocells 412 but also results in elimination of the large speed degradation for logic intensive applications while providing silicon die efficiency. Specifically, fixed resources are not wasted upon configuration of device 400 for a specific application.

Figure 21:
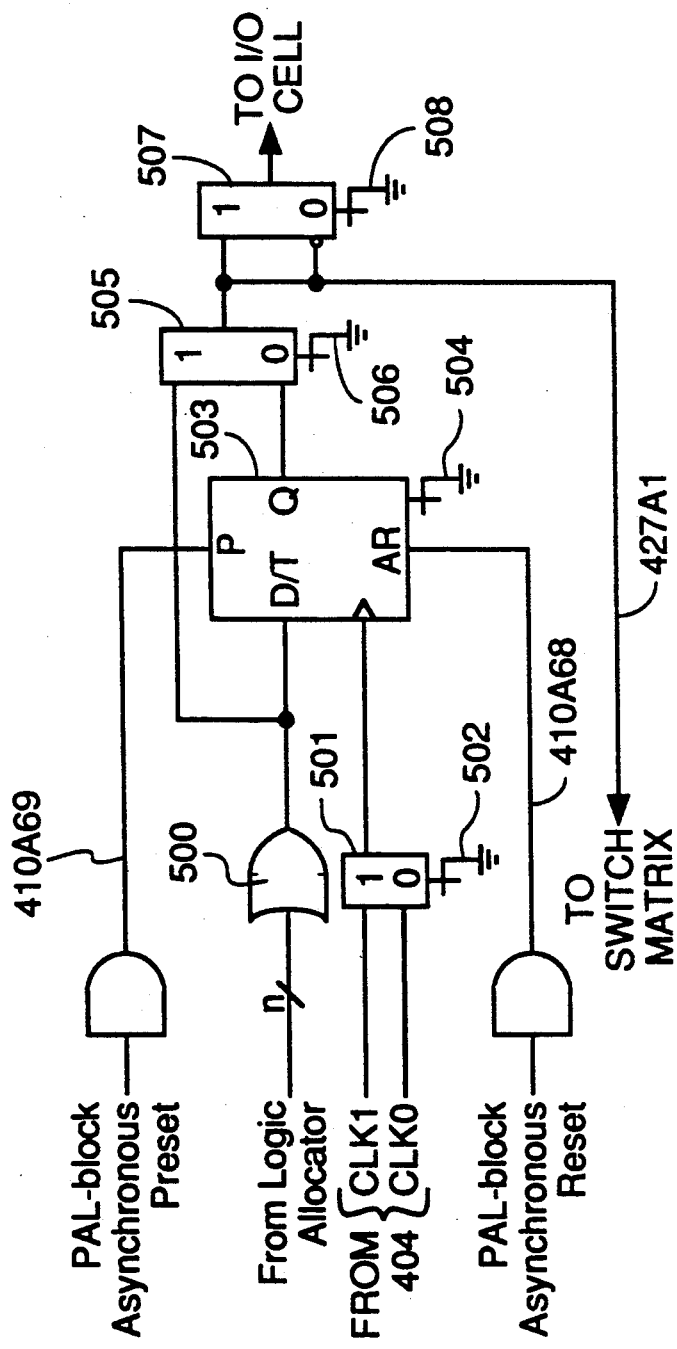
FIG. 21 is a schematic diagram of a programmable logic macrocell according to the principles of this invention.

Each logic macrocell 412A of this invention in family 400A is identical so that logical output macrocell 412A1, illustrated in FIG. 21, is representative of any logical macrocell 412A in this embodiment. In logical macrocell 412A1, a plurality of logic terms from logic allocator 411A are supplied on the n input lines to OR gate 500. The output line of OR gate 500 is connected to a first input terminal of a two-to-one programmable output path selection multiplexer 505 and to the input terminal of a rising-edge triggered programmable D or T type flip-flop 503 with asynchronous preset and asynchronous reset input terminals, i.e., a programmable storage element. Asynchronous preset line 410A69 is connected to the asynchronous preset terminal of flip-flop 503 and asynchronous reset product term line 410A68 is connected to the asynchronous reset terminal of flip-flop 503.

As previously described and illustrated in FIGS. 15 and 16, in each of the programmable logic devices of this invention, each programmable logic block 402 within the device has an asynchronous preset product term line and an asynchronous reset product term line which are connected to the appropriate terminals of each flip-flop 503 in the logic macrocells, including the buried logic macrocells, described more completely below.

Lines CLK0 and CLK1 from dedicated input pins 404A5, 404A6 are connected to the first and second input terminals respectively of a programmable two-to-one clock selection multiplexer 501. The state of programmable multiplexer 501 is determined by architectural cell 502. When cell 502 is programmed to a logical 0, the signal on line CLK0 is provided to the output line of multiplexer 501, which is connected to the clock input terminal of flip-flop 503. Conversely, when cell 502 is set to a logical 1, the signal on line CLK1 is provided to the clock input terminal of flip-flop 503.

Architectural configuration cell 504 is used to configure flip-flop 503 either as a D type flip-flop or a T type flip-flop. Output terminal Q of flip-flop 503 is connected to a second input terminal of programmable output path selection multiplexer 505. Architectural cell 506 configures multiplexer 505 so that either the signal on the first input terminal, a combinatorial signal, or the signal on the second input terminal, a registered signal, is provided to the output terminal of multiplexer 505.

Figure 22A:
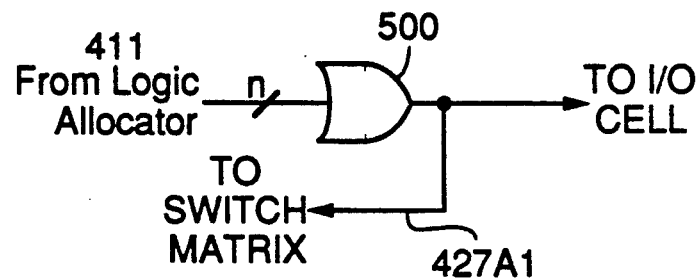
FIGS. 22A through 22F illustrate the possible configurations of the programmable logic macrocell in FIG. 21.
Figure 22B:
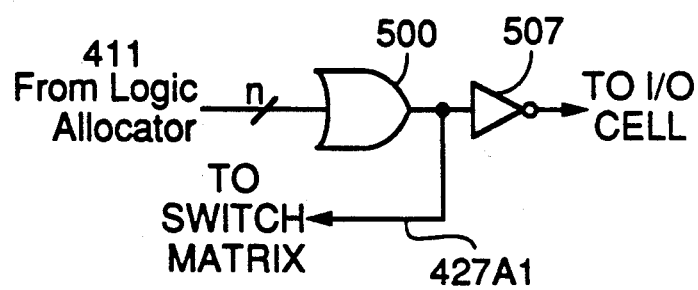

As illustrated in FIGS. 22A and 22B, when architectural cell 506 is programmed to a logical 1, the signal on the first input terminal from OR gate 500 is supplied to the output terminal of 505 so that logical macrocell 412A1 provides a combinatorial output. Conversely, when architectural cell 506 is programmed to a logical 0, the output signal from flip-flop 503 is provided on the output terminal of multiplexer 505 so that logic macrocell 412A-1 functions as a registered cell (FIGS. 22C–22F). The signal on the output terminal of multiplexer 505 (FIG. 21) is provided to line 427A1 which, as previously described, is one of the feedback lines to switch matrix 401.

The final structure in logic macrocell 412A1 (FIG. 21) is a programmable two-to-one polarity selection multiplexer 507 which has a first input terminal connected to the output terminal of multiplexer 505 and a second input terminal, which contains an inverter, that is also connected to the output terminal of multiplexer 505. Architectural cell 508 controls the operation of multiplexer 507.

When cell 508 is programmed to a logical 1, multiplexer 507 provides the signal from multiplexer 505 to the I/O cell. Conversely, when architectural cell 508 is programmed to a logical 0, the inverter inverts the signal from the output terminal of multiplexer 505 so that the complement of the signal from multiplexer 505 is provided to the I/O cell. Therefore, multiplexer 505 determines the polarity of the output signal from logic macrocell 412A1.

In another embodiment (not shown) multiplexer 507 is not included within the logic macrocell. Rather, an Exclusive OR gate, which is placed in the input line to storage element 503 just before the connection in the input line to multiplexer 505, is used to control output signal polarity. Hence, the important aspect is that logic macrocell 412A1 includes a means for controlling the logic signal polarity.

Thus, a logic macrocell, according to this invention, may be configured so that the output signals are either registered or combinational with an active high or an active low polarity. When the logic macrocell is used as a register, the logic macrocell can be further configured as a D type or T type flip-flop. Programmable polarity along with the built in T type flip-flop capability minimizes the number of product terms required for implementing some logic functions.

Figure 22C:
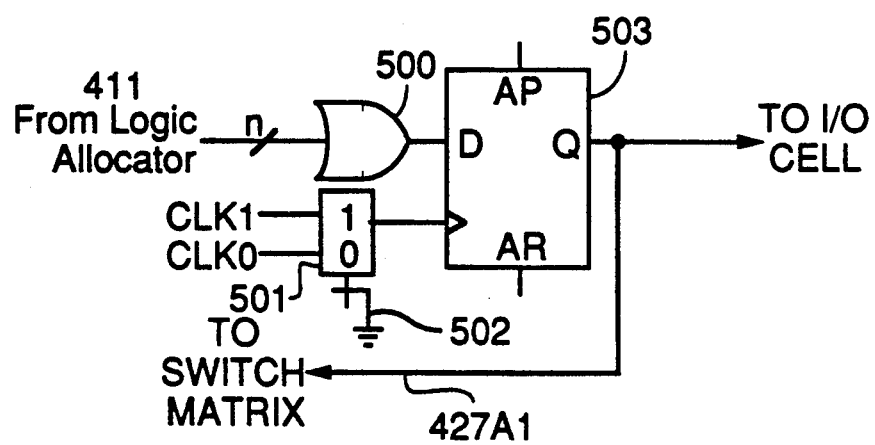
Figure 22D:
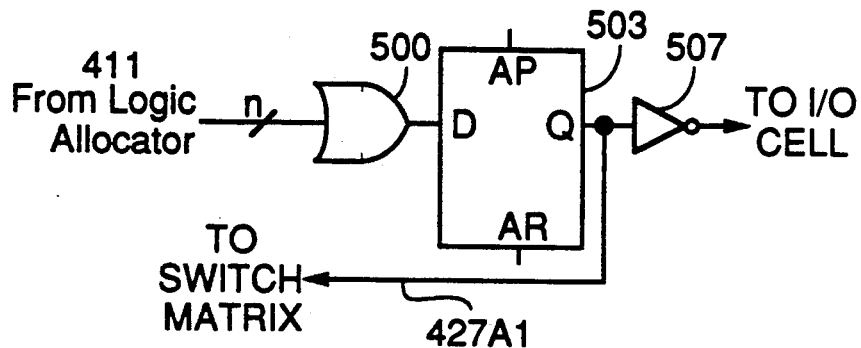
Figure 22E:
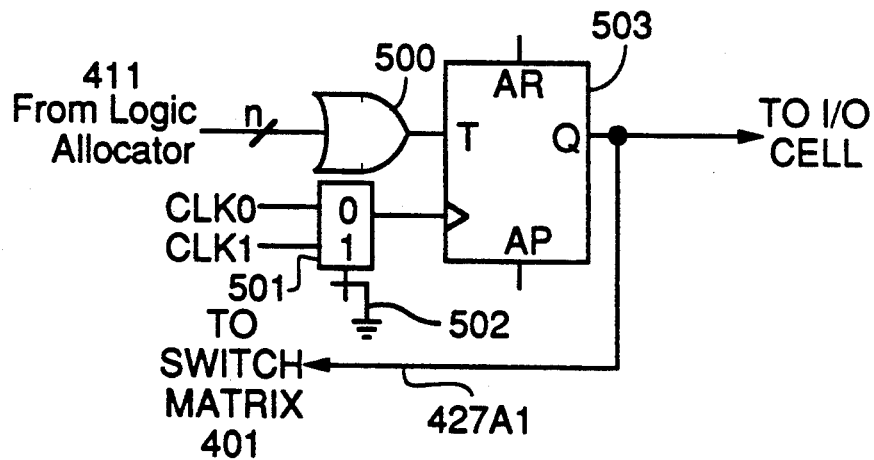
Figure 22F:
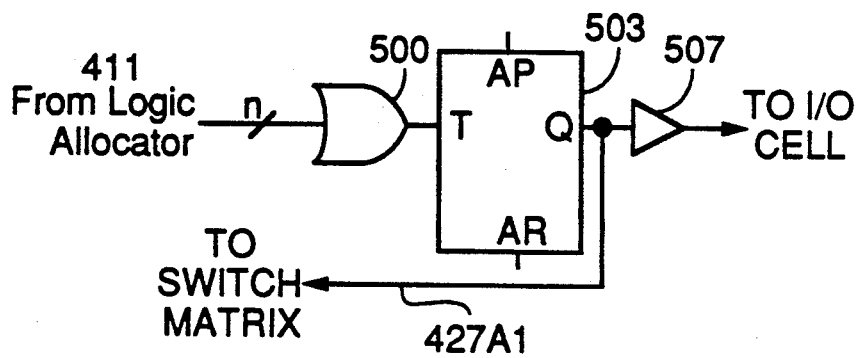

The possible configurations of logic macrocell 412A1 are shown in more detail on FIGS. 22A through 22F. FIG. 22A illustrates the cell configured as combinatorial cell with an active high polarity while FIG. 22B illustrates the cell configured as a combinatorial cell with an active low polarity. FIGS. 22C and 22D illustrate the cell configured as a registered cell with a D type flip-flop and active high and active low polarity while FIGS. 22E and 22F illustrate the cell as a T type flip-flop with active high and active low polarity respectively.

In FIGS. 22C through 22F, the signals on line CLK0 or line CLK1 may be selected by multiplexer 501 so each of these figures actually represent two possible configurations. Thus, in this embodiment, there are a total of ten possible configurations obtained with the four programmable architectural cells in logic macrocell 412A1, but the four programmable architectural cells can support a total of sixteen possible configurations.

Each output logic macrocell 412A1 provides an output signal to an I/O cell and also sends the output signal to switch matrix 401 via dedicated internal feedback line 427A1. The feedback signal is provided for either a registered or a combinatorial signal and is always available regardless of I/O cell configuration, as described more completely below. Since the feedback signal may be either registered or combinatorial, the feedback signal allows for buried sequential or combinational functions and consequentially frees I/O pins for use as input pins only. As previously described, each logic macrocell is decoupled from an I/O pin by an I/O macrocell.

In another embodiment (not shown), programmable flip-flop 503 is replaced by a programmable storage element that may be configured as any one of a D-type flip-flop, a T-type flip-flop or a latch. Architectural cells 504 and 506 are used to configure multiplexer 505 and the programmable storage element so that the signal on the output terminal of multiplexer 505 is one of: (i) a D-type flip-flop output signal; (ii) a T-type flip-flop output signal; (iii) a latch output signal; or (iv) a combinatorial output signal.

In yet another embodiment (not shown), programmable flip-flop 503 is replaced with a programmable storage element which functions as one of a T-type flip-flop, a D-type flip-flop, a J-K flip-flop, an RS flip-flop, or a transparent latch. Since in this embodiment the storage element functions in one of four modes, two architectural cells are required for the storage element. Also, an additional input line or lines may be required to support the function of the J-K flip-flop or the RS flip-flop. The storage element operates as a T-type flip-flop when both cells provide a logical zero; as a D-type flip-flop when the first cell provides a logical one and the second cell provides a logical zero; as a J-K flip-flop when the first cell provides a logical zero and the second cell provides a logical one; and as RS flip-flop when both cells provide a logical one.

As previously described, the programmable logic block of second family 400B of programmable logic device 400 of this invention includes a plurality of logic output macrocells 412BA and a plurality of buried logic macrocells 412BB. Logic macrocell 412BA, sometimes referred to as an output logic macrocell, is similar to logic macrocell 412A1 and the description of macrocell 412A1 is incorporated herein by reference.

Figure 23:
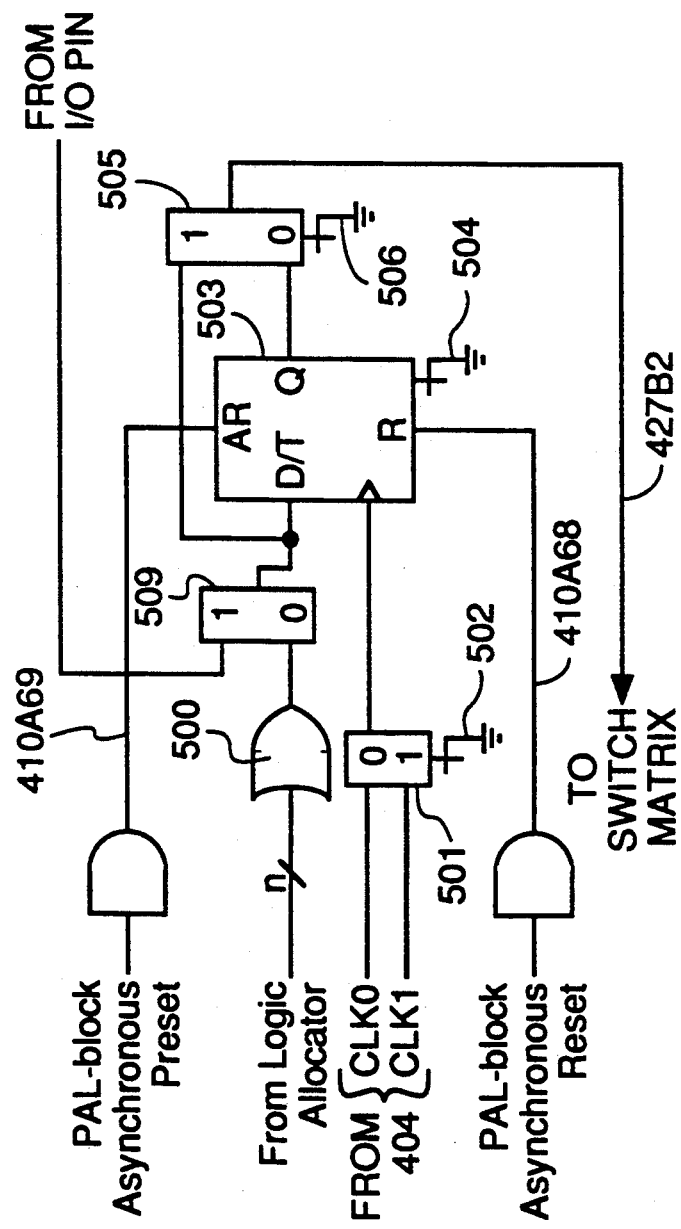
FIG. 23 is a schematic diagram of a programmable buried logic macrocell according to the principles of this invention.

Buried logic macrocell 412BB (FIG. 23) is also similar to output logic macrocells 412A, 412BA (FIG. 21) except buried logic macrocell 412BB does not have polarity control multiplexer 505. The output signal from buried logic macrocell 412BB (FIG. 23) is an internal feedback signal on line 427B2 to switch matrix 401B. Buried logic macrocells 412BB of this invention increase the logic capability of programmable logic device 400B and provide higher silicon efficiency than would be obtained without the cells.

In buried logic macrocell 412BB, OR gate 500 has an output line which is connected to a first terminal of a programmable input signal selection two-to-one multiplexer 509. The input line from I/O pin is connected to the second input terminal of programmable multiplexer 509. Architectural configuration cell 510 is used to configure multiplexer 509 so that either the signal from I/O pin or from OR gate 500 is provided to the output terminal of multiplexer 509.

The output terminal of multiplexer 509 is connected to the input terminal D/T of programmable flip-flop 503 and to the second input terminal of multiplexer 505. The remainder of buried logic macrocell 412BB is configured as previously described for output logic macrocell 412A1.

Figure 24A:
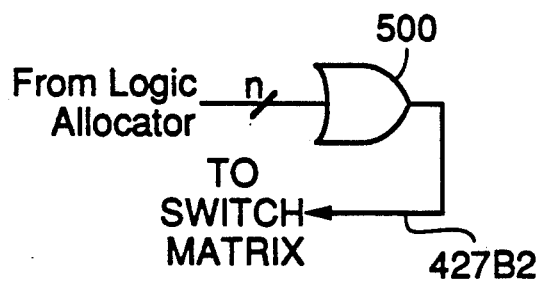
FIGS. 24A through 24F illustrate the various configurations for the buried logic macrocell in FIG. 23.
Figure 24:
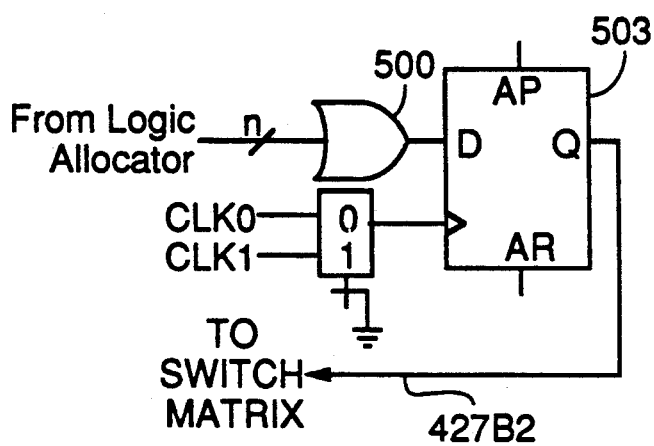
Figure 24C:
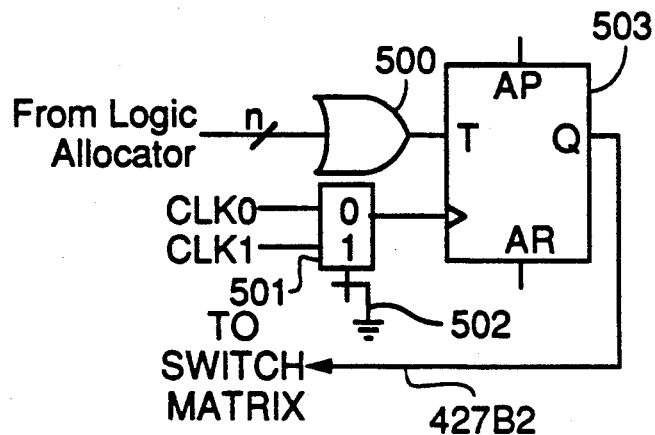

Buried logic macrocell 412BB also has ten different configurations. Buried logic macrocell 412BB can provide (i) a combinatorial output from logic allocator 411 to switch matrix 401 (FIG. 24A), (ii) a registered D type flip-flop signal to switch matrix 401 from logic allocator 411 (FIG. 24B) or (iii) a registered T type flip-flop signal to switch matrix 401 from logic allocator 411 (FIG. 24C).

Figure 24D:
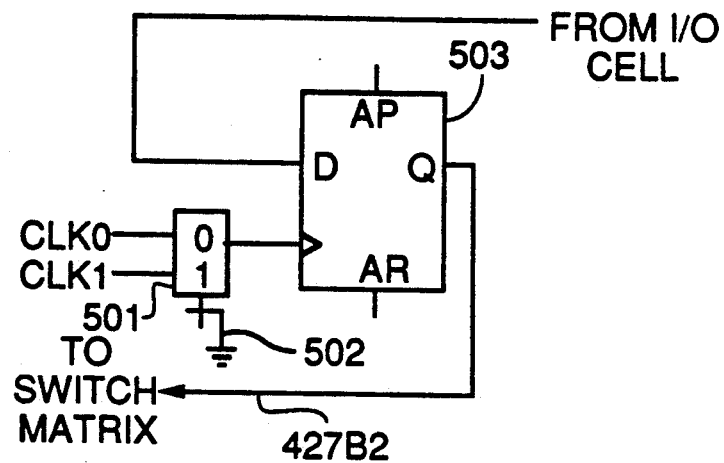
Figure 24E:
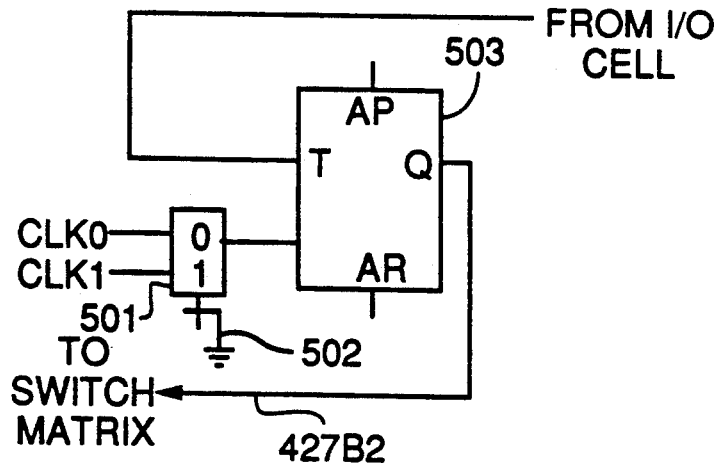
Figure 24F:
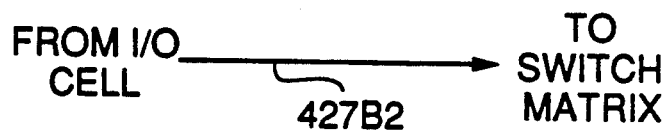

Similarly, the signal on the I/O pin can be selected by multiplexer 509 so that buried logic macrocell provides (i) a combinatorial input signal to switch matrix 401 (FIG. 24D), (ii) a registered input signal from a D type flip-flop to switch matrix 401 (FIG. 24E) or (iii) a registered input signal from a T type flip-flop to switch matrix 401 (FIG. 24F). Each of the registered signals can be clocked with either of the signals on lines CLK0, CLK1. Alternatively, buried logic macrocells 412BB could include the alternative storage elements described above for flip-flop 503 in logic output macrocell 412A2. That description is incorporated herein by reference.

A significant feature of buried logic macrocell 412BB is the dual mode of operation, i.e., the buried logic macrocell's ability to function either as an output cell with feedback to switch matrix 401 or as a registered input cell. Buried logic macrocell 412BB along with the by-passable registered input increases significantly the utilization and silicon efficiency of programmable logic device 400B. Both dedicated input pin signals and buried logic macrocell feedback signals are available to switch matrix 401B at all times. This permits the simultaneous use of either the dedicated input pin signals and the registered input signals from buried logic macrocells, or the dedicated input pin signals plus the buried registered feedback signals Both output logic macrocells 412A, 412BA and buried logic macrocells 412BB are clocked on an individual macrocell basis by a signal from one of the two synchronous clock input pins. This clocking allows the user to implement flexible and multiple state machines in a single device. Further, even if either of the clock input pins is used as a clock signal source, the pin is still available as an input pin to the switch matrix.

As previously described, all the logic macrocells including any buried logic macrocells in the programmable logic block are controlled by a common asynchronous reset product term and a common asynchronous preset product term. Thus, for each programmable logic block, all the flip-flops in the logic macrocells whether in an output logic macrocell or a buried logic macrocell are simultaneously initialized.

In this embodiment, the primary factors in the architecture are performance and cost in an optimal silicon efficient structure. For example, many programmable logic devices support both synchronous and asynchronous logic applications on a single chip. However, synchronous and asynchronous logic applications needs are different. While this configuration results in a more flexible structure, the configuration invariably requires compromise which in turn results in an inefficient structure in terms of use, speed, and silicon efficiency.

One specific example is the fixed allocation of individual reset, preset, clock, and output enable product terms per macrocell. While such an allocation of product terms provides a great deal of flexibility, a fixed allocation of four product terms per macrocells—a very expensive proposition for synchronous logic applications—is required. The control product terms essentially are wasted for synchronous logic applications. Also, individual product term allocation requires compromises for clock selection for logic macrocells because the macrocells are limited to only one clock signal from an external synchronous clock pin, which, in turn, restricts the device to a single synchronous state machine.

I/O macrocell 413 of this invention is illustrated in FIG. 25. I/O macrocell 413 has a single tristate buffer 540 coupled to I/O pin 541. The input terminal of tristate buffer is connected to output line from an output logic macrocell, for example logic macrocell 412A1 or logic macrocell 412BA. The control terminal of buffer 540 is connected to the output line of a four-to-one programmable multiplexer 542. The output terminal of buffer 540 is also coupled to switch matrix 401A in the first family 400A of devices and to buried macrocell multiplexer 509 and switch matrix 401B in the second family 400B of devices.

Two output enable product terms are connected to the first two inputs of four-to-one multiplexer 542. The third input terminal is tied to power supply voltage $V_{cc}$ and the fourth terminal is grounded. Multiplexer 542 selectively provides an output enable signal to buffer 540.

Four-to-one multiplexer 542 has two architectural cells 543, 544. When first cell 543 is programmed to a logical 0 and second cell 544 is programmed to a logical 1, the first output enable product term is supplied to the control terminal of tristate buffer 540. When both architectural cells 543, 544 are programmed to a logical 1, the second output enable product term is supplied to the output control terminal of tristate buffer 540. When architectural cell 543 is programmed to a logical 1 and cell 544 to a logical 0, power supply voltage $V_{cc}$ is supplied to the terminal of buffer 540 and when both of the architectural cells 543, 544 are programmed to a logical 0 the terminal of tristate buffer 540 is grounded.

When power supply voltage $V_{cc}$ is supplied to tristate buffer 540, buffer 540 is permanently enabled for use as an output buffer and conversely when the control terminal is grounded, buffer 540 is tristated so that I/O pin 541 functions permanently as an input pin. When either of the output enable terms is applied to the control terminal, the I/O pin functions as a bidirectional I/O pin which is controlled by the product term.

As previously explained, the two product terms are common to eight I/O cells. The two product terms permit the bank of eight I/O cells to be configured as two separate partial banks within the bank of eight I/O macrocells. One of the product terms controls the first partial bank of I/O macrocells and the other product term controls the second partial bank of I/O macrocells. Thus, the use of two product terms for each I/O macrocell significantly enhances the capability of the PLDs 400.

An important feature of the I/O cell structure of this invention is that this structure decouples logic macrocells 412 from I/O pins 403. The decoupling of logic macrocells 412 from I/O pins 403 has two major benefits. First, the decoupling provides dual feedback capability for programmable switch matrix 401 and second the decoupling moves the connectivity issue to switch matrix 401 where it belongs rather than prefixing at the pin. Dual feedback capabilities are beneficial for applications requiring large amounts of buried logic such as counters, shift registers, and complex state machines and I/O intensive applications requiring large amounts of pins, reserving the macrocell functions for buried logic.

Switch interconnect matrix 401 is arranged so that each signal passing through this matrix passes through the same number of components within the switch matrix. This insures that the time delays for all signals passing through switch matrix 401 are substantially the same and allows resynchronization, if desired, of groups of contemporaneous signals passing through switch matrix 401.

To achieve maximum speed through switch matrix 401, the matrix has been purposely not implemented as a full cross point switch. The switch matrix could be implemented as a full cross-point switch to achieve enhanced functionality. However, the enhanced functionality of the full cross-point switch matrix results in diminished speed performance and increased die size.

Switch matrix 401 was selected to provide a balance between functionality, speed performance and die size. Switch matrix 401 is structured as a single, centralized switch to achieve the uniform, fixed delay time for all signal paths through switch matrix 401, as described above. However, switch matrix 401 may also be implemented as multiple decentralized switches. In view of the description of switch matrix 401 of this invention and the full cross-point switch matrix, other switch matrices, having varying degrees of functionality, speed and die size, could be designed and implemented by those skilled in the art.

Figure 26:
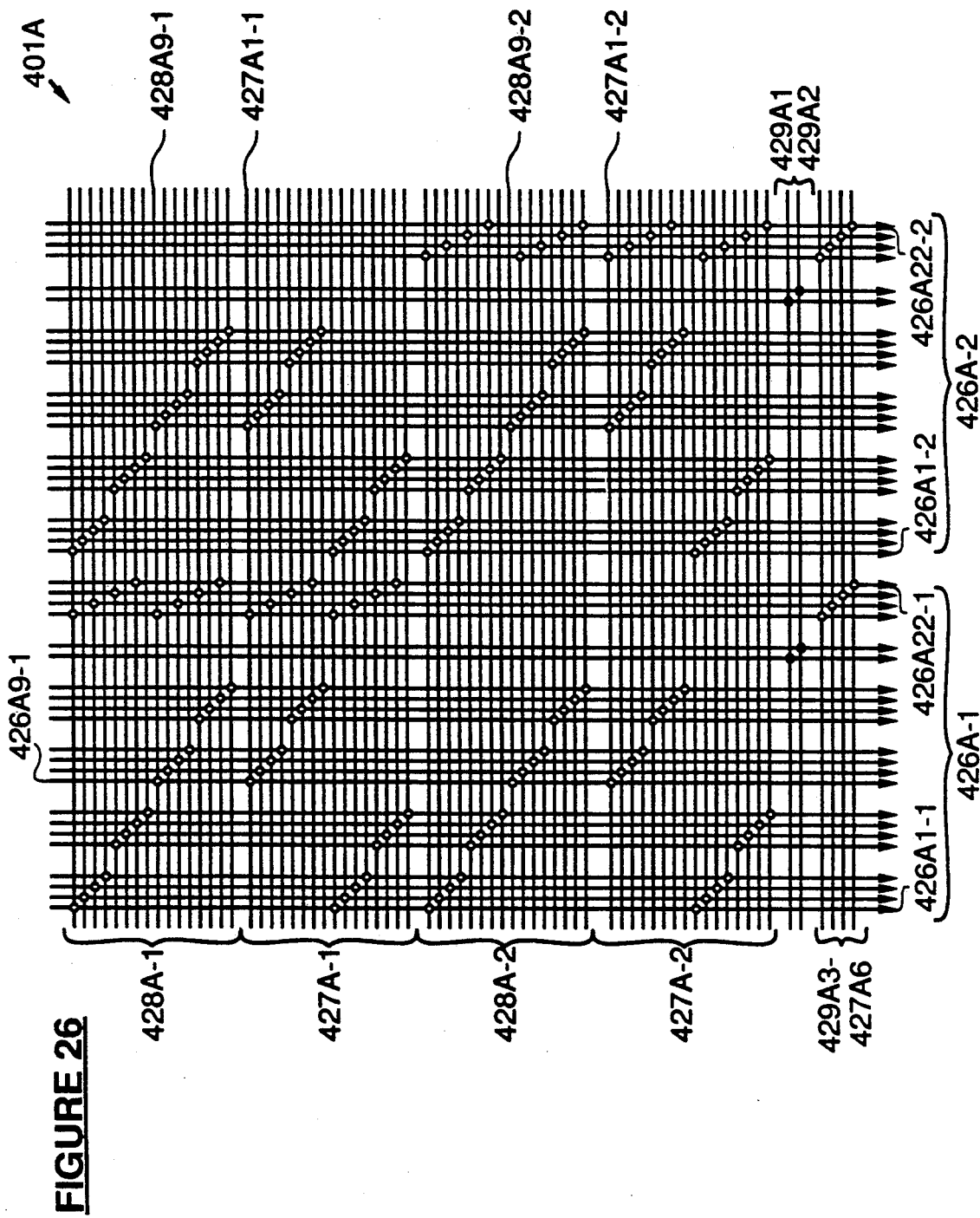
FIG. 26 is a diagram of the programmable multiplexers in switch matrix 401A.

Switch matrix 401A for first family 400A of programmable logic devices 400 of this invention is illustrated in FIG. 26. In FIG. 26, the horizontal lines represent signal input lines to switch matrix 401A. The vertical lines represent the input lines to programmable logic blocks 402A-1, 402A-2. The circles at the intersections of the horizontal and vertical lines represent programmable connections. Specifically, as explained more completely below, switch matrix 401A includes a multiplicity of four-to-one programmable multiplexers and a multiplicity of five-to-one programmable multiplexers.

The upper most group of sixteen horizontal lines are lines 428A-1 (FIG. 26) which provide input signals from I/O pins 403A-1 (FIG. 12A). The next group of sixteen horizontal lines are lines 427A-1 (FIG. 26) from logic macrocells 412A-1 (FIG. 12A). Accordingly, these lines provide feedback signals to switch matrix 401A from logic macrocells 412A-1. The third group of sixteen horizontal lines are lines 428A-2 (FIG. 26) from I/O pins 403A-2 (FIG. 12A) and the fourth group of sixteen horizontal lines are lines 427A-2 (FIG. 26) from logic macrocells 412A-2. The next pair of lines are dedicated input lines from dedicated input pins 404A-1 and 404A-2. The bottom six horizontal lines are connected to the four dedicated input pins 404A-3, 404A-4 and the two clock/input pins 404A-5 and 404A-6.

The first twenty-two vertical lines 426A1-1 through 426A22-1 from the left-hand side of switch matrix 401A are connected to input lines 426A-1 to programmable logic block 402A-1. The other twenty-two vertical lines 426A1-2 through 426A22-2 on the right-hand side of switch matrix 401A are input lines 426A-2 of programmable logic block 402A-2.

The portion of switch matrix 401A associated with a programmable logic block has a total of twenty programmable multiplexers which programmably couple selected switch matrix input lines, the horizontal lines in FIG. 26, to selected switch matrix output lines, the vertical lines in FIG. 26, which in turn are the input lines to a programmable logic block. Thus, switch matrix 401A consists of a total of forty programmable multiplexers.

In each group of twenty programmable multiplexers associated with the input lines of a programmable logic block, sixteen of the multiplexers are four-to-one multiplexers, and four are five-to-one multiplexers. Two of the input lines for each programmable logic block are connected directly to dedicated input pins by switch matrix 401A. In FIG. 26, each vertical line is either an output line from one of the multiplexers or one of the two fixed lines. The circles on a vertical line represent programmable connections between the input lines and the output line of the particular multiplexer.

For example, the ninth vertical line from the left-hand side of the matrix is input line 426A9-1 to programmable logic block 402A-1 and is the output line of a programmable four-to-one multiplexer. The input lines to this multiplexer are line 428A9-1 from the ninth I/O pin of programmable logic block 402A, line 427A1-1 from the first logic macrocell 402A1-1 and the corresponding lines from the second programmable logic block 402A-2.

Thus, sixteen of the input signals for both programmable logic blocks 402A-1, 402A-2 are derived from four different sources, i.e., two I/O pin sources and two macrocell feedback sources rotated to allow dual feedback capability.

More specifically, each four-to-one programmable multiplexer has two architectural cells which are used to configure the multiplexer so that only one of the input lines is connected to the output line. The architectural cells provide an input select signal to the multiplexer. The resource selection for each group of multiplexers is presented in Tables 4 and 5. Note in Table 5, the multiplexers receive input signals from only a single programmable logic block so that only the multiplexers associated with block 402A-1 are given in Table 5. The architectural cells configurations for block 402A-2 is the same as that shown for block 402A-1 except the sources are from block 402A-2.

TABLE 4

Four-to-One Programable Multiplexer Signal Selection in Switch Matrix 401A of Family 400A

| Architectural Cell 1 | Architectural Cell 2 | Global Signal Selections |
| --- | --- | --- |
| 0 | 0 | I/O pin input signals from PLB 402A-1 |
| 0 | 1 | Feedback signals from logic macrocells in PLB 402A-1 |
| 1 | 0 | I/O pin input signals from PLB 402A-2 |
| 1 | 1 | Feedback signal from logic macrocells in PLB 402A-2 |

TABLE 5

Signal Selection for Five-to-One Programmable Multiplexer in Switch Matrix 401A of Family 400A

| Architectural Cell 1 | Architectural Cell 2 | Architectural Cell 3 | Global Signal Selections |
| --- | --- | --- | --- |
| 0 | 0 | 0 | I/O pin input signals from PLB 402A-1 |
| 0 | 1 | 0 | Feedback signals from logic macrocells in PLB 402A-1 |
| 1 | 0 | 0 | I/O pin input signals from PLB 402A-1 |
| 1 | 1 | 0 | Feedback signals from logic macrocells in PLB 402A-1 |
| 0 | 0 | 1 | Signal from dedicated input pin |

Notice that in switch matrix 401A each input signal other than the dedicated input pin signals has at least two different entry points to a programmable logic blocks. Thus, the input signal sources to switch matrix 401A are appropriately rotated so that for any logic macrocell and the I/O pin associated with that logic macrocell, both the logic macrocell feedback signal and the signal on the corresponding I/O pin are available to each programmable logic block in device 400A.

For example, the signal on the first I/O pin is an input to the first four-to-one multiplexer while the feedback signal is an input to the ninth four-to-one multiplexer. Thus, this rotation allows buried registered capability without increasing the size of the product term array.

Hence, unlike prior art devices, the product term array size is independent of the number of logic macrocells.

Also notice that each programmable logic block may receive the same input signals or different input signals. This allows the structure to function either as a monolithic array with a maximum of twenty-two inputs common to each array or two separate relatively independent split arrays with a total maximum number of forty-two input signals.

An alternate representation of switch matrix 401A is illustrated in FIG. 27A and 27B. For ease of presentation, blocks 402A-1 and 402A-2 are represented as blocks "A" and "B" respectively. Similarly, logic macrocell 412A1-1 becomes A1 and logic macrocell 412A1-2 becomes B1 so that the macrocells in block 420A-1 range from macrocell A1 to macrocell A16 and in block 402A-2 from macrocell B1 to B2. The feedback lines are represented by the macrocell number. The I/O pin associated with a macrocell is represented by the macrocell number followed by a carat " " Dedicated input pins 404A are numbered I1 to I6.

Figure 28A:
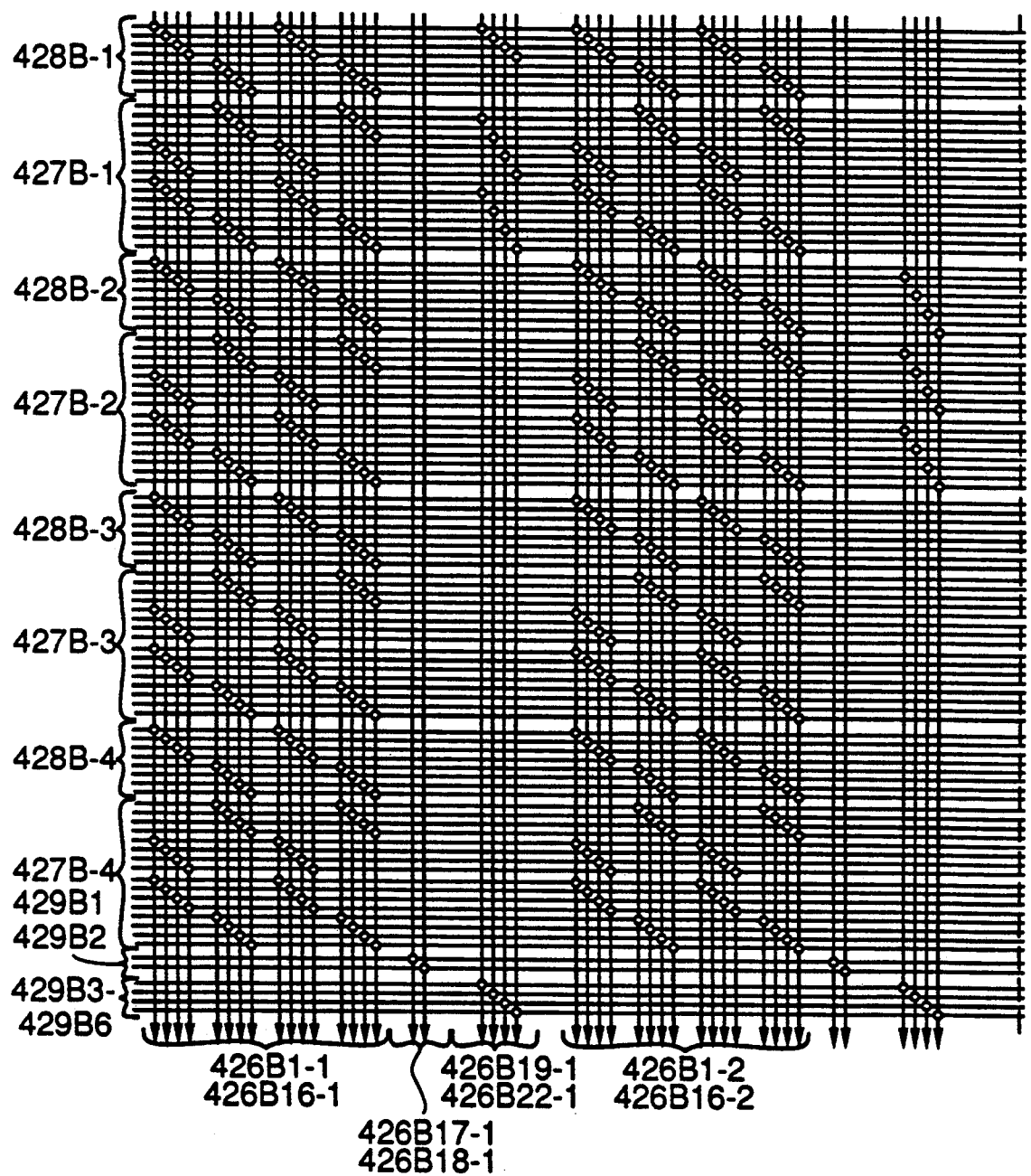
FIGS. 28A and 28B are a schematic diagram of the programmable multiplexers of switch matrix 401B according to this invention.
Figure 28B:
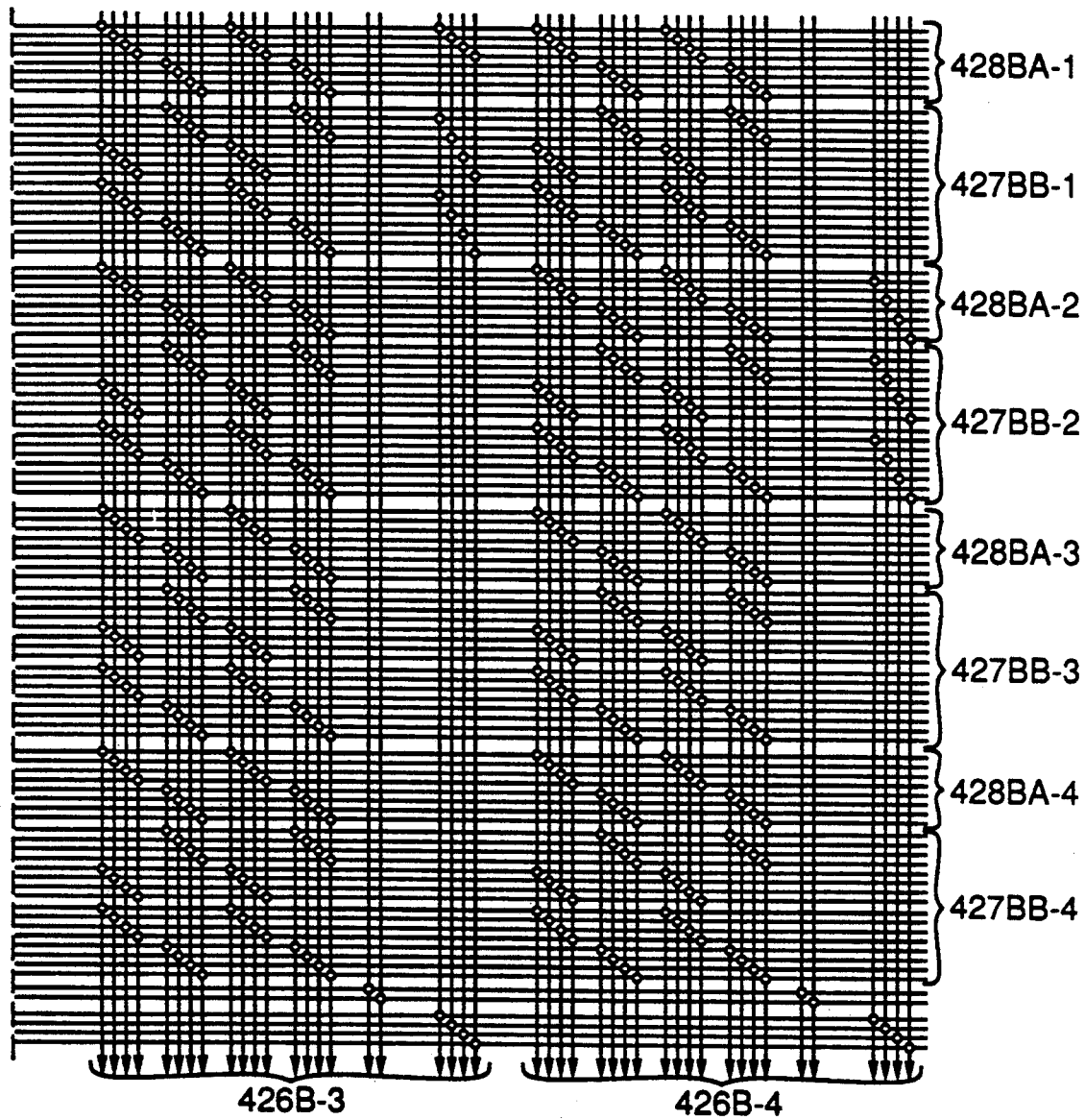

Switch matrix 401B for the first family 400B of the programmable logic devices of this invention is illustrated in FIGS. 28A and 28B. Switch matrix 401B is a continuous device, but switch matrix 401B is broken into two parts in the Figures for ease of presentation. The horizontal lines represent signal input lines to switch matrix 401B. The vertical lines represent the input lines to programmable logic blocks 402B-1 through 402B-4. The circles at the intersections of the horizontal and vertical lines represent programmable connections. Specifically, as explained more completely below, switch matrix 401B includes a multiplicity of twelve-to-one programmable multiplexers and a multiplicity of four-to-one programmable multiplexers.

The uppermost group of eight horizontal lines are lines 428B-1 (FIGS. 28A, 28B) which provide input signals from I/O pins 403B-1 (FIG. 14A) (associated with programmable logic block 402B-1). The next group of sixteen horizontal lines are lines 427B-1 (FIGS. 28A, 28B) from logic macrocells 412B-1 (FIG. 14A). The first group of eight lines 427BA-1 in lines 427B-1 are from output logic macrocells 412BA-1 and the second group of eight lines in lines 427B-1 are from buried logic macrocells 412BB-1 of programmable logic block 402B-1. Accordingly, lines 427B-1 provide feedback signals from logic macrocells 412B-1.

Horizontal lines 428B-2, 427B-2, 428B-3, 427B-3, 428B-4, 427B-4 are the equivalent lines for programmable logic blocks 402B-2, 402B-3 and 402B-4 respectively as the lines 428B-1, 427B-1 for programmable logic block 402B-1. The next pair of lines 429B1, 429B2 are dedicated input lines from dedicated input lines 404B-1 and 404B-2. The bottom four horizontal lines are connected to the dedicated input pins 404B-3, 404B-4 and the two clock/input pins 404B-5 and 404B-6.

The vertical lines in FIGS. 28A and 28B are arranged in four groups of twenty-two lines. Each group of twenty-two lines is a set of input lines for one of programmable logic blocks 402B in device 400B. Moreover, the group of sixteen vertical lines 426B1-n to 426B16-n, where n=1, 2, 3, 4, in each of the four groups of lines, are programmably coupled to the horizontal input lines in an identical manner. The group of two lines 426B17-n and 426B17-n is each of the four groups of twenty-two lines are connected to dedicated input lines 429B1, 429B2 respectively.

The last four vertical lines in each of the four groups of twenty-two lines are programmably coupled to (i) dedicated input lines 429B3 through 429B6 and (ii) selected input lines from the programmable logic block to which the four vertical lines are input lines.

The first twenty-two vertical lines 426B1-1 through 426B22-1 (FIG. 28A) from the left-hand side of switch matrix 401B are input lines 426B-1 to programmable logic block 402B-1. The other twenty-two vertical lines 426B1-2 through 426B22-2 on the right-hand side of switch matrix 401B are input lines 426B-2 to programmable logic block 402B-2. Similarly, the two pairs of twenty-two lines 426B1-3 to 426B22-3 and 426B1-4 to 426B22-4 are input lines to programmable logic blocks 402B-3 and 402B-4 respectively.

The portion of switch matrix 401B associated with a programmable logic block has a total of twenty programmable multiplexers which programmably couple the switch matrix input lines, the horizontal lines in FIGS. 28A, 28B to the switch matrix output lines, the vertical lines in FIGS. 28A, 28B, which are the input lines to a programmable logic block. Thus, switch matrix 401B consists of a total of eighty programmable multiplexers.

In each group of twenty programmable multiplexers associated with the input lines of a programmable logic block, sixteen of the multiplexers are twelve-to-one multiplexers, four are four-to-one multiplexers. Two of the input lines for each programmable logic block are connected directly to dedicated input pins by switch matrix 401B. In FIGS. 28A and 28B, each vertical line is either an output line from one of the multiplexers or one of the two fixed lines. The circles on that vertical line represent programmable connectors between the input lines and the output line of the particular multiplexer.

Sixteen of the input signals for each programmable logic blocks 402B-1, 402B-2, 402B-3, 402B-4 are derived from twelve different sources, i.e., four I/O pin sources, four output logic macrocell feedback sources and four buried logic macrocell feedback sources, rotated to allow dual feedback capability.

More specifically, each twelve-to-one programmable multiplexer has four architectural cells which are used to configure the multiplexer so that only one of the input lines is connected to the output line. The resource selection for each group of multiplexers is presented in Tables 6 and 7.

TABLE 6

Twelve-to-One Programmable Multiplexer Selection in Switch Matrix 401B

| Cell 1 | Cell 2 | Cell 3 | Cell 4 | Global Signal Selection |
|---|---|---|---|---|
| 0 | 0 | 0 | 0 | I/O pin input signals from PLB 402B-1 |
| 0 | 0 | 0 | 1 | Feedback signals from output logic macrocells in PLB 402B-1 |
| 0 | 0 | 1 | 0 | Feedback signals from buried logic macrocells in PLB 402B-1 |
| 0 | 0 | 1 | 1 | I/O pin input signals from PLB 402B-2 |
| 0 | 1 | 0 | 0 | Feedback signals from output logic macrocells in PLB 402B-2 |
| 0 | 1 | 0 | 1 | Feedback signals from buried logic macrocells in PLB 402B-2 |
| 0 | 1 | 1 | 0 | I/O pin input signals from PLB 402B-3 |
| 0 | 1 | 1 | 1 | Feedback signals from output logic macrocells in PLB 402B-3 |
| 1 | 0 | 0 | 0 | Feedback signals from buried logic macrocells in PLB 402B-3 |
| 1 | 0 | 0 | 1 | I/O pin input signals from PLB 402B-4 |
| 1 | 0 | 1 | 0 | Feedback signals from output logic macrocells in PLB 402B-4 |
| 1 | 0 | 0 | 1 | Feedback signals from buried logic macrocells in PLB 402B-4. |

TABLE 7

Four-to-One Programmable Multiplexer Selection in Switch Matrix 401B

| Architectural Cell 1 | Architectural Cell 2 | Global Signal Selections |
|---|---|---|
| 0 | 0 | I/O pin input signals from PLB 402B-n |
| 0 | 1 | Feedback signals from output logic macrocells in PLB 402B-n |
| 1 | 0 | Feedback signals from buried logic macrocells in 402B-n |
| 1 | 1 | Dedicated Input pin signal |

Notice that in switch matrix 401B each input signal other than the dedicated input pin signals has at least two different entry points to a programmable logic block. Thus, the input signal sources to switch matrix 401B are appropriately rotated so that for any output logic macrocell and the I/O pin associated with that output logic macrocell, both the output logic macrocell feedback signal and the signal on the corresponding I/O pin are available to each programmable logic block in device 400B. Thus, this rotation allows buried registered capability for the output logic macrocells without increasing the size of the product term array. Also notice that each programmable logic block may receive the same input signals or different input signals. This allows the structure to function either as a monolithic array with a maximum of twenty-two inputs or four separate relatively independent split arrays with a total maximum number of eighty-two input signals.

An alternative representation of switch matrix 401B is illustrated in FIGS. 29A through 29D. For ease of presentation, programmable logic blocks 402B-1 through 402B-4 are represented as blocks "A", "B", "C", and "D", respectively. Similarly, output logic macrocells and buried logic macrocells are represented by the block letter and the number of the position of the macrocell in column 412B. Accordingly, the output logic macrocells and buried macrocells for programmable logic block A are numbered Al through A16 where A1, A3, ..., A15 are output macrocells and numbers A2, A4, ..., A16 are buried macrocells. The macrocells in the other programmable logic blocks are similarly renumbered. As previously indicated for switch matrix 401A, the feedback lines are represented by the macrocell number. The I/O pin associated with a macrocell is represented by the macrocell number followed by a carat "∧". The dedicated input pins 404B are numbered I1 through I6 respectively. FIGS. 29A through 29D are completely equivalent to FIGS. 28A and 28B and simply are another way of illustrating the programmable multiplexer input and output lines that comprise switch matrix 401B.

In the previous embodiments of the programmable logic devices 400A, 400B, switch matrix 401 drove twenty-two input lines for each programmable logic block in the device. The important aspect, as previously described, is that the number of input lines is fixed and does not change with changes in the number of logic macrocells or dedicated input pins. In another embodiment (not shown) the architecture of the programmable logic device is similar to device 400A. However, in this embodiment the device has four identical programmable logic blocks, each substantially identical to programmable logic block 402A, as previously described. However, in this embodiment, the number of input lines to the product term array is twenty-four. The switch matrix for this embodiment is illustrated in FIGS. 30A through 30D.

Again, the four programmable logic blocks are identified by a letter "A", "B", "C", "D". The logic macrocells are numbered 1 through 16 so that logical macrocell A10 is the tenth logic macrocell in the first programmable logic block. I/O pins associated with a logic macrocell are indicated by a carat "∧". As shown in FIGS. 30A through 30D, the switch matrix consists of twenty-four thirteen-to-one programmable multiplexers for each programmable logic block. Accordingly, the switch matrix has fifty-two programmable multiplexers.

In FIGS. 30A through 30D, the leftmost column represents the input line to the programmable logic block and the other numbers in the row with the input line represent the input lines to the thirteen-to-one programmable multiplexer. Accordingly, switch matrix 401 of this invention may be implemented using a variety of different sized programmable multiplexers and in each case the switch matrix has a fixed predictable delay time and provides a multiplicity of paths for each input signal to pass through the switch matrix to an input line of a programmable logic block.

Thus, as described above, programmable logic devices 400A, 400B of this invention have a plurality of programmable connections. The programmable connections are controlled by a multiplicity of electrically erasable cells. The number of cells depend upon the specific implementation, but the number of cells for device 400A (FIG. 12A) and for device 400B (FIG. 14A) are given in Table 8 and Table 9 respectively.

TABLE 8

| Device 400A | | |
|---|---|---|
| $E^2$ cells for the AND-OR array | 2 × 44 × 70 = | 6,160 |
| $E^2$ cells for the programmable logic macrocells | 2 × 16 × 4 = | 128 |
| $E^2$ cells for the programmable input/output macrocells | 2 × 2 × 16 = | 64 |
| $E^2$ cells for the | 2 × 2 × 16 = | 64 |

TABLE 8-continued

| Device 400A | | |
|---|---|---|
| logic allocator | | |
| $E^2$ cells for the | 2 × 3 × 4 = | 24 |
| switch matrix | 2 × 2 × 16 = | 64 |
| | TOTAL | 6,504 |

TABLE 9

| Device 400B | | |
|---|---|---|
| $E^2$ cells for the AND-OR array | 4 × 44 × 68 = | 11,968 |
| $E^2$ cells for the programmable logic macrocells | 4 × 16 × 4 = | 256 |
| $E^2$ cells for the programmable input/output macrocells | 4 × 2 × 8 = | 64 |
| $E^2$ cells for the logic allocator | 4 × 2 × 16 = | 128 |
| $E^2$ cells for the | 4 × 2 × 4 = | 32 |
| switch matrix | 4 × 4 × 16 = | 256 |
| | TOTAL | 12,704 |

In the preceding discussion, for ease of expression, only programmable architectural cells have been described. The cells in these applications may be fuses, EPROM cells or EEPROM cells in accordance with the invention. The architectural cells are a means for providing either an input select signal or an output select signal to a programmable device so that the device passes a desired signal therethrough.

The preceding discussion has described a programmable AND/OR array as an assembly of AND gates used to form products of logical variables, followed by an assembly of OR gates to form sums of such product terms. However, using logical transforms known to those skilled in the art, in a preferred embodiment the programmable AND, fixed OR array (AND/OR array) is replaced by a programmable NOR, fixed NOR array. The use of NOR logic provides enhanced speed over the equivalent programmable AND/OR array, but the logic functions of the two arrays are equivalent.

The AND/OR array also may include inverters that form complements ($\overline{A}$) of the input signals (A). The AND/OR array may also be arranged as an assembly of OR gates to form sums of logical variables, followed by an assembly of AND gates to form products of such sums, by utilizing the DeMorgan theorems $$\overline{A \cdot B} = \overline{A} + \overline{B},$$

$$\overline{A + B} = \overline{A} \cdot \overline{B}$$

in a manner well known to those of ordinary skill in the art. For example, the sum of logical product terms $A \cdot B + C \cdot D + E \cdot F \cdot G$ may be written as the complement of the product of sums of complemented variables, viz $A \cdot B + C \cdot D + E \cdot F \cdot G = \overline{(\overline{A} + \overline{B}) \cdot (\overline{C} + \overline{D}) \cdot (\overline{E} + \overline{F} + \overline{G})}$.

For ease of reference, a logical sum of logical products and a logical product of logical sums are collectively referred to herein as "logical sum/product terms."

The gate configuration illustrated in FIG. 15 for example is expressed in the PAL mode, where the AND gates are normally programmable and the OR gates are normally fixed. Using the DeMorgan theorems applied above and incorporating signal inverters in the signal paths, one can also express the gate configuration in terms of programmable OR gates and fixed AND gates. More generally, one may configure the gates in a PLA mode, wherein both AND gates and OR gates are programmable.

The switching characteristics of the programmable logic device 400 of this invention are given in Table 10. The parameter symbols and parameters definitions are described more completely in *PAL Device Data Book*, Advanced Micro Devices, Sunnyvale, CA, pp. 5-533 to 5-535 (1988), which are incorporated herein by reference.

external pin delay time and the setup time of the flip-flop. Hence, a state machine can be implemented in device 400 running at a 50 MHz system clock frequency. Data signals can be sent off chip for communicating either to a second device or possibly externally feeding back to device 400 at 50 MHz clock rate.

In addition to supporting the 50 MHz external clock frequency, the family of devices 400 supports internal clock frequencies of 62.5 MHz and pipelined frequency

TABLE 10
SWITCHING CHARACTERISTICS OVER COMMERCIAL OPERATING RANGES

| Parameter Symbol | Parameter Description | | | −15 Min. | −15 Max. | −20 Min. | −20 Max. | Unit |
|---|---|---|---|---|---|---|---|---|
| $t_{PD}$ | I/O, Input, or Feedback to Combinatorial Output | | | | 15 | | 20 | ns |
| $t_S$ | Setup Time from I/O, | D-type | 10 | | | 13 | | ns |
| | Input, or Feedback Clock | T-type | 12 | | | 15 | | ns |
| $t_H$ | Hold Time | | | 0 | | 0 | | ns |
| $t_{CO}$ | Clock to Output | | | | 10 | | 12 | ns |
| $t_{CF}$ | Clock to Feedback | | | | 6 | | 8 | ns |
| $t_{WL}$ | Clock | LOW | 6 | | | 8 | | ns |
| $t_{WH}$ | Width | HIGH | 6 | | | 8 | | ns |
| $f_{MAX}$ | External | D-type | 50 | | | 40 | | MHz |
| | Feedback $1/(t_S + t_{CO})$ | T-type | 45.5 | | | 37 | | MHz |
| | Maximum Internal $1/(t_S + t_{CF})$ | D-type | 66.6 | | | 47.6 | | MHz |
| | Frequency Feedback | T-type | 55.5 | | | 43.5 | | MHz |
| | No Feedback $1/(t_{WL} + t_{WH})$ | | 83.3 | | | 62.5 | | MHz |
| $t_{AR}$ | Asynchronous Reset to Registered Output | | | | 20 | | 25 | ns |
| $t_{AP}$ | Asynchronous Preset to Registered Output | | | | 20 | | 25 | ns |
| $t_{EA}$ | Input to Output Enable | | | | 15 | | 20 | ns |
| $t_{ER}$ | Input to Output Disable | | | | 15 | | 20 | ns |

The parameter $f_{MAX}$ is the maximum clock rate at which the device is guaranteed to operate. Because the flexibility inherent in programmable logic devices offers a choice of clocked flip-flop designs, parameter $f_{MAX}$ is specified for three types of synchronous designs.

The first type of design is a state machine with feedback signals sent off-chip. This external feedback could go back to the device input pins, or to a second device in a multi-chip state machine. The slowest path defining the period is the sum of the clock-to-output time and the input setup time for the external signals ($t_S + t_{CO}$). The reciprocal, $f_{MAX}$, is the maximum frequency with external feedback or in conjunction with an equivalent speed device. This $f_{MAX}$ is designated "$f_{MAX}$ external".

The second type of design is a single-chip state machine with internal feedback only. In this case, flip-flop inputs are defined by the device inputs and flip-flop outputs. Under these conditions, the period is limited by the internal delay from the flip-flop outputs through the internal feedback and logic to the flip-flop inputs ($t_S + t_{CF}$). This $f_{MAX}$ is designated "$f_{MAX}$ internal".

The third type of design is a simple data path application. In this case, input data is presented to the flip-flop and clocked through; no feedback is employed. Under these conditions, the period is limited by the sum of the data setup time and the data hold time ($t_S + t_H$) However, a lower limit for the period of each $f_{MAX}$ type is the minimum clock period ($t_{WH} + t_{WL}$). Usually, this minimum clock period determines the period for the third $f_{MAX}$, designated "$f_{MAX}$ no feedback".

The family of programmable logic devices 400 supports 50 MHz system clocks of the emerging high speed RISC and CISC microprocessor applications. As described above, the external $f_{MAX}$ for family 400 is 50 MHz. This 50 MHz frequency includes the clock to of up to 83 MHz.

Fundamentally, the architecture of this invention has two simple time delay parameters, i.e., array delay and switch matrix delay. The input-to-output pin-to-pin delay for a single programmable logic block 402, including switch matrix 401 and programmable array time delays is about 15 ns for the worst case (including temperature, voltage). For signals traversing through multiple programmable logic blocks externally, the delay time is simple multiples of 15 ns. For example, the time delay for a signal traversing through two programmable logic blocks via switch matrix 401 is about 30 ns, three blocks time delay is about 45 ns. Delay computations for the devices of this invention are simple, fast, predictable and are internal path independent. This is unlike some of the complex, mid-density PLDs, where the delays are slow, variable, internal path dependent, and fairly tedious to compute. The family of devices 400 maintains the inherent simplicity and fixed time predictability of traditional PAL devices—offering designers fairly simple, predictable performance, prior to implementing designs.

The high performance architecture of devices 400 supports both gate intensive and register intensive functions at high speed. For example, 16-bit address decoder, 16-bit multiplexer or 4 to 16 demultiplexers (gate intensive functions) or 16-bit loadable up-down counters and 16-bit binary synchronous counters (register intensive functions) can be implemented at a maximum frequency of 50 MHz, enabling device 400 to be operated with up to 50 MHz RISC and CISC microprocessors.

Further, programmable logic block 402 structure with a high speed switch matrix 401 supports extremely logic intensive logic functions via two levels of fixed worst case time delays of 30 ns. In a programmable logic device 400 having four programmable logic blocks 402, such as device 400B, more than 192 product term logic functions can be incorporated with 30 ns time delays.

The simple programmable architecture of this invention requires simple, easy to use software for programming the device and obviates the need for an expensive, complex software package.

User designs for device 400 are entered via a variety of design entry mechanisms, for example, Boolean equation and State machines. Signals that need to be located on critical pins can be specified by the user. A software fitting means automatically allocates the resources of programmable logic device 400 to each of the logic equations in the user design.

As a result of the advanced synthesis and optimization techniques of the fitting means, designs are configured to architecture of this invention in minutes. The fitting means has intelligence and knowledge about optimal block partitioning (fitting user logic equations in a single programmable logic block) and routing signals to appropriate blocks via the switch matrix without any manual intervention. Hence, the designers do not have to worry about any manual routing or fitting of logic.

The software generates a JEDEC file for programming device 400. Device 400 can be programmed on conventional, industry standard PAL programmers with appropriate personality and socket adapter modules. One embodiment of the fitting means is described in copending, commonly filed, and commonly assigned U.S. patent application Ser. No. 07/490,817 entitled "An Apparatus and Method for Allocation of Resources in Programmable Logic Devices" of N. Schmitz, which is incorporated herein by reference in its entirety.

All programmable logic macrocells 412 have been designed to be reset during power-up. Following the power-up, all programmable logic macrocells 412 are cleared, setting the output signals to a logical zero. This feature is especially valuable in simplifying state machine initialization.

A security cell is provided on each device to prevent unauthorized copying of the user's proprietary logic design Once programmed, the security cell disables the programming and verification modes. The only way to erase the protection cell is by charging the entire array architecture cells. This cell should preferably be programmed only after the rest of the device has been completely programmed.

Programmable logic device 400 is designed with supervoltage enabled preload circuitry that provides an easy method for testing the logic functionality.

The preload function allows any arbitrary state value to be loaded into macrocells 412. A typical functional test sequence would be to verify all possible state transitions for the device being tested. This requires the ability to set the state registers into an arbitrary "present state" and to set the device into an arbitrary "present input" value. Once this is done, the state machine is clocked into a new state, or next state which can be checked to validate the transition from the "present state". In this way, any particular state transition can be checked.

Since the preload function allows the device to go directly into any desired state, test sequences may be greatly shortened. Also, all possible values can be tested, thus greatly reducing both test time and development costs and guaranteeing proper in-system operation.

An observability mode allows the ability to observe the contents of internal state or output registers on corresponding I/O pins for testability. This observability mode is entered by applying a supervoltage to certain pins. Once this mode is entered, it suppresses the combinatorial output data from appearing on the I/O pins and allows the observation of the contents of output registers on the output pins corresponding to the programmable logic macrocells. This allows easy debugging and tracing of the buried registers.

While the present invention has been described in terms of an embodiment having programmable multiplexers with a specific number of input lines and a specific number of architectural configuration cells, these embodiments are illustrative only and not intended to limit the scope of the invention. Following the principles of this invention, one skilled in the art could implement various configurations of lines to the multiplexers and add or subtract configuration cells as previously described to achieve a flexibility not present in the prior art programmable devices.

Moreover, PLDs 400 were described in terms of synchronous applications. However, PLD 400B though a metal mask option can be configured for asynchronous applications. Specifically, in one embodiment, the connections to each product term clump that in FIG. 16 is opposite a buried logic macrocell are redistributed so that this product term clump provides product control terms to the adjacent output logic macrocell. The buried logic macrocells are not utilized in this embodiment and in fact may not be included on the silicon die.

Thus, the principles of this invention, in particular the decoupling of the various components in programmable logic block, the symmetric layout and the high speed switch matrix, may be implemented in a wide variety of programmable logic devices. Accordingly, the embodiments described above are only exemplary of the principles of the invention and are not intended to limit the invention to the specific embodiments disclosed.

We claim:

1. An integrated circuit having a plurality of pins comprising:
   a plurality of programmable logic blocks, each programmable logic block having a plurality of input lines and a plurality of output lines;
   programmable switch interconnection means, operatively coupled to each of said programmable logic blocks, for receiving signals on said pluralities of output lines from said plurality of programmable logic blocks and for providing input signals to said pluralities of input lines of said plurality of programmable logic blocks, wherein each programmable logic block includes:
   programmable array means, operatively coupled to programmable switch interconnection means, for receiving a plurality of input signals only from said plurality of programmable logic block input lines and for generating a plurality of output signals;
   a plurality of programmable logic macrocell means, each programmable logic macrocell means, operatively coupled to said programmable switch interconnection means, having at least one input line and an output line;
   logic allocator means, operatively coupled to said programmable array means and selectively operatively coupled to and decoupled from each of said plurality of programmable logic macrocell means, for steering said plurality of output signals of said programmable array means to selected input lines of said plurality of programmable logic macrocell means and for decoupling said unselected input lines of said plurality of programmable logic macrocell means from said programmable array means; and a plurality of programmable input/output (I/O) macrocell means, each I/O macrocell means, connected to one of said pins, and to the output line of one of said programmable logic macrocell means for selectively connecting and disconnecting said programmable logic macrocell means output line to said pin.

2. An integrated circuit, as in claim 1, wherein:

said programmable switch interconnection means comprises a multiplicity of multiplexing means, each of said multiplexing means having a multiplicity of input lines and an output line, and each of said multiplexing means in response to an input select signal, passing therethrough a signal on a selected input line to the output line; and means for providing an input select signal to each of the multiplicity of multiplexing means.

3. An integrated circuit as in claim 1 wherein each of said programmable logic macrocell means comprises:

programmable storage means, operatively coupled to said programmable logic macrocell means input line, having an input terminal and an output terminal;

first programmable means, operatively coupled to said programmable logic macrocell means input line and to said output terminal of said programmable storage means, and having an output line, for coupling therethrough to the output line of said first programmable means a signal driven by a signal on said input line or a signal from said programmable storage means wherein said first programmable means output line is connected to said programmable switch interconnection means; and means, operatively coupled to said programmable storage means and to said programmable logic macrocell means input line, for controlling the polarity of a logic signal;

wherein in a first mode of operation, said polarity control means generates a first output signal in response to an input signal; and in a second mode of operation, said polarity control means generates a second output signal in response to said input signal and said second output signal is the inverse of said first output signal.

4. An integrated circuit as in claim 3 said programmable I/O macrocell means further comprising:

means for selectively providing an enable signal; and means, operatively connected to the output line of the programmable logic macrocell means, to one of said pins, and to the enable signal providing means, for selectively providing said signal from said polarity control means to said pin wherein said providing means passes said signal from said polarity control means therethrough only upon receiving said enable signal.

5. An integrated circuit as in claim 1 wherein said plurality of programmable logic macrocell means comprises a first plurality of programmable output logic macrocell means and a second plurality of buried logic macrocell means.

6. An integrated circuit as in claim 5 wherein each of said programmable output logic macrocell means comprises:

programmable storage means, operatively coupled to said programmable output logic macrocell means input line, having an input terminal and an output terminal;

first programmable means, operatively coupled said programmable output logic macrocell means input line and to said output terminal of said programmable storage means, and having an output line, for coupling therethrough to the output line of said first programmable means a signal driven by a signal on said input line or a signal from said programmable storage means wherein said first programmable means output line is connected to said programmable switch interconnection means; and means, operatively coupled to said programmable storage means and to said logic macrocell input line, for controlling the polarity of a logic signal;

wherein in a first mode of operation, said polarity control means generates a first output signal in response to an input signal; and in a second mode of operation, said polarity control means generates a second output signal in response to said input signal and said second output signal is the inverse of said first output signal.

7. An integrated circuit as in claim 6 said programmable I/O macrocell means further comprising:

means for selectively providing an enable signal; and means, operatively connected to the output line of the programmable output logic macrocell means, to one of said pins and to the enable signal providing means, for selectively providing said signal from said polarity control means to said pin wherein said providing means passes said signal from said polarity control means therethrough only upon receiving said enable signal.

8. An integrated circuit as in claim 5 wherein each of said programmable buried logic macrocell means comprises:

first programmable means, operatively coupled to said programmable buried logic macrocell means input line and to one of said pins, and having an output line, for coupling therethrough to the output line of said first programmable means a signal in response to a signal on said programmable buried logic macrocell means input line or a signal from said pin;

programmable storage means, operatively coupled to said first programmable means output line, having an output line; and, second programmable means having (i) a first input terminal connected to said first programmable means output line, (ii) a second input terminal connected to said programmable storage means output line, and (iii) an output line connected to said switch matrix, said second programmable means for coupling therethrough to the output line of said second programmable means one of a signal on the output line of said first programmable means and a signal on the output line of programmable storage means wherein said second programmable means output line is said output line of said programmable buried logic macrocell.

9. An integrated circuit, as in claim 1, wherein:

said logic allocator means comprises a multiplicity of router means, each of said router means having a multiplicity of output lines and a multiplicity of input lines, said router means for coupling signals on said multiplicity of input lines therethrough to a selected output line in said multiplicity of output lines;

wherein each router input line is connected to a output line from said programmable logic array; and each router output line is connected to an input line of one of said programmable logic macrocell means.

10. An integrated circuit, as in claim 9, wherein each of said router means further comprises:

logic gate means connected to said multiplicity of router input lines and having an output line;

demultiplexing means having an input terminal connected to said output line of said logic gate means and a multiplicity of outline lines;

wherein said demultiplexing means in response to an input select signal passes therethrough a signal on said input terminal to a selected output line in said multiplicity of output lines, and said demultiplexing means multiplicity of output lines are said router means multiplicity of output lines; and means, operatively coupled to said demultiplexing means, for providing said input select signal.

11. An integrated circuit as in any one of claims 3 or 6 wherein said polarity control means further comprises:

second programmable means having (i) an input terminal connected to said first programmable means output line, (ii) a signal inverting input terminal connected to said first programmable means output line, and (iii) an output line, said second programmable means for coupling therethrough to the output line of said second programmable means one of a signal on the output line of said first programmable means and an inverse of the signal on the output line of said first programmable means wherein said second programmable means output line is said output line of said programmable output logic macrocell.

12. An integrated circuit as in any one of claims 3, 6 or 8, each macrocell means further comprising:

a multiplicity of input lines that includes said at least one input line; and logic gate means, operatively connected to said multiplicity of input lines, having an output line connected to said input terminal of said programmable storage means.

13. An integrated circuit as in any one of claim 3, 6 or 8, wherein said programmable storage means comprises a programmable storage element configurable as any one of the group consisting of a D-type flip-flop, a T-type flip-flop and a latch.

14. An integrated circuit as in any one of claims 3, 6 or 8, wherein said programmable storage means has a clock terminal.

15. An integrated circuit as in claim 14, each of said macrocell means further comprising:

programmable clock multiplexer means having a multiplicity of input terminals and an output terminal connected to said programmable storage element clock terminal, said clock multiplexer means in response to an input select signal passing therethrough a signal on a selected input terminal to said output terminal; and means, operatively coupled to said programmable clock multiplexer means, for providing said input select signal.

16. An integrated circuit as in claim 15 wherein a first terminal of said multiplicity of clock multiplexer means input terminals is connected to one of said pins; and a second terminal of said multiplicity of clock multiplexer means input terminals is connected to another one of said pins.

17. An integrated circuit as in any one of claim 4 or 7 wherein said means for selectively providing an enable signal further comprises:

means for providing an input select signal; and programmable multiplexer means, operatively connected to said input select signal means, having a multiplicity of input terminals and an output terminal, wherein said multiplexer means in response to said input select signal passes therethrough a signal on a selected input terminal to said output terminal, said signal on said output terminal being said enable signal.

18. An integrated circuit as in claim 17 wherein a first product term line from said programmable array means is connected to a first input terminal of said I/O macrocell programmable multiplexer means in a multiplicity of I/O macrocells in said plurality of I/O macrocells; and a second product term line from said programmable array means is connected to a second input terminal of said I/O macrocell programmable multiplexer in said multiplicity of I/O macrocells in said plurality of I/O macrocells.

19. An integrated circuit as in claim 1 wherein each of said programmable logic blocks is identical.

20. An integrated circuit as in claim 19 wherein said identical programmable logic blocks are arranged symmetrically around said switch matrix means.

21. An integrated circuit as in claim 1, said switch interconnection means having a fixed path independent delay time for any path between an input terminal and an output terminal of said switch interconnection means.

22. An integrated circuit as in claim 21 wherein said delay time through said switch interconnection means for connecting one of said programmable logic blocks to another of said programmable logic blocks is in the range of about 1 to 2 nanoseconds.

* * * * *